(12) United States Patent
Yang et al.

(10) Patent No.: US 12,191,425 B2
(45) Date of Patent: Jan. 7, 2025

(54) DISPLAY DEVICE AND METHOD FOR MANUFACTURING SAME

(71) Applicant: SAMSUNG DISPLAY CO., LTD., Yongin-si (KR)

(72) Inventors: Eun A Yang, Yongin-si (KR); Jin Woo Choi, Yongin-si (KR); Hyun Min Cho, Yongin-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 516 days.

(21) Appl. No.: 17/631,871

(22) PCT Filed: Jul. 2, 2020

(86) PCT No.: PCT/KR2020/008690
§ 371 (c)(1),
(2) Date: Jan. 31, 2022

(87) PCT Pub. No.: WO2021/020750
PCT Pub. Date: Feb. 4, 2021

(65) Prior Publication Data
US 2022/0285586 A1  Sep. 8, 2022

(30) Foreign Application Priority Data
Aug. 1, 2019 (KR) .................. 10-2019-0094013

(51) Int. Cl.
*H01L 33/62* (2010.01)
*H01L 25/075* (2006.01)
(Continued)

(52) U.S. Cl.
CPC ........ *H01L 33/387* (2013.01); *H01L 25/0753* (2013.01); *H01L 27/156* (2013.01);
(Continued)

(58) Field of Classification Search
CPC .......... H10K 59/00–95; H10K 77/111; H10K 2102/311; H01L 33/00–648; G09F 9/301;
(Continued)

(56) References Cited

U.S. PATENT DOCUMENTS 8,872,214 B2 10/2014 Negishi et al.
9,112,112 B2 8/2015 Do et al.
(Continued)

FOREIGN PATENT DOCUMENTS

KR 10-1244926 B1 3/2013
KR 10-1490758 B1 2/2015
(Continued)

OTHER PUBLICATIONS

International Search Report for corresponding Application No. PCT/KR2020/008690 dated Oct. 8, 2020 (3 pages) with English Translation (3 pages).
(Continued)

*Primary Examiner* — Eric A. Ward
(74) *Attorney, Agent, or Firm* — Lewis Roca Rothgerber Christie LLP

(57) ABSTRACT

A display device may include: a base layer including a plurality of islands, at least one first bridge configured to connect the islands in a first direction, and at least one second bridge configured to connect the islands in a second direction; and at least one pixel including a plurality of sub-pixels in the base layer. Each of the sub-pixels may include: a first electrode and a second electrode in one island of the islands and spaced from each other; a third electrode and a fourth electrode in one bridge of the at least one first bridge and the at least one second bridge and spaced from each other; at least one first light emitting element between
(Continued)

the first electrode and the second electrode; and at least one second light emitting element between the third electrode and the fourth electrode.

20 Claims, 44 Drawing Sheets

(51) Int. Cl.
    *H01L 27/15*     (2006.01)
    *H01L 33/00*     (2010.01)
    *H01L 33/38*     (2010.01)
    *H01L 33/50*     (2010.01)

(52) U.S. Cl.
    CPC .......... *H01L 33/005* (2013.01); *H01L 33/505* (2013.01); *H01L 33/62* (2013.01); *H01L 2933/0016* (2013.01); *H01L 2933/0066* (2013.01)

(58) Field of Classification Search
    CPC ........... G09G 3/035; G09G 2300/0426; G09G 2380/02
    See application file for complete search history.

(56) References Cited

U.S. PATENT DOCUMENTS

| | | |
|---|---|---|
| 9,773,761 B2 | 9/2017 | Do |
| 9,791,989 B2 | 10/2017 | Hong et al. |
| 10,310,560 B2 | 6/2019 | Choi et al. |
| 10,461,123 B2 | 10/2019 | Kim et al. |
| 10,461,142 B2 | 10/2019 | Hong et al. |
| 10,672,946 B2 | 6/2020 | Cho et al. |
| 10,679,566 B2 | 6/2020 | Jeon et al. |
| 10,985,332 B2 | 4/2021 | Shin et al. |
| 2005/0009303 A1 | 1/2005 | Schatz |
| 2011/0089850 A1 | 4/2011 | Shibata et al. |
| 2012/0320581 A1 | 12/2012 | Rogers et al. |
| 2016/0268352 A1* | 9/2016 | Hong ............... H10K 59/88 |
| 2016/0320878 A1* | 11/2016 | Hong ............... G06F 1/1652 |
| 2017/0040306 A1 | 2/2017 | Kim et al. |
| 2017/0301843 A1 | 10/2017 | Kim |
| 2018/0026074 A1 | 1/2018 | Lee et al. |
| 2018/0052493 A1 | 2/2018 | Hong et al. |
| 2018/0061743 A1 | 3/2018 | Hsu et al. |
| 2018/0174523 A1* | 6/2018 | Jeon ............... H10K 59/131 |
| 2019/0013275 A1 | 1/2019 | Sunshine et al. |
| 2020/0161276 A1* | 5/2020 | Kim ............... H10K 59/131 |
| 2021/0408197 A1* | 12/2021 | Zhu ............... H01L 25/0655 |

FOREIGN PATENT DOCUMENTS

| | | |
|---|---|---|
| KR | 10-2016-0130062 A | 11/2016 |
| KR | 10-2017-0088013 A | 8/2017 |
| KR | 10-2017-0141305 A | 12/2017 |
| KR | 10-1810050 B1 | 12/2017 |
| KR | 10-2018-0007376 A | 1/2018 |
| KR | 10-2018-0008185 A | 1/2018 |
| KR | 10-2018-0045968 A | 5/2018 |
| KR | 10-2018-0071465 A | 6/2018 |
| KR | 10-2018-0072022 A | 6/2018 |
| KR | 10-2018-0072909 A | 7/2018 |
| WO | WO 2011/112931 A1 | 9/2011 |

OTHER PUBLICATIONS

Written Opinion of the International Searching Authority for corresponding Application No. PCT/KR2020/008690 dated Oct. 8, 2020 (4 pages) with English Translation (2 pages).
Korean Notice of Allowance dated Apr. 30, 2024 regarding Korean Patent Application No. 10-2019-0094013 corresponding to U.S. Appl. No. 17/631,871 (6 pages).

\* cited by examiner

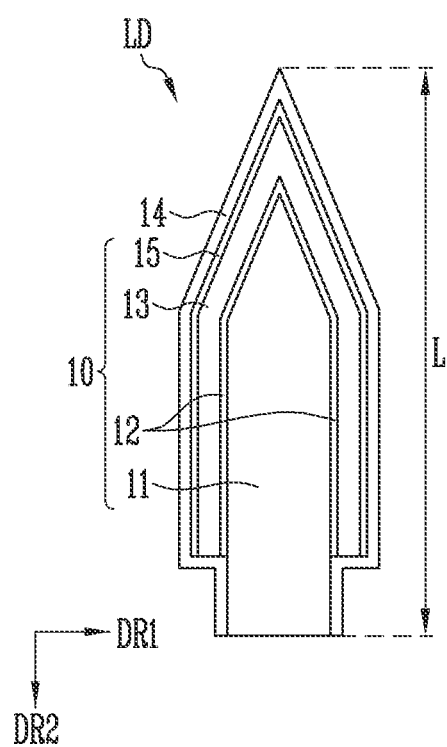

DISPLAY DEVICE AND METHOD FOR MANUFACTURING SAME

CROSS-REFERENCE TO RELATED APPLICATIONS

This application is a U.S. National Phase Patent Application of International Patent Application Number PCT/KR2020/008690, filed on Jul. 2, 2020, which claims priority to Korean Patent Application Number 10-2019-0094013, filed on Aug. 1, 2019, the entire contents of all of which are incorporated by reference herein.

BACKGROUND

1. Field

Various embodiments of the present disclosure relate to a display device and a method of fabricating the display device.

2. Description of Related Art

With an increase in interest in an information display and an increase in demand to use portable information media, demand for display devices is markedly increased, and commercialization thereof is in progress.

SUMMARY

Various embodiments of the present disclosure are directed to a display device having enhanced light output efficiency, and a method of fabricating the display device.

A display device in accordance with one or more embodiments of the present disclosure may include: a base layer including a plurality of islands, at least one first bridge configured to connect the islands in a first direction, and at least one second bridge configured to connect the islands in a second direction; and at least one pixel including a plurality of sub-pixels in the base layer.

In one or more embodiments of the present disclosure, each of the sub-pixels may include: a first electrode and a second electrode in one island of the islands and spaced from each other; a third electrode and a fourth electrode in one bridge of the at least one first bridge and the at least one second bridge and spaced apart from each other; at least one first light emitting element between the first electrode and the second electrode; and at least one second light emitting element between the third electrode and the fourth electrode.

In one or more embodiments of the present disclosure, the one island includes a first emission area configured to emit light, and the one bridge includes at least one second emission area configured to emit the light.

In one or more embodiments of the present disclosure, the first electrode may be integrally and electrically connected with the third electrode, and the second electrode may be integrally and electrically connected with the fourth electrode.

In one or more embodiments of the present disclosure, a remaining bridge of the at least one first bridge and the at least one second bridge may include a non-emission area provided not to emit the light.

In one or more embodiments of the present disclosure, each of the sub-pixels may further include: a first bank in the one island and located under each of the first and second electrodes; a first contact electrode configured to electrically connect the first electrode with any one end of opposite ends of the first light emitting element; and a second contact electrode configured to electrically connect the second electrode with a remaining end of the opposite ends of the first light emitting element.

In one or more embodiments of the present disclosure, each of the sub-pixels may further include: a second bank in the one bridge and located under each of the third and fourth electrodes; a third contact electrode configured to electrically connect the third electrode with any one end of opposite ends of the second light emitting element; and a fourth contact electrode configured to electrically connect the fourth electrode with a remaining end of the opposite ends of the second light emitting element.

In one or more embodiments of the present disclosure, the first bank and the second bank may be integrally connected. The first contact electrode and the third contact electrode may be integrally and electrically connected with each other. The second contact electrode and the fourth contact electrode may be integrally and electrically connected with each other.

In one or more embodiments of the present disclosure, each of the sub-pixels further may include: at least one first sub-electrode in the one island between the first electrode and the second electrode; and at least one second sub-electrode in the one bridge between the third electrode and the fourth electrode. The first sub-electrode and the second sub-electrode may be integrally and electrically connected with each other.

In one or more embodiments of the present disclosure, the one island may have a rectangular shape enclosed by first to fourth sides. The at least one first bridge may include a 1-1-th sub-bridge extending from the first side of the one island in the first direction, and a 1-2-th sub-bridge extending from the third side of the one island in the first direction. The at least one second bridge may include a 2-1-th sub-bridge extending from the second side of the one island in the second direction, and a 2-2-th sub-bridge extending from the fourth side of the one island in the second direction.

In one or more embodiments of the present disclosure, the pixel may include: a first sub-pixel in a first row and a first column of a sub-pixel matrix of a pixel and configured to emit a first color of light; a second sub-pixel in the first row and a second column of the sub-pixel matrix of the pixel and configured to emit a second color of light; a third sub-pixel a second row and the first column of the sub-pixel matrix of the pixel and configured to emit the second color of light; and a fourth sub-pixel in the second row and the second column of the sub-pixel matrix of the pixel and configured to emit a third color of light.

In one or more embodiments of the present disclosure, each of the first to fourth sub-pixels may include the one island, the 1-1-th and 1-2-th sub-bridges, and the 2-1-th and 2-2-th sub-bridges.

In one or more embodiments of the present disclosure, the first and second sub-pixels may be mirror-symmetrical with respect to a virtual line extending in the second direction. The 1-1-th sub-bridge of the first sub-pixel and the 1-1-th sub-bridge of the second sub-pixel may be integrally provided.

In one or more embodiments of the present disclosure, the third and fourth sub-pixels may be mirror-symmetrical with respect to the virtual line. The 1-1-th sub-bridge of the third sub-pixel and the 1-1-th sub-bridge of the fourth sub-pixel may be integrally connected.

In one or more embodiment of the present disclosure, the third electrode in the 1-1-th sub-bridge of the first sub-pixel and the third electrode in the 1-1-th sub-bridge of the second sub-pixel may be spaced from each other in a plan view. The third electrode in the 1-1-th sub-bridge of the third sub-pixel and the third electrode in the 1-1-th sub-bridge of the fourth sub-pixel may be spaced from each other in a plan view.

In one or more embodiments of the present disclosure, the first and second light emitting elements of each of the first to fourth sub-pixels may emit an identical color of light.

In one or more embodiment of the present disclosure, the display device may further include: a substrate opposing the base layer, the first to fourth sub-pixels areas being located on the base layer; a first color conversion pattern on the substrate to correspond to the first sub-pixel, and configured to convert the first color of light to red light; a second color conversion pattern on the substrate to correspond to each of the second and the third sub-pixels, and configured to convert the second color of light to green light; and a third color conversion pattern on the substrate to correspond to the fourth sub-pixel, and configured to convert the third color of light to blue light.

In one or more embodiments of the present disclosure, the first and the second light emitting elements of each of the first to fourth sub-pixels may emit different colors of light.

In one or more embodiments of the present disclosure, the first and second light emitting elements of the first sub-pixel may emit red light. The first and second light emitting elements of the second and third sub-pixels may emit green light. The first and second light emitting elements of the fourth sub-pixel may emit blue light.

In one or more embodiments of the present disclosure, the base layer may be a flexible substrate including polyimide.

A method of fabricating a display device in accordance with one or more embodiments of the present disclosure may include: providing a base layer including a plurality of islands, at least one first bridge configured to connect the islands in a first direction, and at least one second bridge configured to connect the islands in a second direction; forming, in each of the islands, first and second electrodes spaced from each other, and forming, in each of the first and second bridges, third and fourth electrodes spaced from each other; aligning at least one first light emitting element between the first and second electrodes, and aligning at least one second light emitting element between the third and fourth electrodes; forming an insulating layer on an upper surface of each of the first and second light emitting elements; and forming first and second contact electrodes on the base layer including the insulating layer.

In one or more embodiments of the present disclosure, the first electrode and the third electrode may be integrally and electrically connected with each other, and the second electrode and the fourth electrode may be integrally and electrically connected with each other.

Various embodiments of the present disclosure may provide a display device and a method of fabricating the display device, in which light emitting elements may be disposed in a bridge so that an emission area may be further increased, whereby light output efficiency can be enhanced.

The effects, aspects, and features of embodiments of the present disclosure are not limited by the foregoing, and other various effects, aspects, and features of embodiments are anticipated herein.

BRIEF DESCRIPTION OF THE DRAWINGS

FIG. 6B is a sectional view illustrating the light emitting element of FIG. 6A.

DETAILED DESCRIPTION

Figure 1:
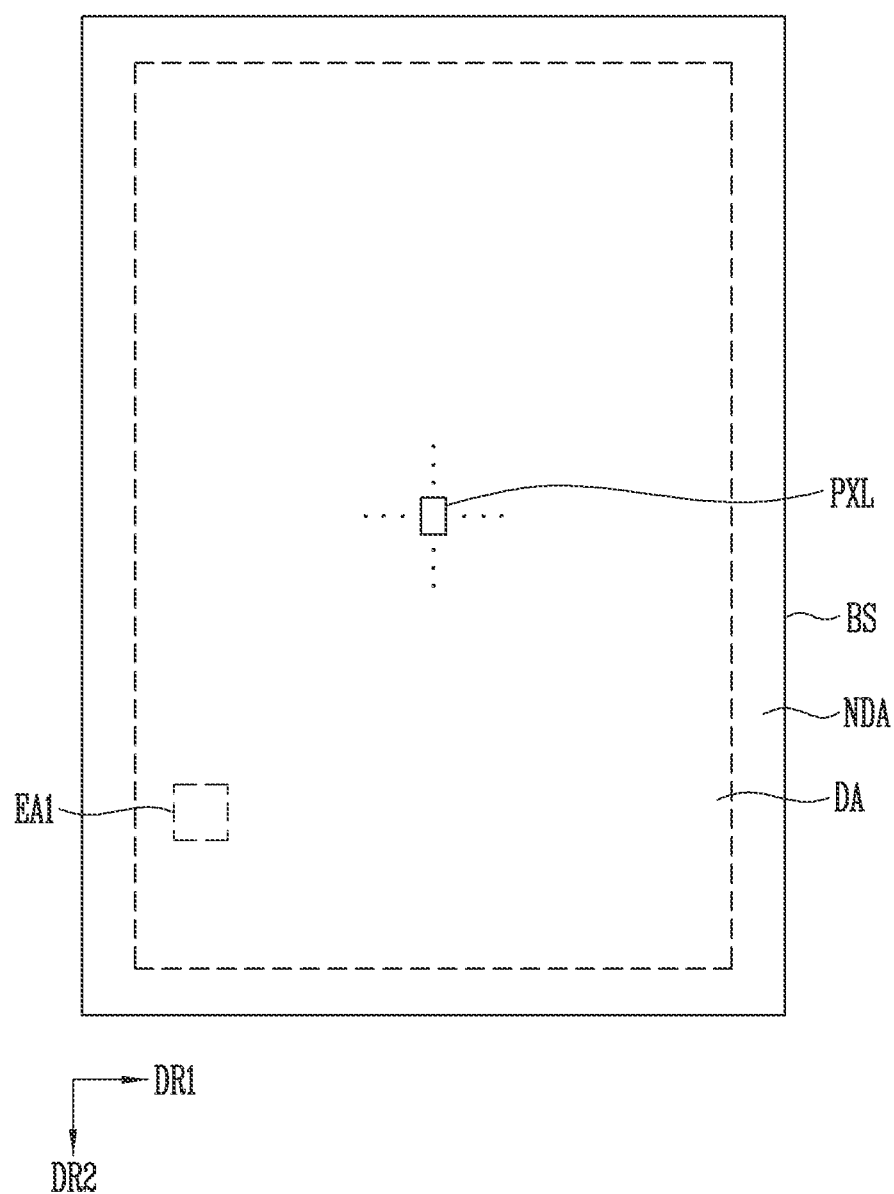
FIG. 1 is a plan view schematically illustrating a display device in accordance with one or more embodiments of the present disclosure.

As the present disclosure allows for various changes and numerous embodiments, particular embodiments will be illustrated in the drawings and described in detail in the written description. However, this is not intended to limit the present disclosure to particular modes of practice, and it is to be appreciated that all changes, equivalents, and substitutes that do not depart from the technical scope of the present disclosure are encompassed in the present disclosure.

Throughout the present disclosure, like reference numerals refer to like parts throughout the various figures and embodiments of the present disclosure. The sizes of elements in the accompanying drawings may be exaggerated for clarity of illustration. It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element. In the present disclosure, the singular forms are intended to include the plural forms as well, unless the context clearly indicates otherwise.

It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof. Furthermore, in case that a first part such as a layer, a film, a region, or a plate is disposed on a second part, the first part may be not only directly on the second part but a third part may intervene between them. In addition, in case that it is expressed that a first part such as a layer, a film, a region, or a plate is formed on a second part, the surface of the second part on which the first part is formed is not limited to an upper surface of the second part but may include other surfaces such as a side surface or a lower surface of the second part. To the contrary, in case that a first part such as a layer, a film, a region, or a plate is under a second part, the first part may be not only directly under the second part but a third part may intervene between them.

One or more embodiments and corresponding details of the present disclosure are described with reference to the accompanying drawings in order to describe the present disclosure in detail so that those having ordinary knowledge in the technical field to which the present disclosure pertains can easily practice the present disclosure. Furthermore, a singular form may include a plural form as long as it is not specifically mentioned in a sentence.

FIG. 1 is a plan view schematically illustrating a display device in accordance with one or more embodiments of the present disclosure.

Referring to FIG. 1, the display device in accordance with one or more embodiments of the present disclosure may include a base layer BS, a plurality of pixels PXL provided in the base layer BS, a driver provided in the base layer BS and configured to drive the pixels PXL, and a line component configured to connect the pixels PXL with the driver.

The base layer BS may include a display area DA and a non-display area NDA.

In one or more embodiments, the display area DA may be disposed in a central area of the display device, and the non-display area NDA may be disposed in a perimeter area of the display device in such a way as to enclose the display area DA. For example, the non-display area NDA may be around an edge or periphery of the display area. The locations of the display area DA and the non-display area NDA are not limited thereto, and the locations thereof may be changed.

The display area DA may be an area in which the pixels PXL for displaying an image are provided. The non-display area NDA may be an area in which the driver for driving the pixels PXL and some of the line component for coupling the pixels PXL to the driver are provided.

The display area DA may have various shapes. For example, the display area DA may be provided in various forms such as a closed polygon including sides formed of linear lines, a circle, an ellipse or the like including a side formed of a curved line, and a semicircle, a semi-ellipse or the like including sides formed of a linear line and a curved line.

The non-display area NDA may be provided in at least one side of the display area DA. In one or more embodiments of the present disclosure, the non-display area NDA may enclose the perimeter of the display area DA.

The base layer BS may include transparent insulating material to allow light transmission.

The base layer BS may include a flexible substrate. Here, the flexible substrate may be either a film substrate or a plastic substrate which includes polymer organic material. For example, the flexible substrate may include at least one of the following: polystyrene, polyvinyl alcohol, polymethyl methacrylate, polyethersulfone, polyacrylate, polyethermide, polyethylene naphthalate, polyethylene terephthalate, polyphenylene sulfide, polyarylate, polyimide, polycarbonate, triacetate cellulose, and cellulose acetate propionate. In one or more embodiments of the present disclosure, the base layer BS may include polyimide having excellent flexibility.

One area of the base layer BS may be provided as the display area DA in that the pixels PXL are disposed, and the other area thereof may be provided as the non-display area NDA. For example, the base layer BS may include the display area DA including pixel areas in which the respective pixels PXL are formed, and the non-display area NDA disposed around the display area DA.

The pixels PXL may be disposed in the display area DA on the base layer BS. Each of the pixels PXL may include a plurality of sub-pixels. For example, each pixel PXL may include at least three or more sub-pixels. The sub-pixels may emit different colors of light. In one or more embodiments, some sub-pixels may emit the same color of light. However, the colors, the types and/or the number of sub-pixels forming each pixel PXL are not particularly limited. For example, the color of light which is emitted from each sub-pixel may be changed in various ways. In one or more embodiments of the present disclosure, the pixels PXL may be arranged in the display area DA in a stripe or a PENTILE® arrangement structure, but the present disclosure is not limited thereto. This PENTILE® arrangement structure may be referred to as an RGBG matrix structure (e.g., a PENTILE® matrix structure or an RGBG structure (e.g., a PENTILE® structure). PENTILE® is a registered trademark of Samsung Display Co., Ltd., Republic of Korea.

Each sub-pixel may include a light emitting element configured to emit white light and/or color light, and a pixel circuit configured to drive the light emitting element. The pixel circuit may include at least one or more transistors connected to the light emitting element. Each sub-pixel may emit light having any one color among red, green, and blue, and the present disclosure is not limited thereto. For example, each sub-pixel may emit light having any one color among cyan, magenta, yellow, and white.

The driver may provide a signal to each pixel PXL through the line component and thus control the operation of the pixel PXL. For the sake of explanation, in FIG. 1, the line component is omitted.

The driver may include a scan driver configured to provide scan signals to the pixels PXL through scan lines, an emission driver configured to provide emission control signals to the pixels PXL through emission control lines, a data driver configured to provide data signals to the pixels PXL through data lines, and a timing controller. The timing controller may control the scan driver, the emission driver, and the data driver.

Each pixel PXL may include at least one light source which is driven by a suitable control signal (e.g., set or predetermined control signal, such as, a scan signal and a data signal) and/or a power supply (e.g., a predetermined power supply, such as, a first driving power supply and a second driving power supply). A light emitting element, e.g., a light emitting diode, which includes an inorganic crystal structure, e.g., a nitride-based semiconductor, and has a subminiature size, e.g., ranging from the nanometer scale to the micrometer scale, may be used as the light source. The above-mentioned light emitting element will be described below with reference to FIGS. 3A to 6B.

The above-mentioned display device may embody a stretchable display device including a plurality of stretching units. Hereinafter, the plurality of stretching units will be described with reference to FIGS. 2A and 2B.

Figure 2A:
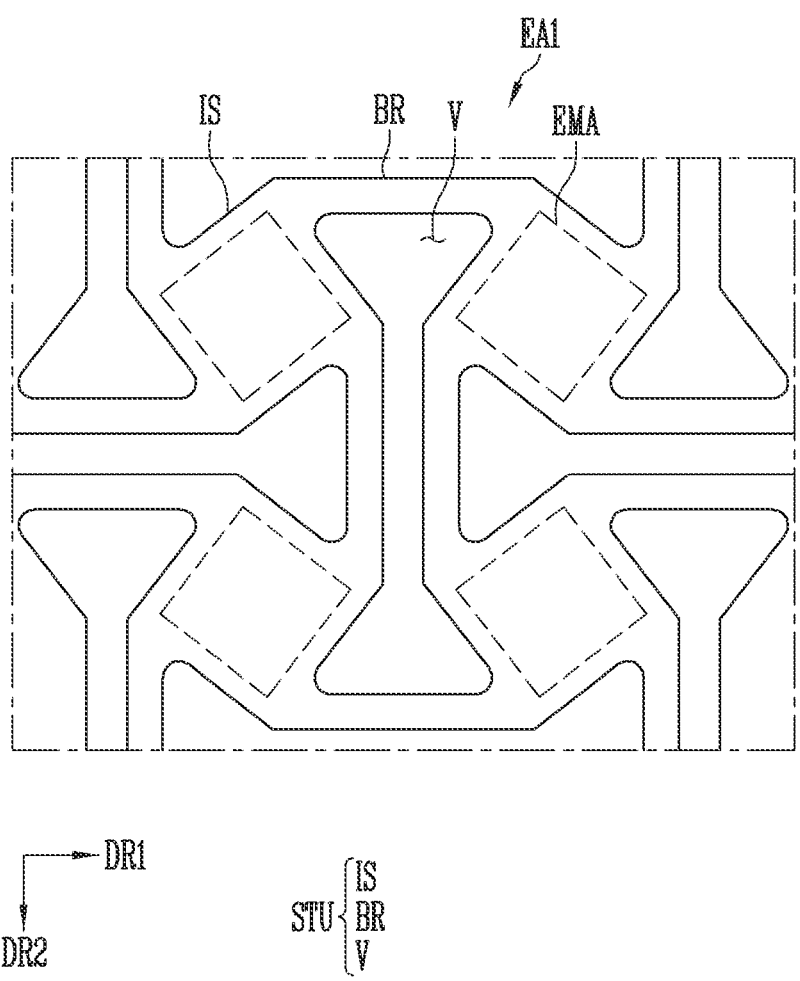
FIGS. 2A and 2B are enlarged plan views of portion EA1 of FIG. 1.
Figure 2B:
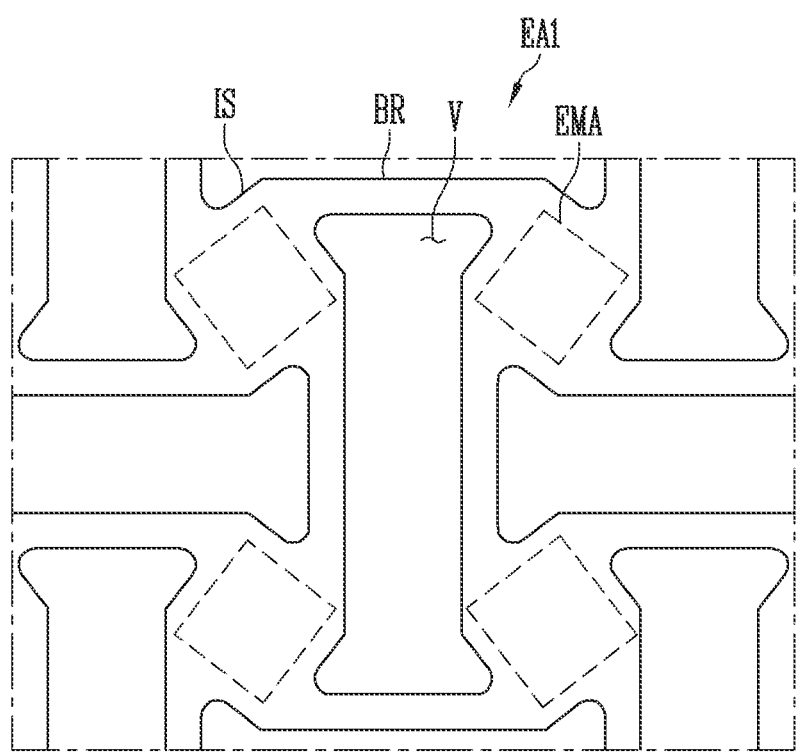

FIGS. 2A and 2B are enlarged plan views of portion EA1 of FIG. 1.

Referring to FIGS. 1, 2A, and 2B, the display device may include the base layer BS on which the pixels PXL are provided.

In one or more embodiments of the present disclosure, the base layer BS may include a plurality of islands IS, and bridges BR configured to connect the islands IS disposed adjacent to each other along first and second directions DR1 and DR2. Furthermore, the base layer BS may include a slit V formed by removing an area of the base layer BS. In one or more embodiments of the present disclosure, the islands IS, the bridges BR, and the slit V may form a plurality of stretching units STU of the display device. Each stretching unit STU may be a base unit of stretching the stretchable display device.

Each island IS may be a base layer BS having an island shape, and be spaced apart from an island IS that is adjacent (or next) thereto in the first direction DR1, with the slit V interposed therebetween. Furthermore, each island IS may be spaced apart from an island IS that is adjacent (or next) thereto in the second direction DR2, with the slit V interposed therebetween. At least one sub-pixel (or pixel PXL) including an emission area EMA from which red, blue, green, or white light is emitted may be disposed (or provided) in each island IS.

The bridges BR may be respectively provided between two islands IS spaced apart from each other in the first direction DR1 and between two islands IS spaced apart from each other in the second direction DR2. Each bridge BR may be one area of the base layer BS that connects two islands IS adjacent to each other. Lines for transmitting power and/or signals to the sub-pixel (or the pixels PXL) provided in each island IS may be provided in the bridge BR. The sub-pixel (or the pixel PXL) disposed in each island IS may be supplied with power and/or signals by the lines provided in the bridge BR and may be driven by the power and/or the signals.

The slit V may be changed in shape and surface area (or size) to allow the display device to stretch. The slit V may be located between two islands adjacent to each other in the first and second directions DR1 and DR2, between one island IS and the bridge BR, and between two bridges BR adjacent to each other in the first and second directions DR1 and DR2. The slit V may be formed to pass through the base layer BS. The slit V may provide a spacing area between the islands IS, and reduce the weight of the base layer BS, and improve the flexibility of the base layer BS. As the slit V changes in shape when the base layer BS is bent, curved, rolled, or stretched, stress generated when the base layer BS is deformed may be effectively reduced so that the base layer BS can be prevented from being abnormally deformed, and the durability thereof can be enhanced.

Although the slit V may be formed by removing one area of the base layer BS by a method such as etching, the present disclosure is not limited thereto. In one or more embodiments, when the base layer BS is fabricated, the base layer BS may be formed to include the slit V. In one or more embodiments, the slit V may be formed by patterning the base layer BS after the islands IS and the bridge BR are formed. The method of forming the slit V in the base layer BS is not limited to the above-mentioned embodiment, and the slit V may be formed by various methods.

As the slit V included in the base layer BS is changed in shape and surface area (or size), the display device may be stretched. In a plan view, the display device may be stretched in various directions, e.g., in the first direction DR1, in the second direction DR2, in a direction (e.g., to the left direction) opposite to the first direction DR1, and a direction (e.g., to the upward direction) opposite to the second direction DR2. When the display device is stretched, the shape and/or the surface area (or the size) of each island IS may seldom change, and only the position thereof may change. Therefore, when the display device is stretched, the sub-pixel (or the pixel PXL) disposed in each of the islands IS may be maintained without being damaged. However, when the display device is stretched, the bridges BR each of which connects two islands IS may change in shape and/or surface area (or size).

Although FIGS. 2A and 2B illustrate that each island IS has a shape similar to a rectangular shape, the present disclosure is not limited thereto, and the shape of the island IS may be changed in various ways. The shape of the bridge BR for connecting two islands IS may also be changed in various ways without being limited to that shown in FIGS. 2A and 2B.

Figure 3A:
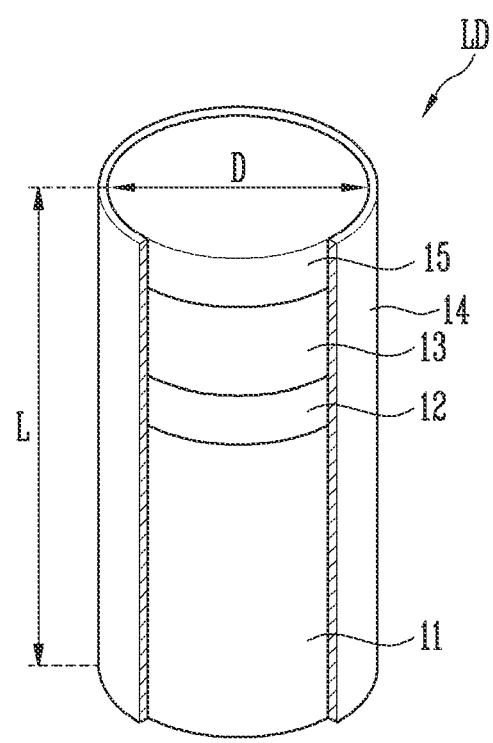
FIG. 3A is a perspective cutaway view schematically illustrating a light emitting element which is used as a light source of the display device of FIG. 1.
Figure 3B:
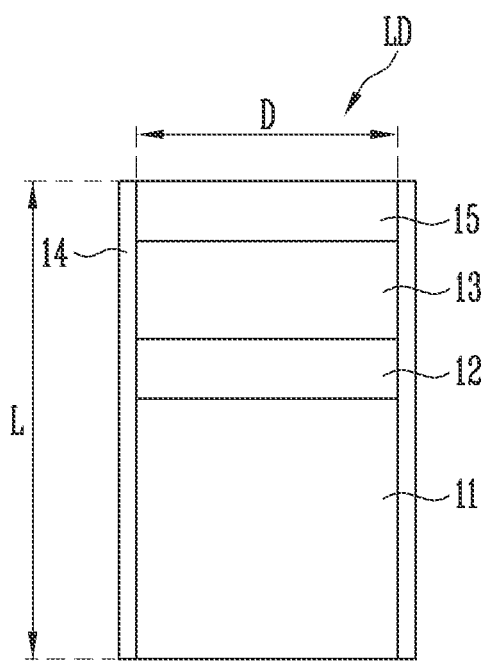
FIG. 3B is a sectional view illustrating the light emitting element of FIG. 3A.
Figure 4A:
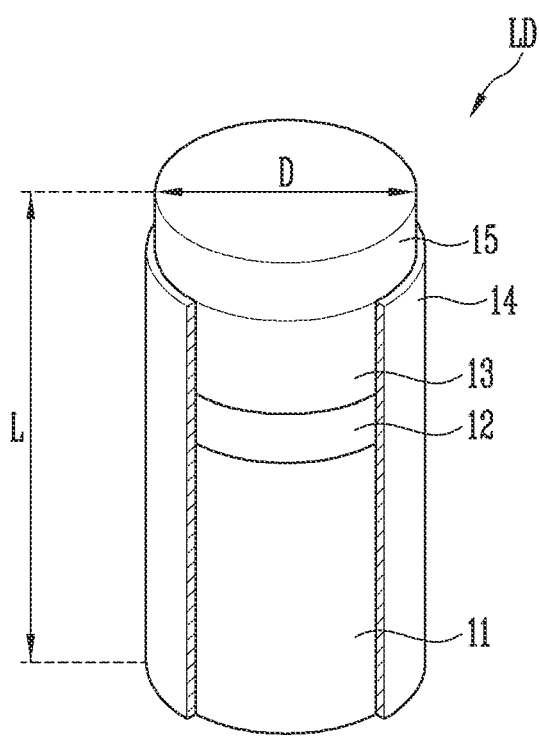
FIG. 4A is a perspective cutaway view schematically illustrating another light emitting element that is used as a light source of the display device of FIG. 1.
Figure 4B:
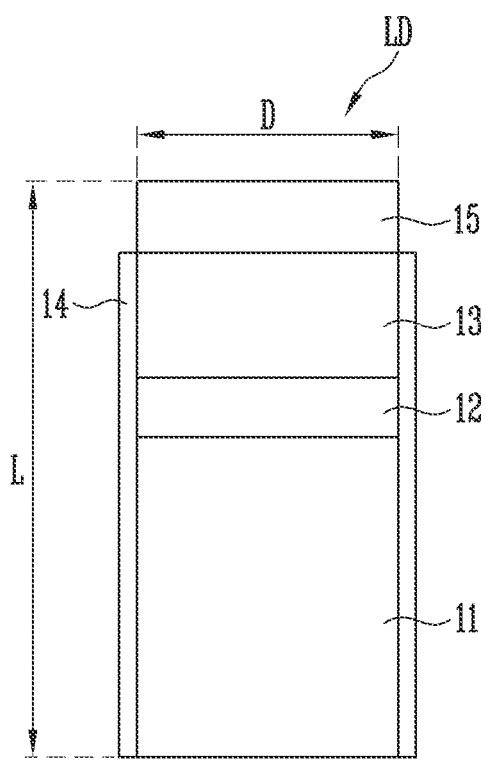
FIG. 4B is a sectional view illustrating the light emitting element of FIG. 4A.
Figure 5A:
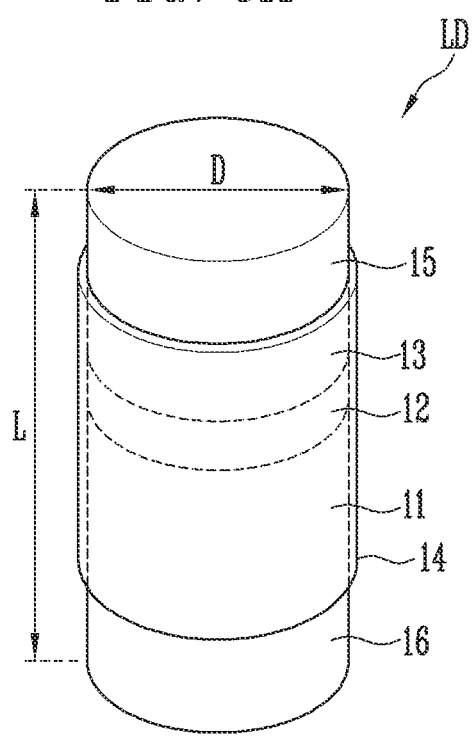
FIG. 5A is a perspective view schematically illustrating a light emitting element that is used as a light source of the display device of FIG. 1.
Figure 5B:
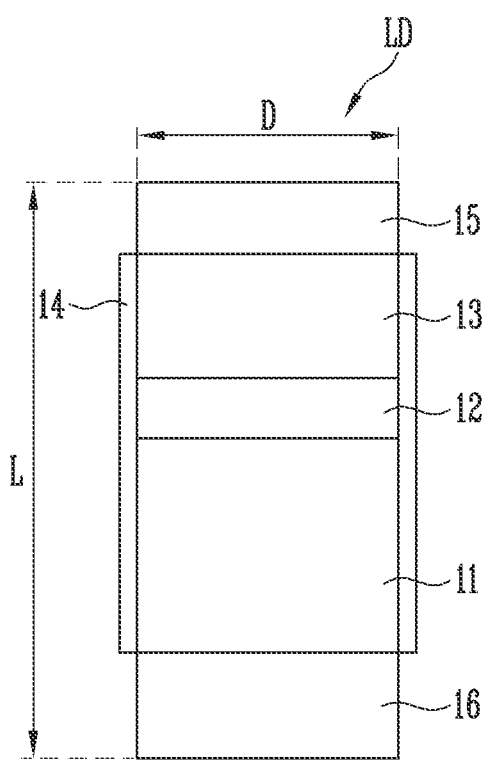
FIG. 5B is a sectional view illustrating the light emitting element of FIG. 5A.
Figure 6A:
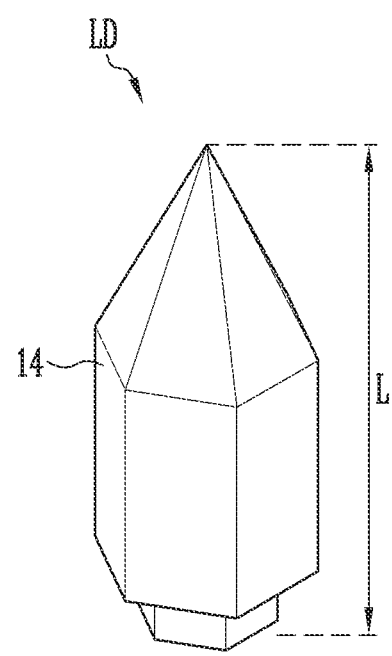
FIG. 6A is a perspective view schematically illustrating a light emitting element that is used as a light source of the display device of FIG. 1.

FIG. 3A is a perspective cutaway view schematically illustrating a light emitting element that is used as a light source of the display device of FIG. 1. FIG. 3B is a sectional view illustrating the light emitting element of FIG. 3A. FIG. 4A is a perspective cutaway view schematically illustrating another light emitting element that is used as a light source of the display device of FIG. 1. FIG. 4B is a sectional view illustrating the light emitting element of FIG. 4A. FIG. 5A is a perspective view schematically illustrating a light emitting element that is used as a light source of the display device of FIG. 1. FIG. 5B is a sectional view illustrating the light emitting element of FIG. 5A. FIG. 6A is a perspective view schematically illustrating a light emitting element which is used as a light source of the display device of FIG. 1. FIG. 6B is a sectional view illustrating the light emitting element of FIG. 6A.

For the sake of explanation, a light emitting element fabricated by an etching method will be described with reference to FIGS. 3A, 3B, 4A, 4B, 5A, and 5B, and then a light emitting element that has a core-shell structure and is fabricated by a growth method will be described with reference to FIGS. 6A and 6B. In one or more embodiments of the present disclosure, the type and/or shape of the light emitting element LD is not limited to the embodiments illustrated in FIGS. 3A, 3B, 4A, 4B, 5A, 5B, 6A, and 6B.

Referring to FIGS. 3A, 3B, 4A, 4B, 5A, 5B, 6A, and 6B, the light emitting element LD may include a first semiconductor layer 11, a second semiconductor layer 13, and an active layer 12 interposed between the first and second semiconductor layers 11 and 13. For example, the light emitting element LD may be implemented as an emission stack formed by successively stacking the first semiconductor layer 11, the active layer 12, and the second semiconductor layer 13.

In one or more embodiments of the present disclosure, the light emitting element LD may be formed in a shape extending in one direction. If the direction in which the light emitting element LD extends is defined as a longitudinal direction, the light emitting element LD may have one end and the other end in the extension direction. Any one of the first and second semiconductor layers 11 and 13 may be disposed on one end of the light emitting element LD, and the other one of the first and second semiconductor layers 11 and 13 may be disposed on the other end of the light emitting element LD.

The light emitting element LD may have various shapes. For example, the light emitting element LD may have a rod-like shape or a bar-like shape extending in the longitudinal direction (i.e., to have an aspect ratio greater than 1). In one or more embodiments of the present disclosure, the length L of the light emitting element LD with respect to the longitudinal direction may be greater than the diameter D (or a width of a cross-section) thereof. The light emitting element LD may include a light emitting diode fabricated to have a subminiature size, e.g., with a diameter D and/or a length L corresponding to the micrometer scale or the nanometer scale. In one or more embodiments of the present disclosure, the shape of the light emitting element LD may be changed so as to meet requirements (or design conditions) of a lighting device or a self-emissive display device.

The first semiconductor layer 11 may include, for example, at least one n-type semiconductor layer. For instance, the first semiconductor layer 11 may include an n-type semiconductor layer that includes any one semiconductor material of InAlGaN, GaN, AlGaN, InGaN, AlN, and InN and is doped with a first conductive dopant such as Si, Ge, or Sn. However, the constituent material of the first semiconductor layer 11 is not limited thereto, and the first semiconductor layer 11 may be formed of various other materials.

The active layer 12 may be disposed on the first semiconductor layer 11 and have a single or multiple quantum well structure. The location of the active layer 12 may be changed in various ways depending on the type of the light emitting element LD. The active layer 12 may emit light having a wavelength ranging from 400 nm to 900 nm, and use a double heterostructure. In one or more embodiments of the present disclosure, a cladding layer doped with a conductive dopant may be formed on and/or under the active layer 12. For example, the cladding layer may be formed of an AlGaN layer or an InAlGaN layer. In one or more embodiments, a material such as AlGaN or AlInGaN may be used to form the active layer 12, and various other materials may be used to form the active layer 12.

If an electric field of a suitable voltage (e.g., a set or predetermined voltage) or more is applied between the opposite ends of the light emitting element LD, the light emitting element LD emits light by coupling of electron-hole pairs in the active layer 12. Because light emission of the light emitting element LD can be controlled based on the foregoing principle, the light emitting element LD may be used as a light source of various light emitting devices as well as a pixel of the display device.

The second semiconductor layer 13 may be disposed on the active layer 12 and include a semiconductor layer having a type different from that of the first semiconductor layer 11. For example, the second semiconductor layer 13 may include at least one p-type semiconductor layer. For instance, the second semiconductor layer 13 may include a p-type semiconductor layer that includes any one semiconductor material of InAlGaN, GaN, AlGaN, InGaN, AlN, and InN, and is doped with a second conductive dopant such as Mg. However, the material for forming the second semiconductor layer 13 is not limited thereto, and the second semiconductor layer 13 may be formed of various other materials.

In one or more embodiments of the present disclosure, the first semiconductor layer 11 and the second semiconductor layer 13 may have different widths (or thicknesses) with respect to the longitudinal direction (L) of the light emitting element LD. For example, the first semiconductor layer 11 may have a width (or a thickness) greater than that of the second semiconductor layer 13 with respect to the longitudinal direction (L) of the light emitting element LD. Hence, as illustrated in FIGS. 3A to 5B, the active layer 12 of the light emitting element LD may be disposed at a position closer to an upper surface of the second semiconductor layer 13 than to a lower surface of the first semiconductor layer 11. In this case, the active layer 12 may be disposed adjacent to an upper end in the light emitting element LD that has a cylindrical shape and is fabricated by an etching method.

In one or more embodiments of the present disclosure, the light emitting element LD may further include one electrode layer 15 disposed on the second semiconductor layer 13, as well as including the first semiconductor layer 11, the active layer 12, and the second semiconductor layer 13. In one or more embodiments, as shown in FIGS. 5A and 5B, the light emitting element LD may further include another electrode layer 16 disposed on one end of the first semiconductor layer 11.

Although each of the electrode layers 15 and 16 may be formed of an ohmic contact electrode, the present disclosure is not limited thereto. The electrode layers 15 and 16 may include metal or a metal oxide. For example, chrome (Cr), titanium (Ti), aluminum (Al), gold (Au), nickel (Ni), ITO, and an oxide or alloy thereof may be used alone or in combination with each other. However, the present disclosure is not limited thereto.

Materials included in the respective electrode layers 15 and 16 may be equal to or different from each other. The electrode layers 15 and 16 may be substantially transparent or semitransparent. Therefore, light generated from the light emitting element LD may pass through the electrode layers 15 and 16 and then be emitted outside the light emitting element LD.

In one or more embodiments of the present disclosure, the light emitting element LD may further include an insulating film 14 around an outer surface (e.g., an outer peripheral or circumferential surface) of the light emitting element LD. However, in some embodiments, the insulating film 14 may be omitted, or may be provided to cover only some of the first semiconductor layer 11, the active layer 12, and the second semiconductor layer 13.

The insulating film 14 may prevent the active layer 12 from short-circuiting due to making contact with a conductive material except the first semiconductor layer 11 and the second semiconductor layer 13. Because of the insulating film 14, occurrence of a defect on the surface of the light emitting element LD may be reduced or minimized, whereby the lifetime and efficiency of the light emitting element LD may be improved. In the case where a plurality of light emitting elements LD are disposed in close contact with each other, the insulating film 14 may prevent an undesired short-circuit from occurring between the light emitting elements LD. It is not limited whether the insulating film 14 is provided, so long as the active layer 12 can be prevented from short-circuiting with external conductive material.

As illustrated in FIGS. 3A and 3B, the insulating film 14 may be provided in a shape enclosing the entirety of an outer surface (e.g., an outer peripheral or circumferential surface) of the emission stack including the first semiconductor layer 11, the active layer 12, the second semiconductor layer 13, and the electrode layer 15. For the sake of explanation, FIG. 3A illustrates the insulating film 14 a portion of which has been removed. The first semiconductor layer 11, the active layer 12, the second semiconductor layer 13, and the electrode layer 15 that are included in the actual light emitting element LD may be enclosed by the insulating film 14.

Although in the above-mentioned embodiment the insulating film 14 has been described as enclosing the entirety of the respective outer surfaces (e.g., outer peripheral or circumferential surfaces) of the first semiconductor layer 11, the active layer 12, the second semiconductor layer 13, and the electrode layer 15, the present disclosure is not limited thereto.

In one or more embodiments, as illustrated in FIGS. 4A and 4B, the insulating film 14 may enclose the respective outer surfaces (e.g., outer peripheral or circumferential surfaces) of the first semiconductor layer 11, the active layer 12, and the second semiconductor layer 13, and may not enclose the entirety of the outer surface (e.g., the outer peripheral or circumferential surface) of the electrode layer 15 disposed on the second semiconductor layer 13 or may enclose only a portion of the outer surface (e.g., the outer peripheral or circumferential surface) of the electrode layer 15 without enclosing the other portion. Here, the insulating film 14 may allow at least the opposite ends of the light emitting element LD to be exposed to the outside, e.g., allow not only the electrode layer 15 disposed on one end of the second semiconductor layer 13 but also one end of the first semiconductor layer 11 to be exposed to the outside. In one or more embodiments, as illustrated in FIGS. 5A and 5B, in case that the electrode layers 15 and 16 are disposed on the respective opposite ends of the light emitting element LD, the insulating film 14 may allow at least one area of each of the electrode layers 15 and 16 to be exposed to the outside. Alternatively, in one or more embodiments, the insulating film 14 may not be provided.

In one or more embodiments of the present disclosure, the insulating film 14 may include transparent insulating material. For example, the insulating film 14 may include at least one insulating material selected from the group consisting of $SiO_2$, $Si_3N_4$, $Al_2O_3$, and $TiO_2$, but the present disclosure is not limited thereto. In other words, various materials having insulating properties may be employed.

If the insulating film 14 is provided on the light emitting element LD, the active layer 12 may be prevented from short-circuiting with a first electrode and/or a second electrode (of an adjacent light emitting element LD), which are not illustrated. Because of the insulating film 14, occurrence of a defect on the surface of the light emitting element LD may be reduced or minimized, whereby the lifetime and efficiency of the light emitting element LD may be improved. In the case where a plurality of light emitting elements LD are disposed in close contact with each other, the insulating film 14 may prevent an undesired short-circuit from occurring between the light emitting elements LD.

The light emitting element LD may be employed as a light source for various display devices. The light emitting element LD may be fabricated through a surface treatment process. For example, each light emitting element LD may be surface-treated so that, when a plurality of light emitting elements LD are mixed with a fluidic solution (or solvent) and then supplied to each emission area (e.g., an emission area of each sub-pixel), the light emitting elements LD can be evenly dispersed rather than unevenly aggregating in the solution.

A light emitting device including the light emitting element LD described above may be used not only in a display device but also in various devices which requires a light source. For instance, in case that a plurality of light emitting elements LD are disposed in the emission area of each pixel PXL of a display panel, the light emitting elements LD may be used as a light source of the pixel PXL. However, the application field of the light emitting element LD is not limited to the above-mentioned examples. For example, the light emitting element LD may also be used in other types of devices such as a lighting device, which requires a light source.

Next, a light emitting element LD having a core-shell structure will be described with reference to FIGS. 6A and 6B. The following description of the light emitting element LD having a core-shell structure will be focused on differences from the above-mentioned embodiments, and components of the light emitting element LD that are not separately explained in the following description may comply with that of the preceding embodiments. The same reference numerals will be used to designate the same components, and similar reference numerals will be used to designate similar components.

Referring to FIGS. 6A and 6B, the light emitting element LD' in accordance with one or more embodiments of the present disclosure may include a first semiconductor layer 11', a second semiconductor layer 13', and an active layer 12' interposed between the first and second semiconductor layers 11' and 13'. In one or more embodiments, the light emitting element LD' may include a light emission pattern 10' having a core-shell structure. The light emission pattern 10' may include a first semiconductor layer 11' disposed in a central portion of the light emitting element LD', an active layer 12' which encloses at least one side of the first semiconductor layer 11', a second semiconductor layer 13' which encloses at least one side of the active layer 12', and an electrode layer 15' which encloses at least one side of the second semiconductor layer 13'.

The light emitting element LD' may be formed in a polypyramid shape extending in one direction. In one or more embodiment of the present disclosure, the light emitting element LD' may be provided in the form of a hexagonal pyramid. If the direction in which the light emitting element LD' extends is defined as a longitudinal direction (L'), the light emitting element LD' may have a first end (or a lower end) and a second end (or an upper end) in the longitudinal direction (L'). In an embodiment, any one of the first and second semiconductor layers 11' and 13' may be disposed in the first end (or the lower end) of the light emitting element LD'. The other one of the first and second semiconductor layers 11' and 13' may be disposed in the second end (or the upper end) of the light emitting element LD'.

In one or more embodiment, the light emitting element LD' may have a small size corresponding to the nanometer scale or the micrometer scale, e.g., a diameter and/or a length L having a nanometer scale range or a micrometer scale range. However, in the present disclosure, the size of the light emitting element LD' is not limited thereto, and the size of the light emitting element LD' may be changed to meet requirements (or application conditions) of a lighting device or a self-emissive display device to which the light emitting element LD' is applied.

In one or more embodiment of the present disclosure, the first semiconductor layer 11' may be disposed in a core, i.e., a central (or middle) portion, of the light emitting element LD'. The light emitting element LD' may have a shape corresponding to the shape of the first semiconductor layer 11'. For instance, if the first semiconductor layer 11' has a hexagonal pyramid shape, the light emitting element LD' and the light emission pattern 10' each may also have a hexagonal pyramid shape.

The active layer 12' may be provided and/or formed in a shape enclosing the outer surface (e.g., an outer peripheral surface) of the first semiconductor layer 11' in the longitudinal direction (L') of the light emitting element LD'. For example, the active layer 12' may be provided and/or formed in a shape enclosing an area of the first semiconductor layer 11', other than a lower end of the opposite ends of the first semiconductor layer 11', in the longitudinal direction (L') of the light emitting element LD'.

The second semiconductor layer 13' may be provided and/or formed in a shape enclosing the active layer in the longitudinal direction (L') of the light emitting element LD', and may include a semiconductor layer having a type different from that of the first semiconductor layer 11'. For example, the second semiconductor layer 13' may include at least one p-type semiconductor layer.

In one or more embodiment of the present disclosure, the light emitting element LD' may include an electrode layer 15' that encloses at least one side of the second semiconductor layer 13'. The electrode layer 15' may be an ohmic contact electrode electrically connected to the second semiconductor layer 13', but the present disclosure is not limited thereto.

As described above, the light emitting element LD' may have a hexagonal pyramid shape with the opposite ends protruding outward, and may be implemented as the light emission pattern 10' with a core-shell structure including the first semiconductor layer 11' provided in the central portion thereof, the active layer 12' that encloses the first semiconductor layer 11' other than a lower end of the opposite ends of the first semiconductor layer 11', the second semiconductor layer 13' that encloses the active layer 12', and the electrode layer 15' that encloses the second semiconductor layer 13'. The first semiconductor layer 11' may be disposed in the first end (or the lower end) of the light emitting element LD' having a hexagonal pyramid shape, and the electrode layer 15' may be disposed in the second end (or the upper end) of the light emitting element LD'.

In one or more embodiments, the light emitting element LD' may further include an insulating film 14' provided on the surface (e.g., the outer peripheral surface) of the light emitting pattern 10 having a core-shell structure. In one or more embodiments, the insulating film 14' may enclose the electrode layer 15'. The insulating film 14' may include transparent insulating material.

FIGS. 7A to 7D are circuit diagrams illustrating one or more embodiments of electrical connection relationship of components included in a sub-pixel included in each of pixels illustrated in FIG. 1.

For example, FIGS. 7A to 7D illustrate different embodiments of the electrical connection relationship of components included in a sub-pixel SP which may be employed in an active display device. However, the types of the components included in the sub-pixel SP to which embodiments of the present disclosure may be applied are not limited thereto.

In FIGS. 7A to 7D, not only the components included in the sub-pixel SP but also an area in which the components are provided may be embraced in the definition of the term "sub-pixel SP". In one or more embodiments, each sub-pixel SP illustrated in FIGS. 7A to 7D may be any one of the sub-pixels included in each of the pixels PXL provided in the display device of FIG. 1. The sub-pixels SP included in each pixel PXL may have structures substantially equal or similar to each other.

Referring to FIGS. 1, 2A, 2B, 3A to 6B, and 7A to 7D, one sub-pixel SP (hereinafter, referred to as "sub-pixel") may include an emission unit EMU configured to generate light having a luminance corresponding to a data signal. The sub-pixel SP may selectively further include a pixel circuit 144 configured to drive the emission unit EMU.

In one or more embodiments, the emission unit EMU may include a plurality of light emitting elements LD connected in parallel between a first power line PL1 to which a first driving power supply VDD is applied and a second power line PL2 to which a second driving power supply VSS is applied. For example, the emission unit EMU may include a first electrode EL1 (or "first alignment electrode") connected to the first driving power supply VDD via the pixel circuit 144 and the first power line PL1, a second electrode EL2 (or "second alignment electrode") connected to the second driving power supply VSS through the second power line PL2, and a plurality of light emitting elements LD connected in parallel to each other in an identical direction between the first and second electrodes EL1 and EL2. In one or more embodiments of the present disclosure, the first electrode EL1 may be an anode electrode, and the second electrode EL2 may be a cathode electrode.

In one or more embodiments of the present disclosure, each of the light emitting elements LD included in the emission unit EMU may include a first end connected to the first driving power supply VDD through the first electrode EL1, and a second end connected to the second driving power supply VSS through the second electrode EL2. The first driving power supply VDD and the second driving power supply VSS may have different potentials. For example, the first driving power supply VDD may be set as a high-potential power supply, and the second driving power supply VSS may be set as a low-potential power supply. Here, a difference in potential between the first and second driving power supplies VDD and VSS may be set to a value equal to or greater than a threshold voltage of the light emitting elements LD during an emission period of the sub-pixel SP.

As described above, the light emitting elements LD that are connected in parallel to each other in the same direction (e.g., in a forward direction) between the first electrode EL1 and the second electrode EL2 to which voltages having different potentials are respectively supplied may form respective valid light sources. The valid light sources may be collected to form the emission unit EMU of the sub-pixel SP.

The light emitting elements LD of the emission unit EMU may emit light having a luminance corresponding to driving current supplied thereto through the pixel circuit 144. For example, during each frame period, the pixel circuit 144 may supply driving current corresponding to a gray scale of corresponding frame data to the emission unit EMU. The driving current supplied to the emission unit EMU may be divided into the light emitting elements LD connected to each other in parallel in the identical direction. Hence, each of the light emitting elements LD may emit light having a luminance corresponding to current applied thereto, so that the emission unit EMU may emit light having a luminance corresponding to the driving current.

Figure 7A:
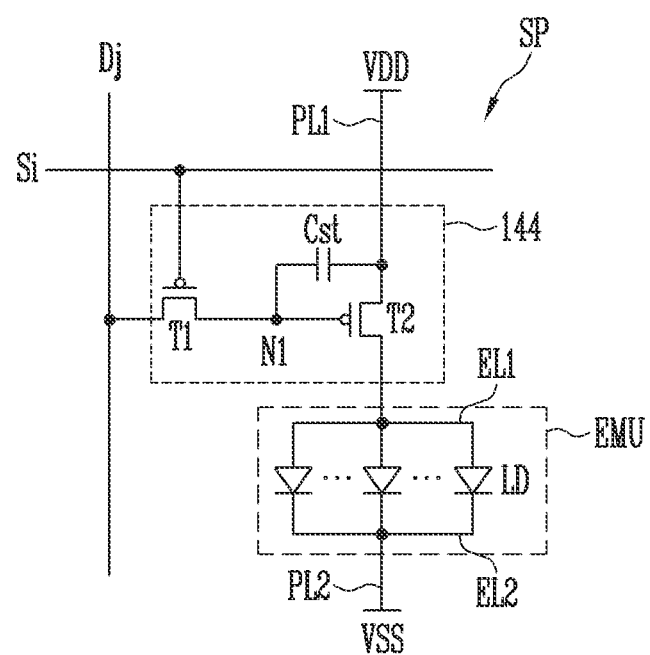
FIGS. 7A to 7D are circuit diagrams illustrating various embodiments of electrical connection relationship of components included in a sub-pixel included in each of pixels illustrated in FIG. 1.
Figure 7B:
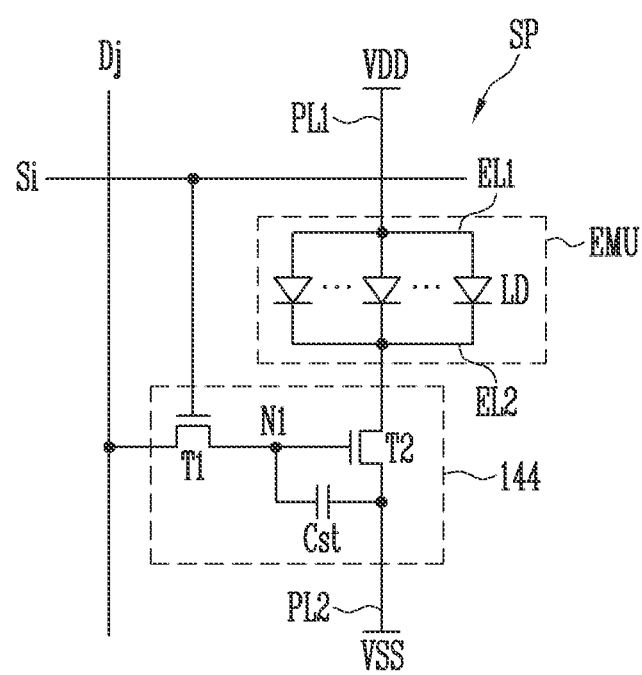
Figure 7C:
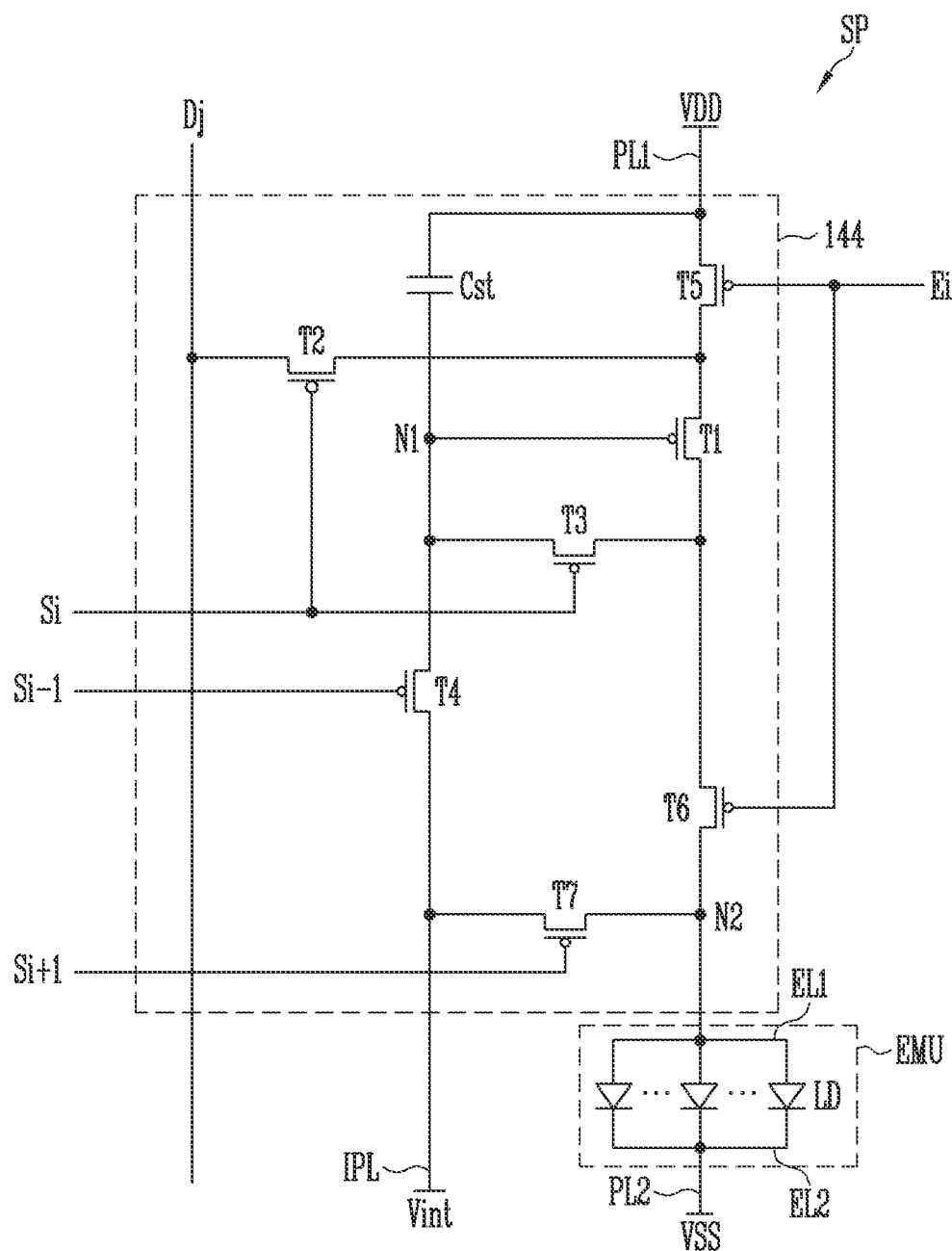
Figure 7D:
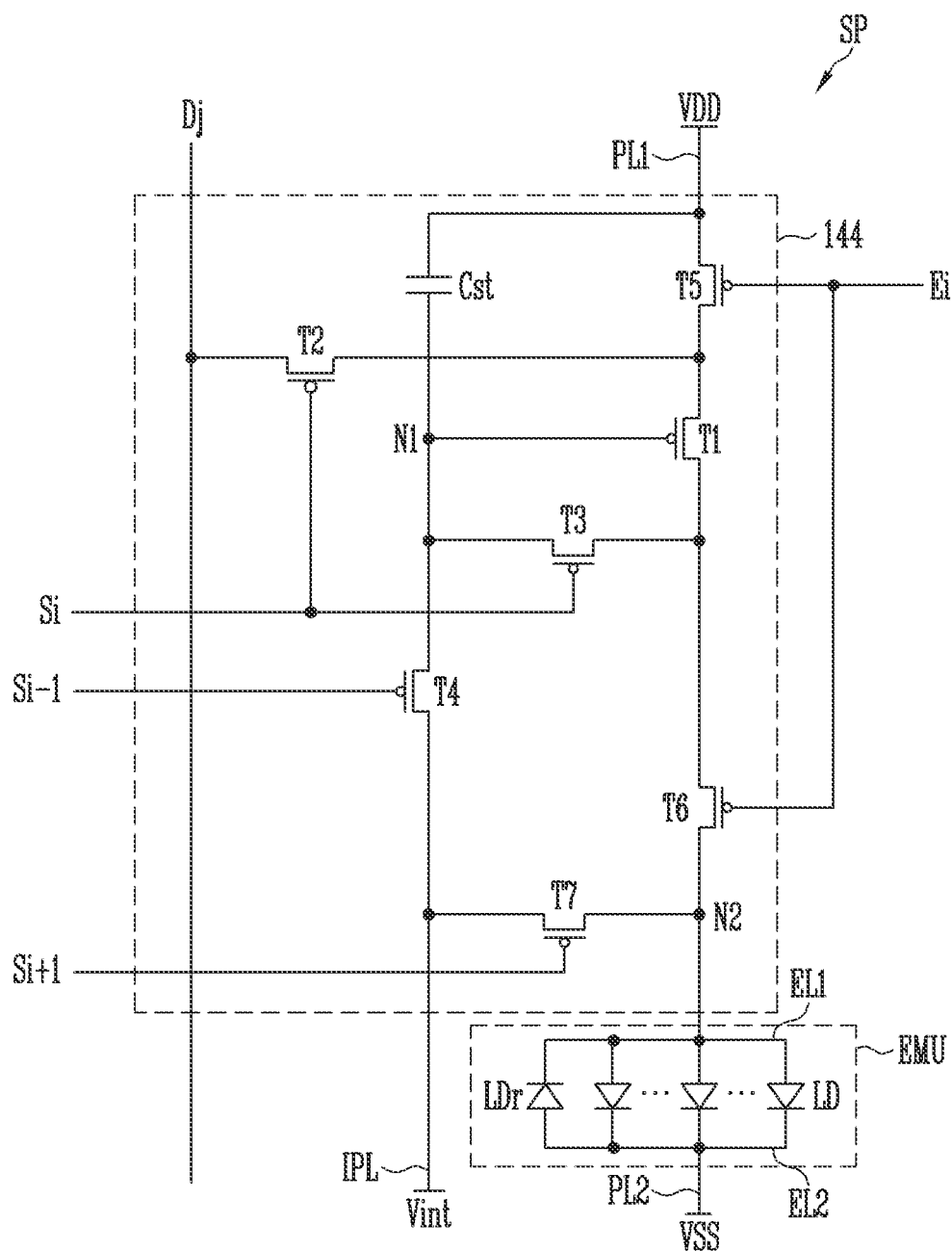

Although FIGS. 7A to 7D illustrate embodiments in which the light emitting elements LD are connected to each other in the identical direction between the first and second driving power supplies VDD and VSS, the present disclosure is not limited thereto. In one or more embodiments, the emission unit EMU may further include at least one invalid light source, as well as including the light emitting elements LD that form the respective valid light sources. For example, as illustrated in FIG. 7D, at least a reverse light emitting element LDr may be further connected between the first and second electrodes EL1 and EL2 of the emission unit EMU. The reverse light emitting element LDr, along with the light emitting elements LD that form the valid light sources, may be connected in parallel to each other between the first and second electrodes EL1 and EL2. Here, the reverse light emitting element LDr may be connected between the first and second electrodes EL1 and EL2 in a direction opposite to that of the light emitting elements LD. Even when a suitable driving voltage (e.g., a set or predetermined driving voltage such as, a normal directional driving voltage) is applied between the first and second electrodes EL1 and EL2, the reverse light emitting element LDr remains disabled. Hence, current substantially does not flow through the reverse light emitting element LDr.

The pixel circuit 144 may be connected to a scan line Si and a data line Dj of the corresponding sub-pixel SP. For example, if the sub-pixel SP is disposed in an i-th row (i is a positive integer) and a j-th column (j is a positive integer) of the display area DA, the pixel circuit 144 of the sub-pixel SP may be connected to an i-th scan line Si and a j-th data line Dj of the display area DA. In one or more embodiment, the pixel circuit 144 may include first and second transistors T1 and T2, and a storage capacitor Cst, as illustrated in FIGS. 7A and 7B. The structure of the pixel circuit 144 is not limited to the embodiment illustrated in each of FIGS. 7A and 7B.

A first terminal of the first transistor (e.g., T1 a switching transistor) may be connected to the data line Dj, and a second terminal thereof may be connected to a first node N1. Here, the first terminal and the second terminal of the first transistor T1 are different terminals, and, for example, if the first terminal is a source electrode, and the second terminal is a drain electrode. A gate electrode of the first transistor T1 may be connected to the scan line Si.

When a scan signal having a voltage (e.g., a low-level voltage) capable of turning on the first transistor T1 is supplied from the scan line Si, the first transistor T1 is turned on to electrically connect the data line Dj with the first node N1. Here, a data signal of a corresponding frame is supplied to the data line Dj, whereby the data signal is transmitted to the first node N1. The data signal transmitted to the first node N1 may be charged to the storage capacitor Cst.

A first terminal of the second transistor (e.g., T2 driving transistor) may be connected to the first driving power supply VDD, and a second terminal thereof may be electrically connected to the first electrode EL1 for the light emitting elements LD. A gate electrode of the second transistor T2 may be connected to the first node N1. As such, the second transistor T2 may control the amount of driving current to be supplied to the light emitting elements LD in response to the voltage of the first node N1.

A first electrode of the storage capacitor Cst may be connected to the first driving power supply VDD, and a second electrode thereof may be connected to the first node N1. The storage capacitor Cst is charged with a voltage (or stores a charge) corresponding to a data signal supplied to the first node N1, and maintains the charged voltage until a data signal of a subsequent frame is supplied.

FIGS. 7A and 7B each illustrate the pixel circuit 144 including the first transistor T1 configured to transmit a data signal to the sub-pixel SP, the storage capacitor Cst configured to store the data signal (e.g., the storage capacitor Cst configured to store charge corresponding to the data signal), and the second transistor T2 configured to supply driving current corresponding to the data signal to the light emitting elements LD.

However, the present disclosure is not limited thereto, and the structure of the pixel circuit 144 may be changed in various ways. For example, the pixel circuit 144 may further include at least one transistor element such as a transistor element configured to compensate for the threshold voltage of the second transistor T2, a transistor element configured to initialize the first node N1, and/or a transistor element configured to control an emission time of the light emitting elements LD, or other circuit elements such as a boosting capacitor for boosting the voltage of the first node N1.

Furthermore, although in FIG. 7A the transistors, e.g., the first and second transistors T1 and T2, included in the pixel circuit 144 have been illustrated as being formed of P-type transistors, the present disclosure is not limited thereto. In other words, at least one of the first and second transistors T1 and T2 included in the pixel circuit 144 may be changed to an N-type transistor (e.g., see, FIG. 7B). For instance, one of the first and second transistors T1 and T2 included in the pixel circuit 144 may be formed of an N-type transistor, and the other one may be formed of a P-type transistor.

In one or more embodiments, the first and second transistors T1 and T2 included in the pixel circuit 144 may be formed of an oxide semiconductor thin-film transistor or an LTPS thin-film transistor. In one or more embodiments, one of the first and second transistors T1 and T2 included in the pixel circuit 144 may be formed of an oxide semiconductor thin-film transistor, and the other one may be formed of an LTPS thin-film transistor.

Referring to FIGS. 1, 2A, 2B, 3A to 6B, and 7B, the first and second transistors T1 and T2 in accordance with one or more embodiments of the present disclosure may be formed of N-type transistors. The configuration and operation of the pixel circuit 144 illustrated in FIG. 7B, other than a change in connection positions of some components (e.g., the transistors T1 and T2 and the storage capacitor Cst) due to a change in the type of transistors, are similar to those of the pixel circuit 144 of FIG. 7A. Therefore, detailed descriptions pertaining thereto will be omitted.

In one or more embodiments of the present disclosure, the configuration of the pixel circuit 144 is not limited to the embodiments illustrated in FIGS. 7A and 7B. For example, the pixel circuit 144 may be configured in the same manner as that of the embodiment illustrated in each of FIGS. 7C and 7D.

As illustrated in FIGS. 7C and 7D, the pixel circuit 144 may be connected to a scan line Si and a data line Dj of the sub-pixel SP. For example, if the sub-pixel SP is disposed in an i-th row and a j-th column of the display area DA, the pixel circuit 144 of the corresponding sub-pixel SP may be connected to an i-th scan line Si and a j-th data line Dj of the display area DA.

In one or more embodiments, the pixel circuit 144 may be further connected to at least another scan line. For example, the sub-pixel SP disposed in the i-th row of the display area DA may be further connected to an i−1-th scan line Si−1 (e.g., a preceding scan line) and/or an i+1-th scan line Si+1 (e.g., a scan line of a subsequent stage). In one or more embodiments, the pixel circuit 144 may be connected not only to the first and second driving power supplies VDD and VSS but also to a third power supply. For example, the pixel circuit 144 may also be connected to an initialization power supply Vint.

The pixel circuit 144 may include first to seventh transistors T1 to T7, and a storage capacitor Cst.

A first electrode, e.g., a source electrode, of the first transistor (e.g., T1 driving transistor) may be connected to the first driving power supply VDD via the fifth transistor T5, and a second electrode thereof, e.g., a drain electrode, may be connected to one ends (e.g., the first electrode EL1) of light emitting elements LD via the sixth transistor T6. A gate electrode of the first transistor T1 may be connected to a first node N1. The first transistor T1 may control driving current flowing between the first driving power supply VDD and the second driving power supply VSS via the light emitting elements LD in response to the voltage of the first node N1.

The second transistor (e.g., T2 switching transistor) may be connected between the j-th data line Dj connected to the sub-pixel SP and the source electrode of the first transistor T1. A gate electrode of the second transistor T2 may be connected to the i-th scan line Si connected to the sub-pixel SP. When a scan signal having a gate-on voltage (e.g., a low-level voltage) is supplied from the i-th scan line Si, the second transistor T2 may be turned on to electrically connect the j-th data line Dj to the source electrode of the first transistor T1. Hence, if the second transistor T2 is turned on, a data signal supplied from the j-th data line Dj may be transmitted to the first transistor T1.

The third transistor T3 may be connected between the drain electrode of the first transistor T1 and the first node N1. A gate electrode of the third transistor T3 may be connected to the i-th scan line Si. When a scan signal having a gate-on voltage is supplied from the i-th scan line Si, the third transistor T3 may be turned on to electrically connect the drain electrode of the first transistor T1 to the first node N1.

The fourth transistor T4 may be connected between the first node N1 and an initialization power line IPL to which the initialization power supply Vint is to be applied. A gate electrode of the fourth transistor T4 may be connected to a preceding scan line, e.g., the i−1-th scan line Si−1. When a scan signal having a gate-on voltage (e.g., a low-level voltage) is supplied to the i−1-th scan line Si−1, the fourth transistor T4 may be turned on so that the voltage of the initialization power supply Vint may be transmitted to the first node N1. Here, the initialization power supply Vint may have a voltage equal to or less than the minimum voltage of the data signal.

The fifth transistor T5 may be connected between the first driving power supply VDD and the first transistor T1. A gate electrode of the fifth transistor T5 may be connected to a corresponding emission control line, e.g., an i-th emission control line Ei. The fifth transistor T5 may be turned off when an emission control signal having a gate-off voltage (e.g., a high-level voltage) is supplied to the i-th emission control line Ei, and may be turned on when an emission control signal having a gate-on voltage (e.g., a low-level voltage) is supplied to the i-th emission control line Ei.

The sixth transistor T6 may be connected between the first transistor T1 and the first ends of the light emitting elements LD or a second node N2. A gate electrode of the sixth transistor T6 may be connected to the i-th emission control line Ei. The sixth transistor T6 may be turned off when an emission control signal having a gate-off voltage (e.g., a high-level voltage) is supplied to the i-th emission control line Ei, and may be turned on when an emission control signal having a gate-on voltage (e.g, a low-level voltage) is supplied to the i-th emission control line Ei.

The seventh transistor T7 may be connected between the initialization power line IPL and the first ends of the light emitting elements LD or a second node N2. A gate electrode of the seventh transistor T7 may be connected to any one of scan lines of a subsequent stage, e.g., to the i+1-th scan line Si+1. When a scan signal having a gate-on voltage is supplied to the i+1-th scan line Si+1, the seventh transistor T7 may be turned on so that the voltage of the initialization power supply Vint may be supplied to the first ends of light emitting elements LD.

The storage capacitor Cst may be connected between the first driving power supply VDD and the first node N1. The storage capacitor Cst may store (or charge) a voltage corresponding both to the data signal applied to the first node N1 during each frame period and to the threshold voltage of the first transistor T1.

Although in each of FIGS. 7C and 7D the transistors, e.g., the first to seventh transistors T1 to T7, included in the pixel circuit 144 have been illustrated as being formed of P-type transistors, the present disclosure is not limited thereto. For example, at least one of the first to seventh transistors T1 to T7 may be changed to an N-type transistor. For instance, one of the first and second transistors T1 and T2 included in the pixel circuit 144 may be formed of an N-type transistor, and the other one may be formed of a P-type transistor.

In one or more embodiments, the first to seventh transistors T1 to 17 included in the pixel circuit 144 each may be formed of an oxide semiconductor thin-film transistor or an LTPS thin-film transistor. In one or more embodiments, some transistors of the first to seventh transistors T1 to T7 included in the pixel circuit 144 each may be formed of an oxide semiconductor thin-film transistor, and the other transistors each may be formed of an LTPS thin-film transistor.

Although FIGS. 7A to 7D illustrate embodiments in which all light emitting elements LD of each emission unit EMU are connected in parallel to each other, the present disclosure is not limited thereto. In one or more embodiments, the emission unit EMU may include at least one serial stage including a plurality of light emitting elements LD connected in parallel to each other. In other words, the emission unit EMU may be formed of a serial/parallel combination structure.

The structure of the sub-pixel SP which may be applied to the present disclosure is not limited to the embodiments illustrated in FIGS. 7A to 7D, and the corresponding sub-pixel SP may have various structures. In one or more embodiments of the present disclosure, each sub-pixel SP may be configured in a passive light emitting display device or the like. In this case, the pixel circuit 144 may be omitted, and the opposite ends of the light emitting elements LD included in the emission unit EMU may be directly connected to the scan lines Si−1, Si, and Si+1, the data line Dj, the first power line PL1 to which the first driving power supply VDD is to be applied, the second power line PL2 to which the second driving power supply VSS is to be applied, and/or a control line (e.g., a predetermined control line).

Figure 8:
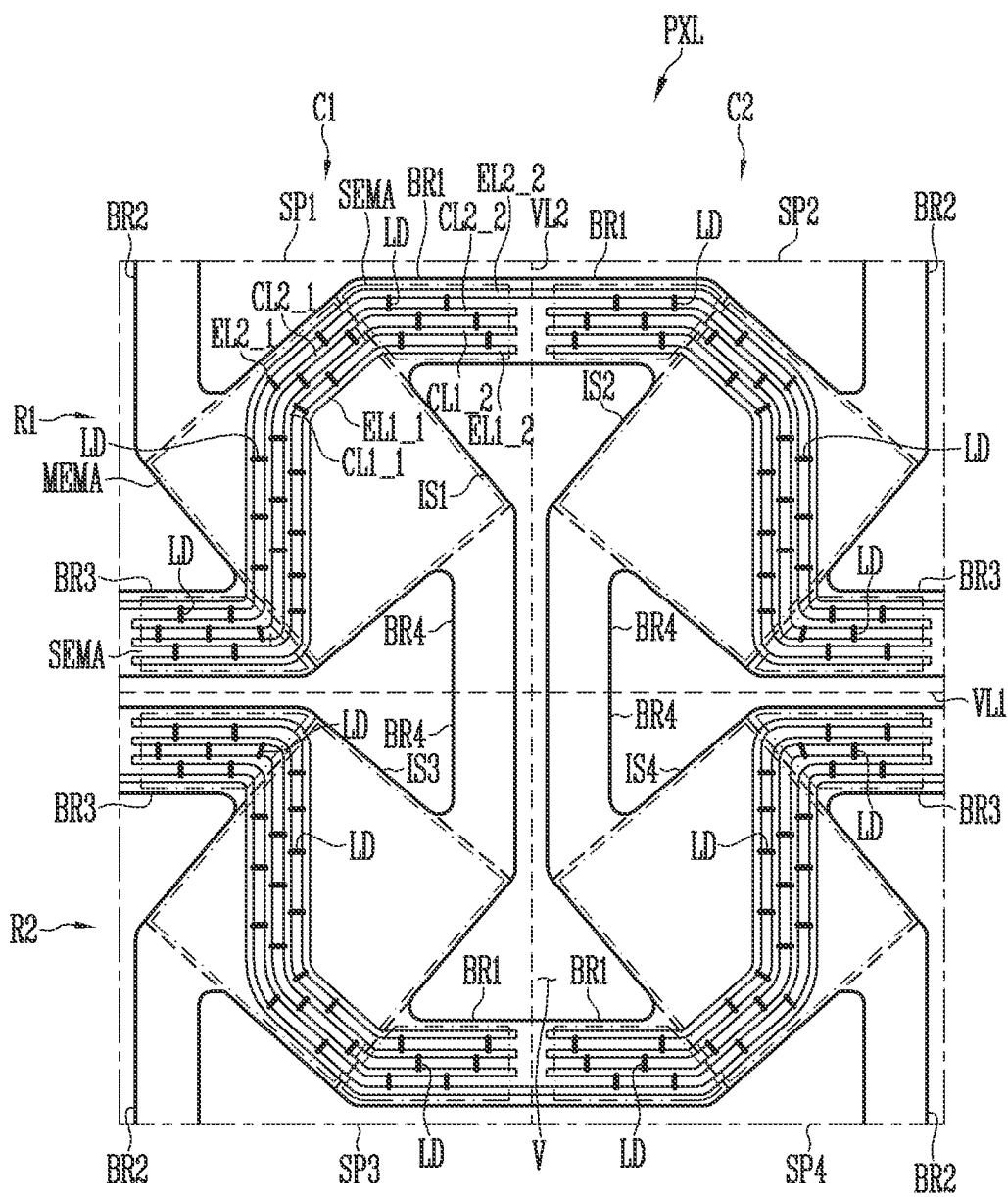
FIG. 8 is a plan view schematically illustrating one of the pixels shown in FIG. 1.
Figure 8:
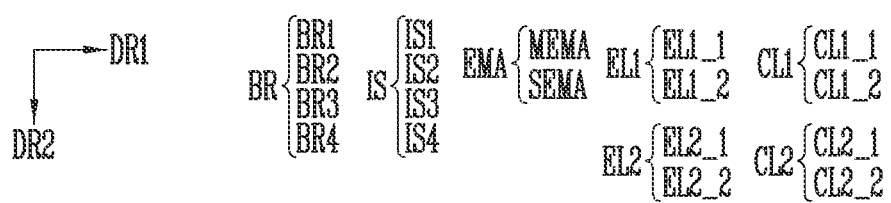
Figure 9A:
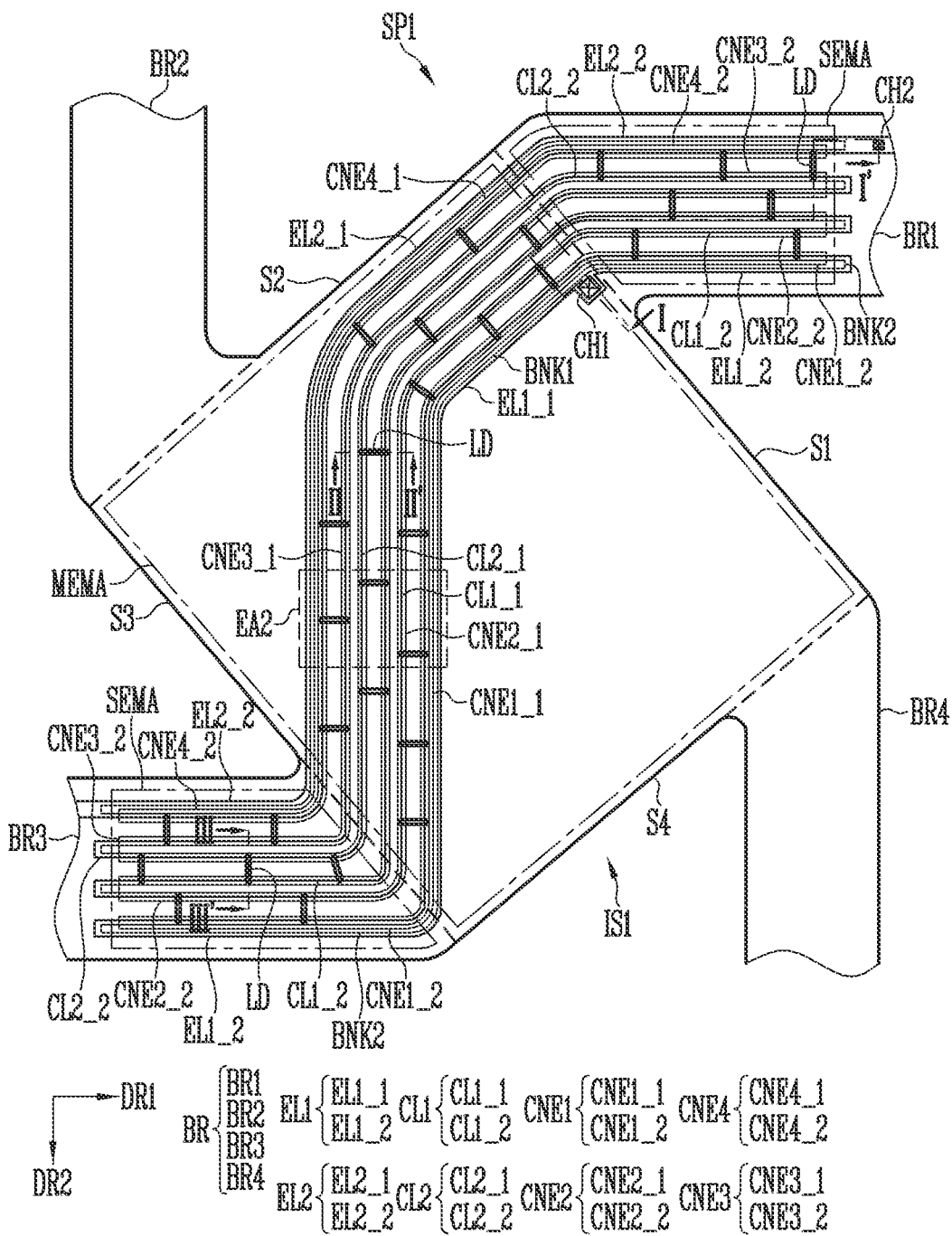
FIG. 9A is a plan view schematically illustrating a first sub-pixel of FIG. 8.
Figure 9B:
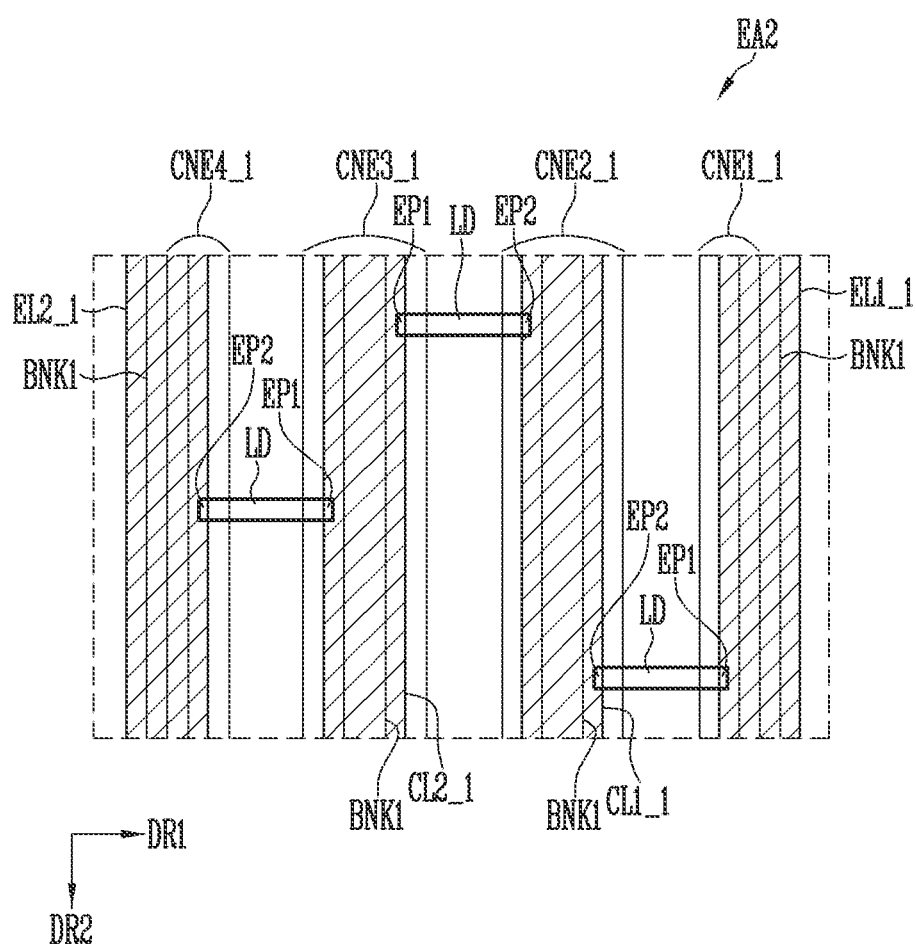
FIG. 9B is an enlarged plan view of portion EA2 of FIG. 9A.
Figure 10:
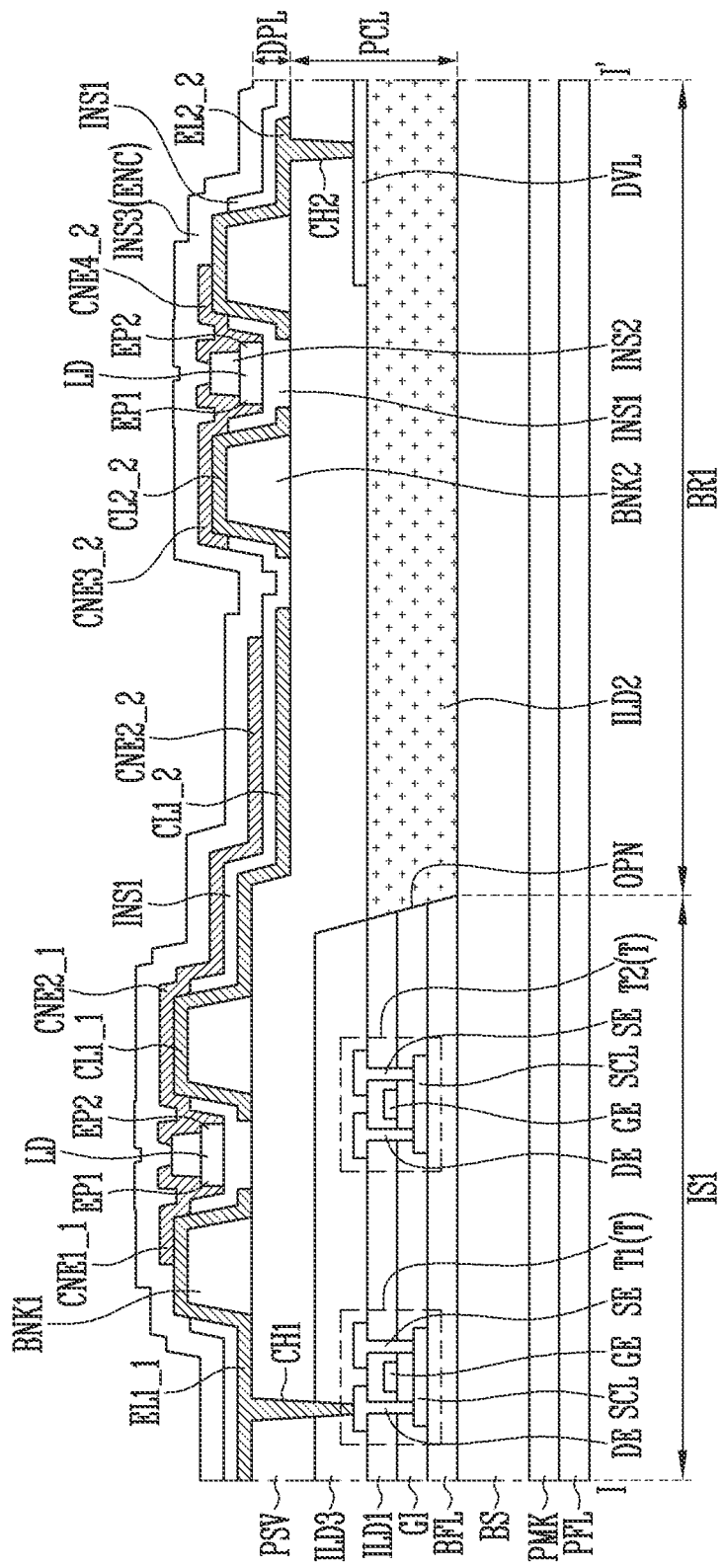
FIG. 10 is a sectional view taken along the line I-I' of FIG. 9A.
Figure 11:
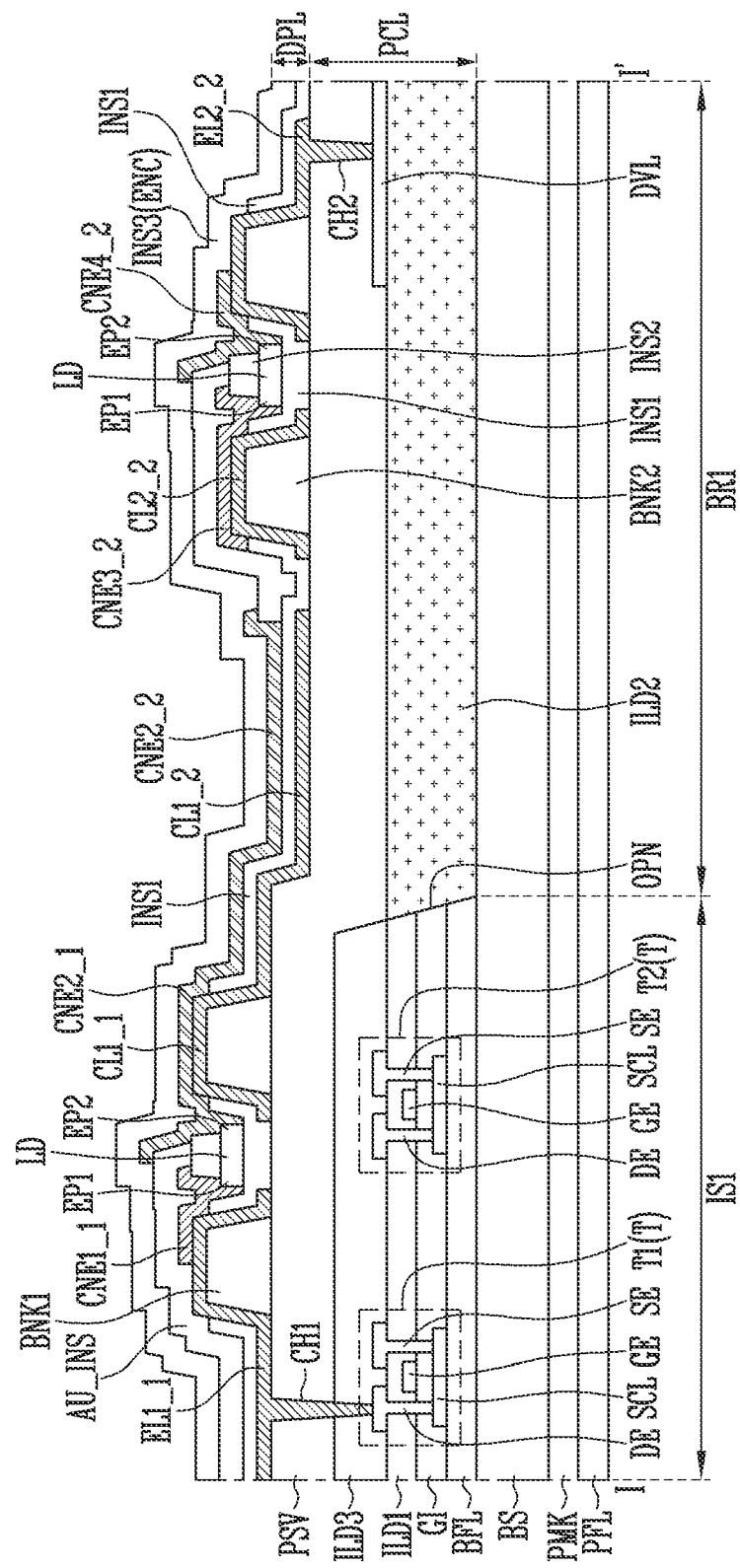
FIG. 11 illustrates an embodiment in which first and third contact electrodes and second and fourth contact electrodes of FIG. 10 are disposed on different layers, and is a sectional view corresponding to the line I-I' of FIG. 9A.
Figure 12:
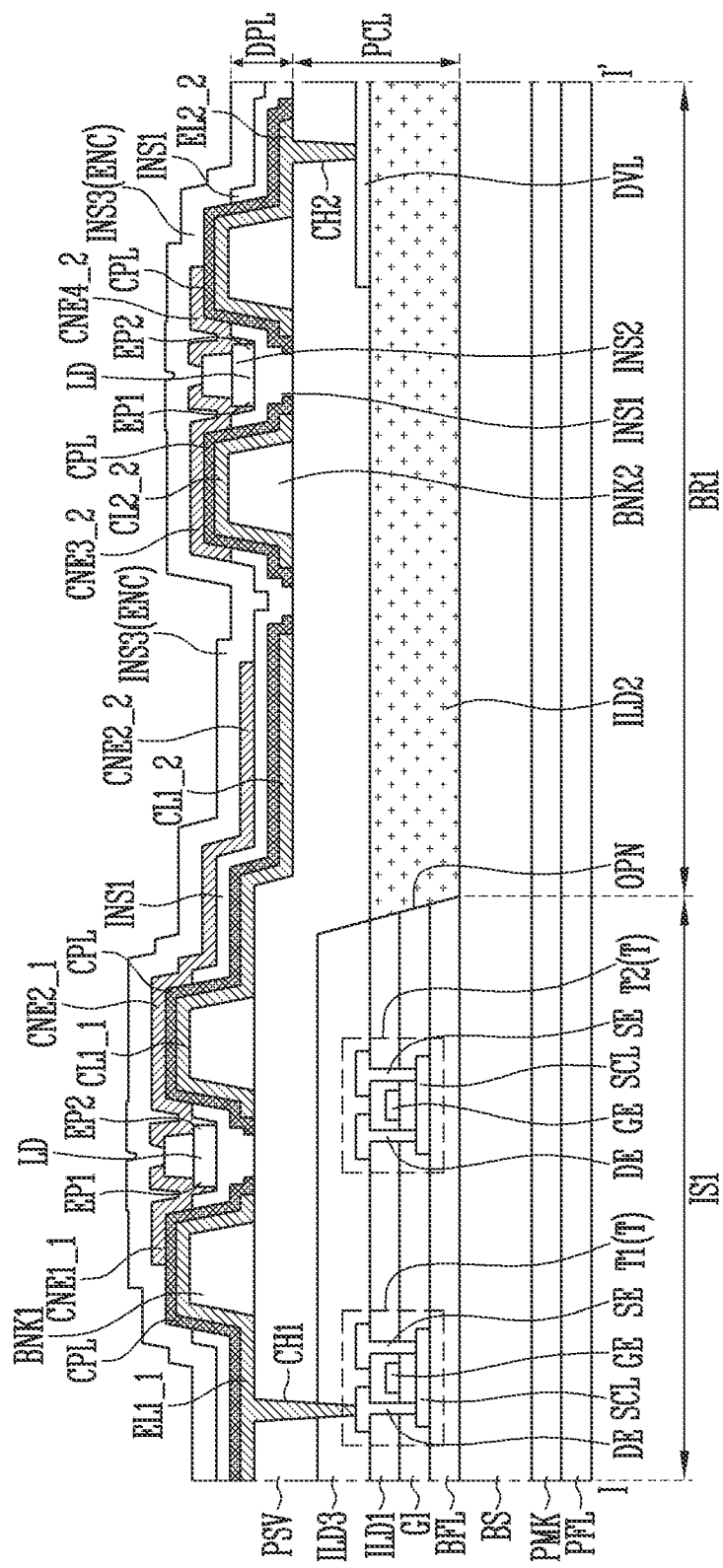
FIG. 12 illustrates an embodiment in which capping layers are respectively disposed on first to fourth electrodes shown in FIG. 10, and is a sectional view corresponding to the line I-I' of FIG. 9A.
Figure 13:
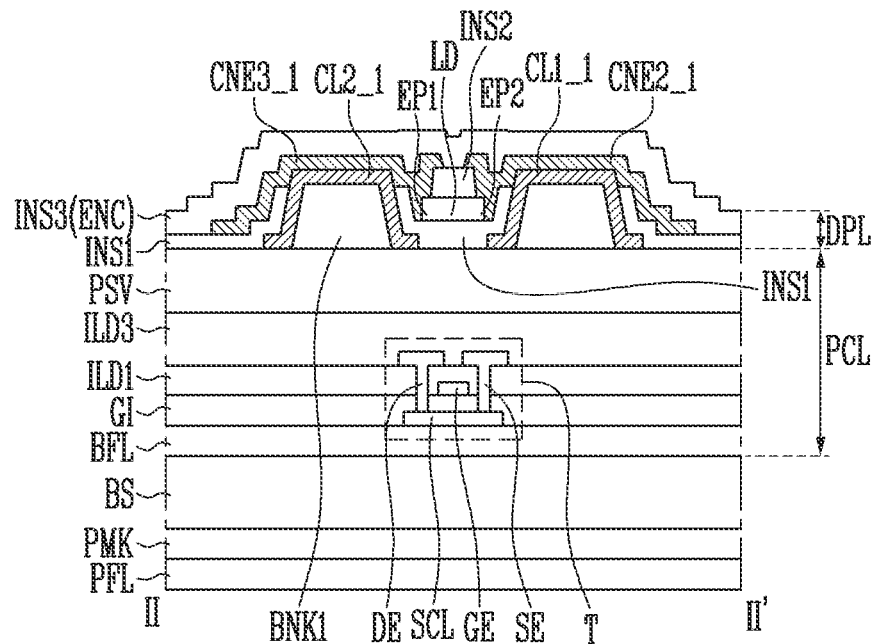
FIG. 13 is a sectional view taken along the line II-II' of FIG. 9A.
Figure 14:
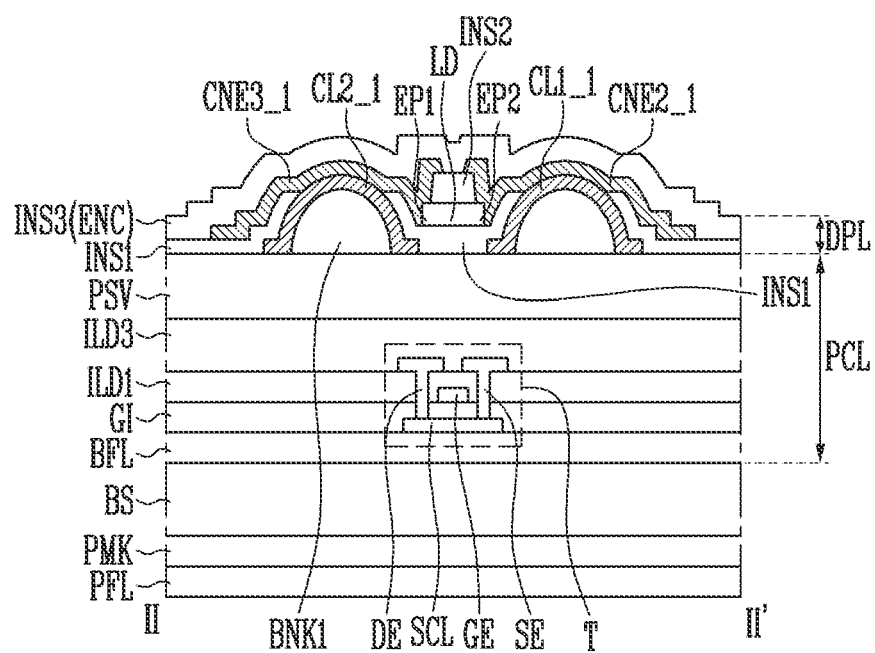
FIG. 14 illustrates a shape of a first bank illustrated in FIG. 13, and is a sectional view corresponding to the line II-II' of FIG. 9A.
Figure 15:
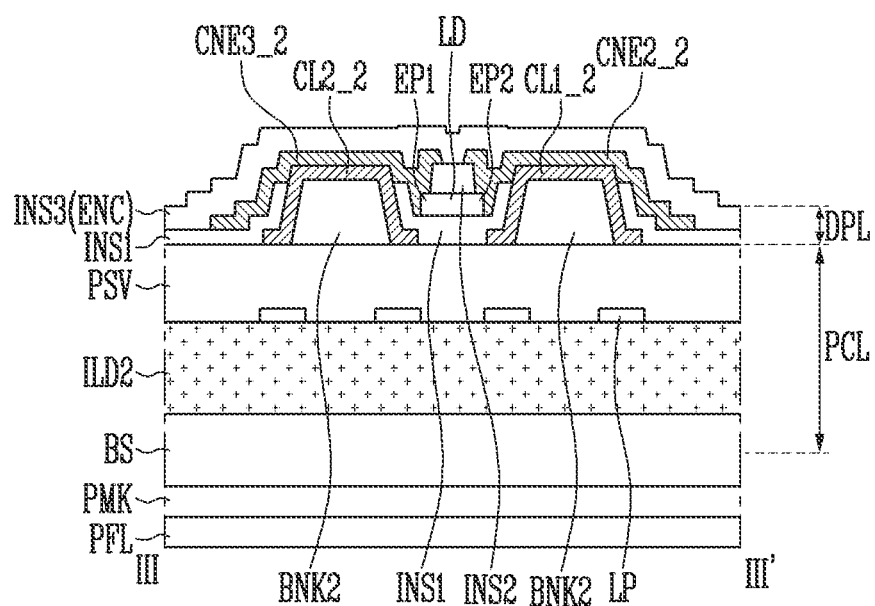
FIG. 15 is a sectional view taken along the line III-III' of FIG. 9A.
Figure 16A:
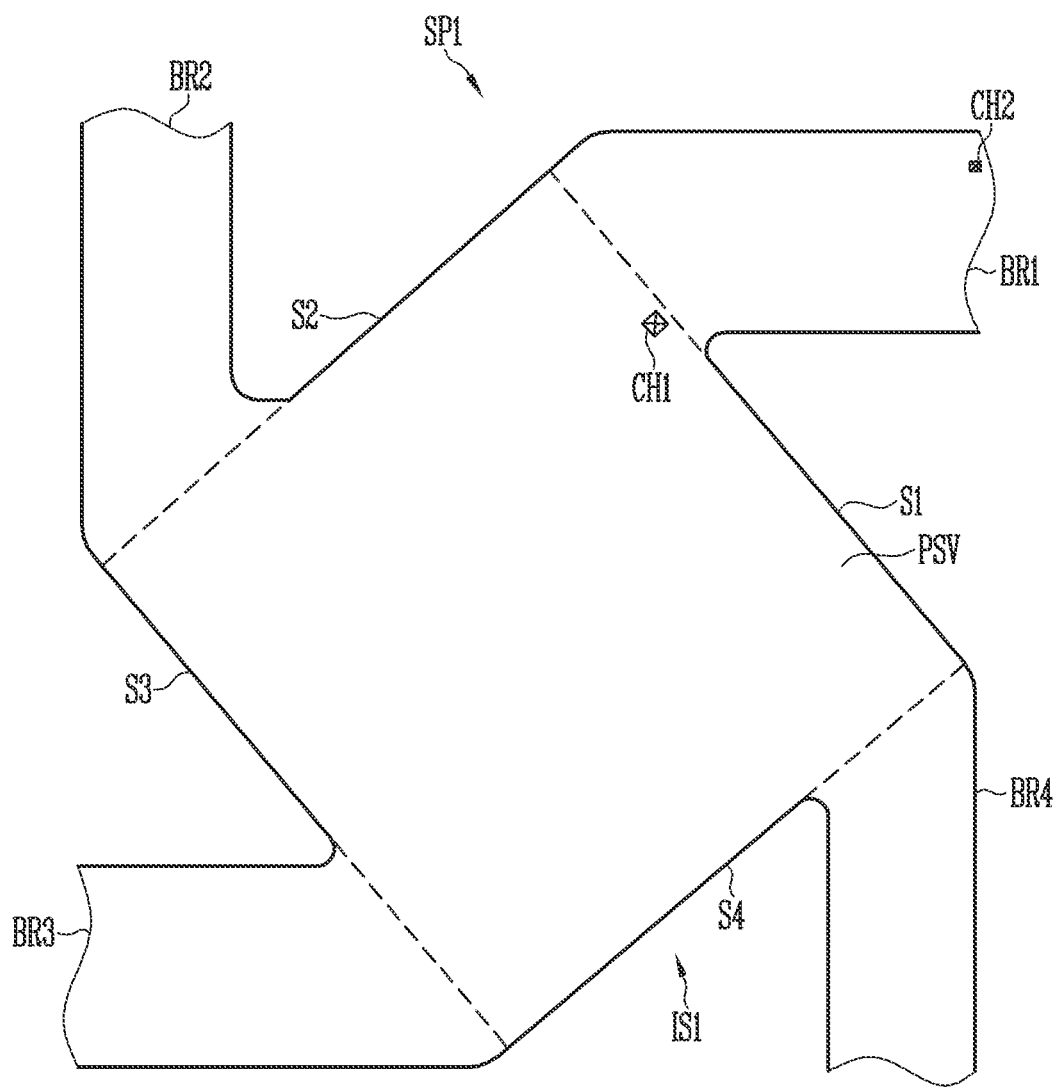
FIGS. 16A to 16F are schematic plan views sequentially illustrating a method of fabricating a first sub-pixel illustrated in FIG. 9A.
Figure 16B:
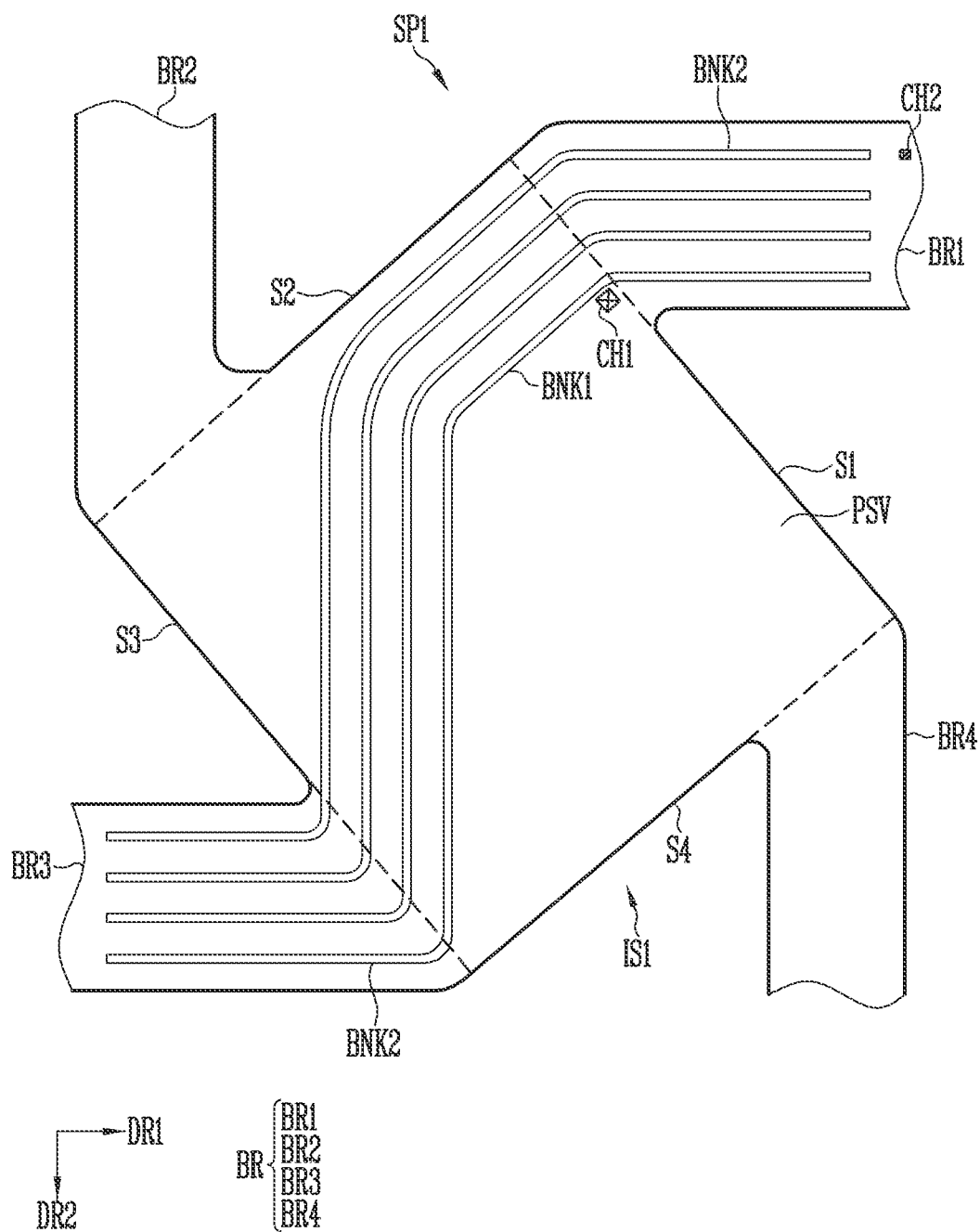
Figure 16C:
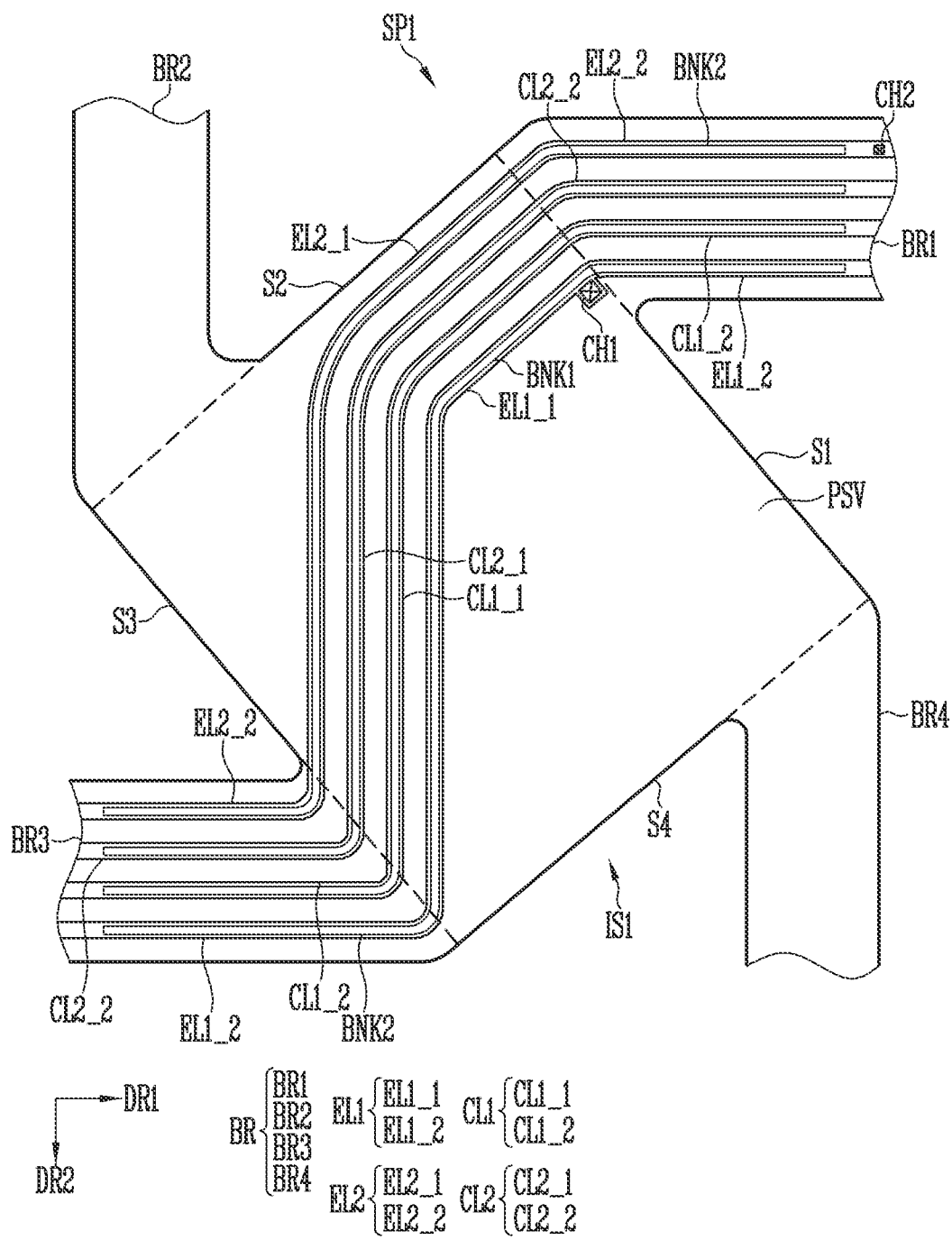
Figure 16D:
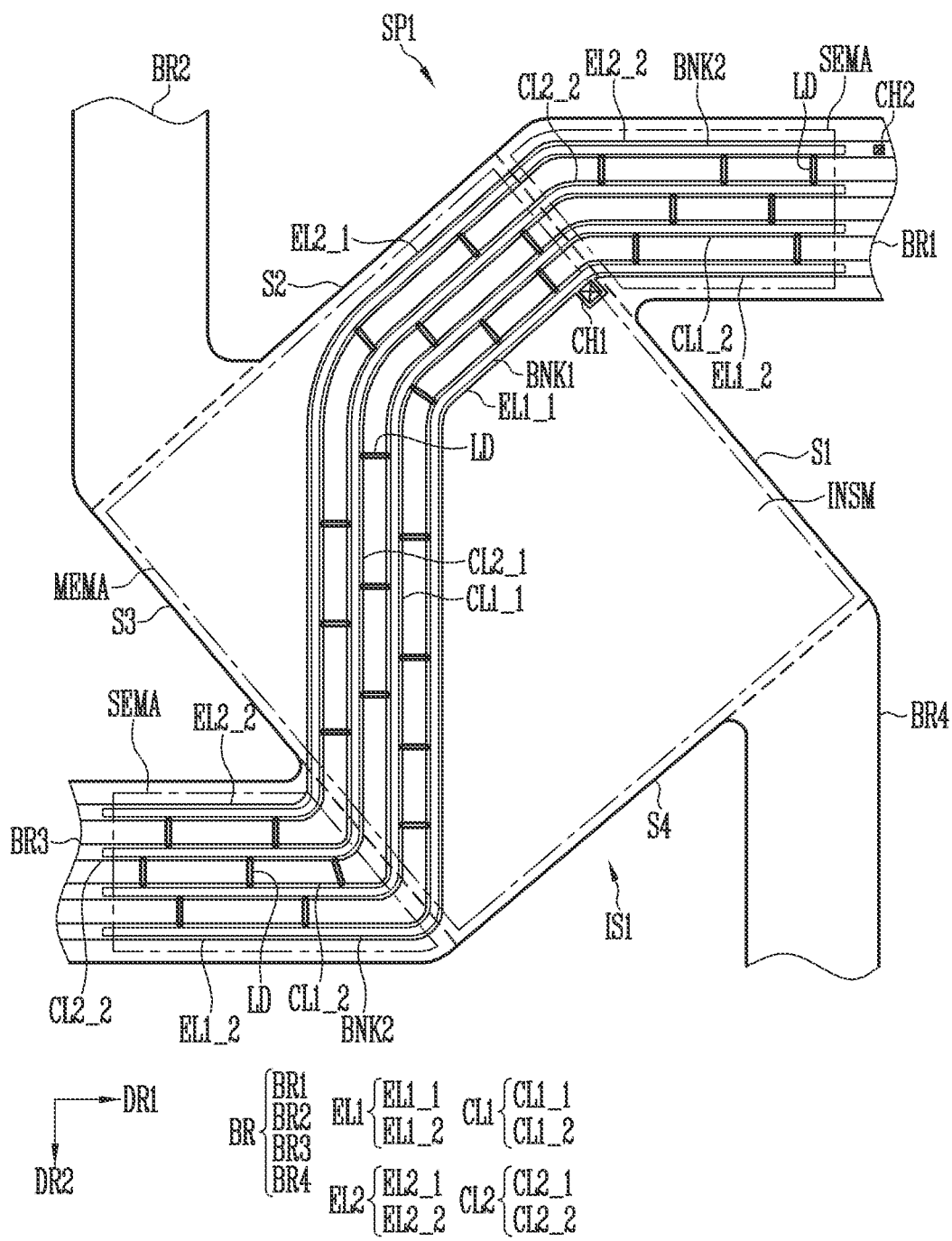
Figure 16E:
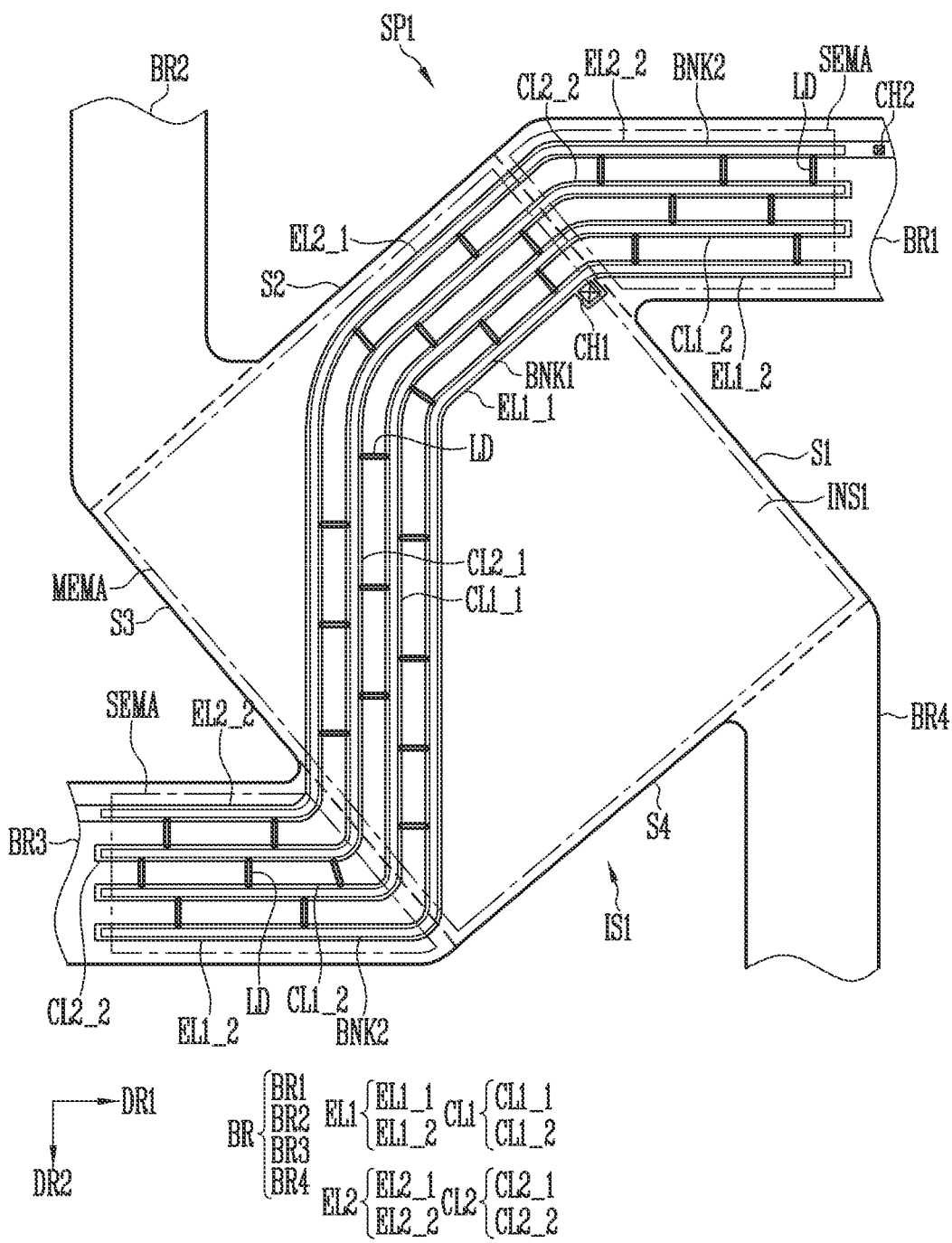
Figure 16F:
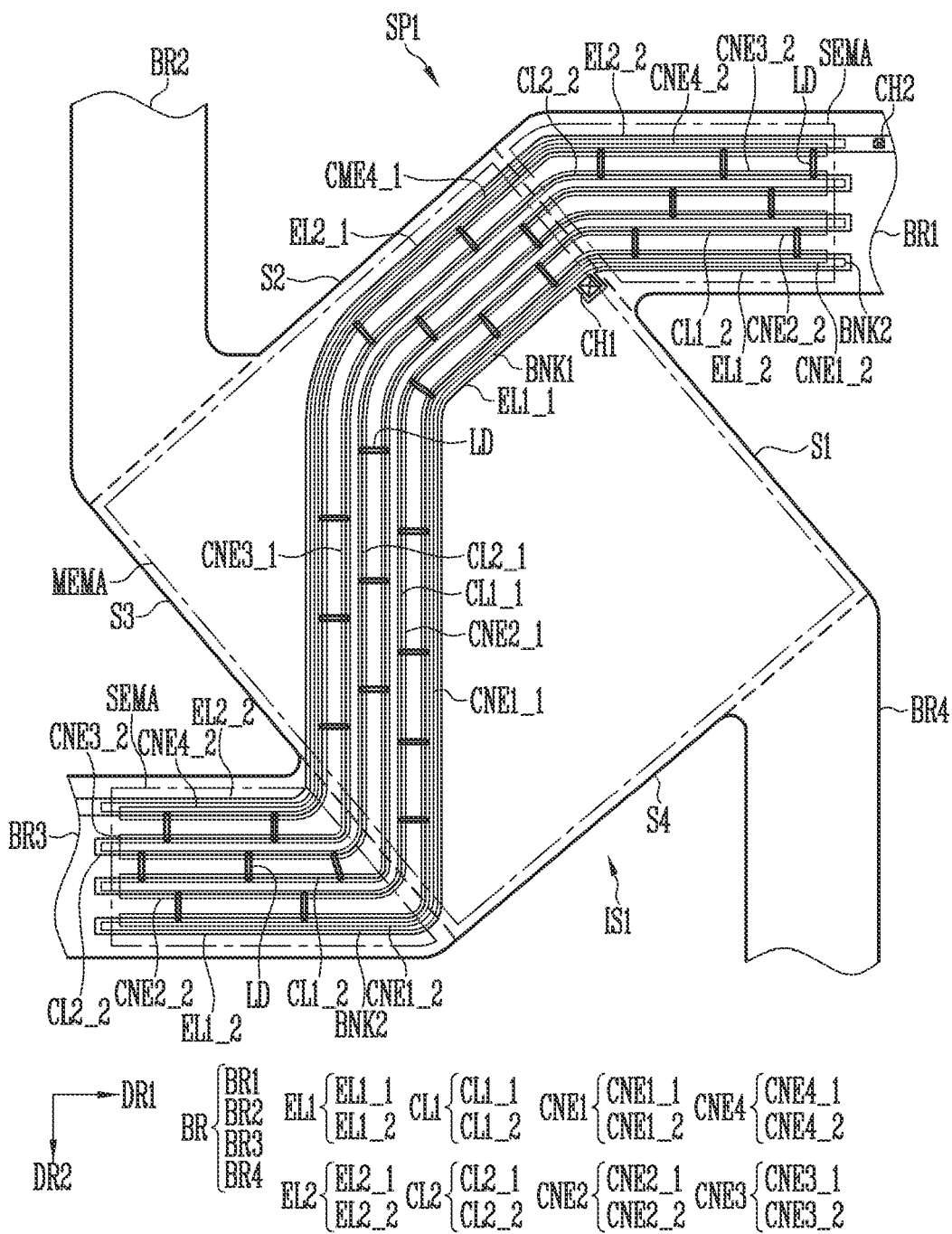
Figure 17A:
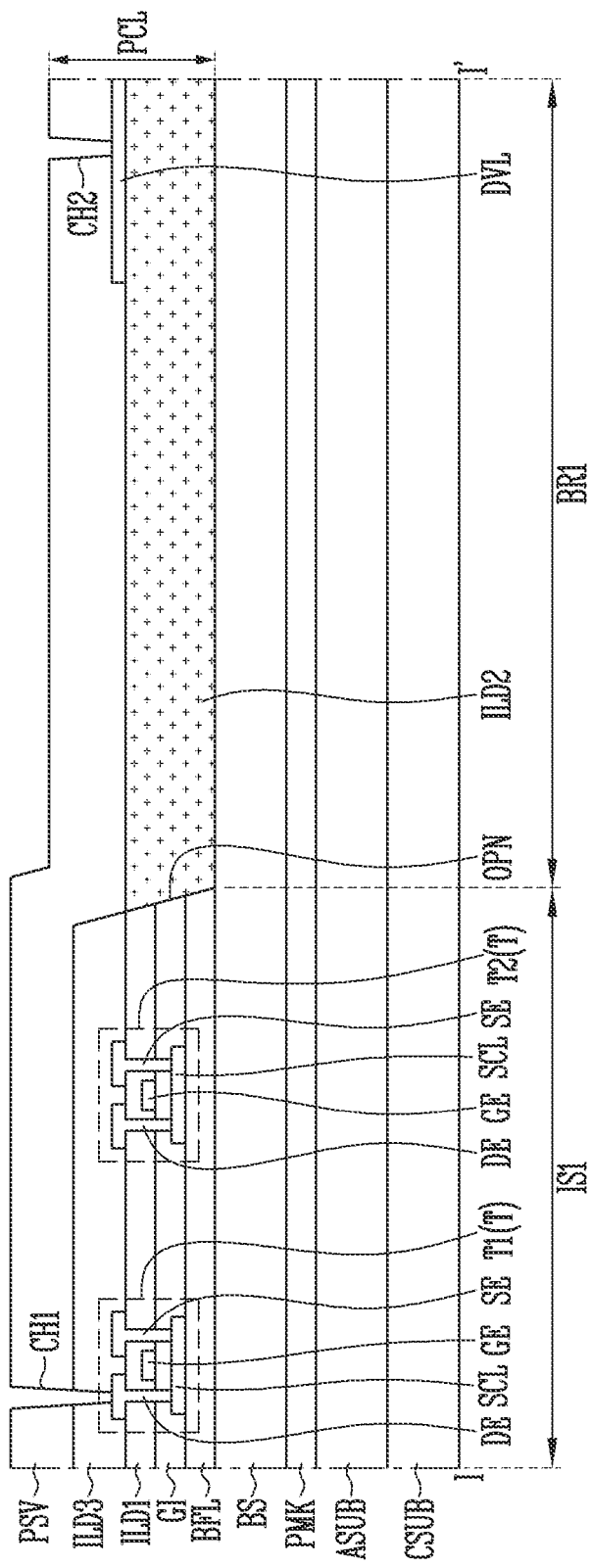
FIGS. 17A to 17G are sectional views sequentially illustrating a method of fabricating a first sub-pixel illustrated in FIG. 10.
Figure 17B:
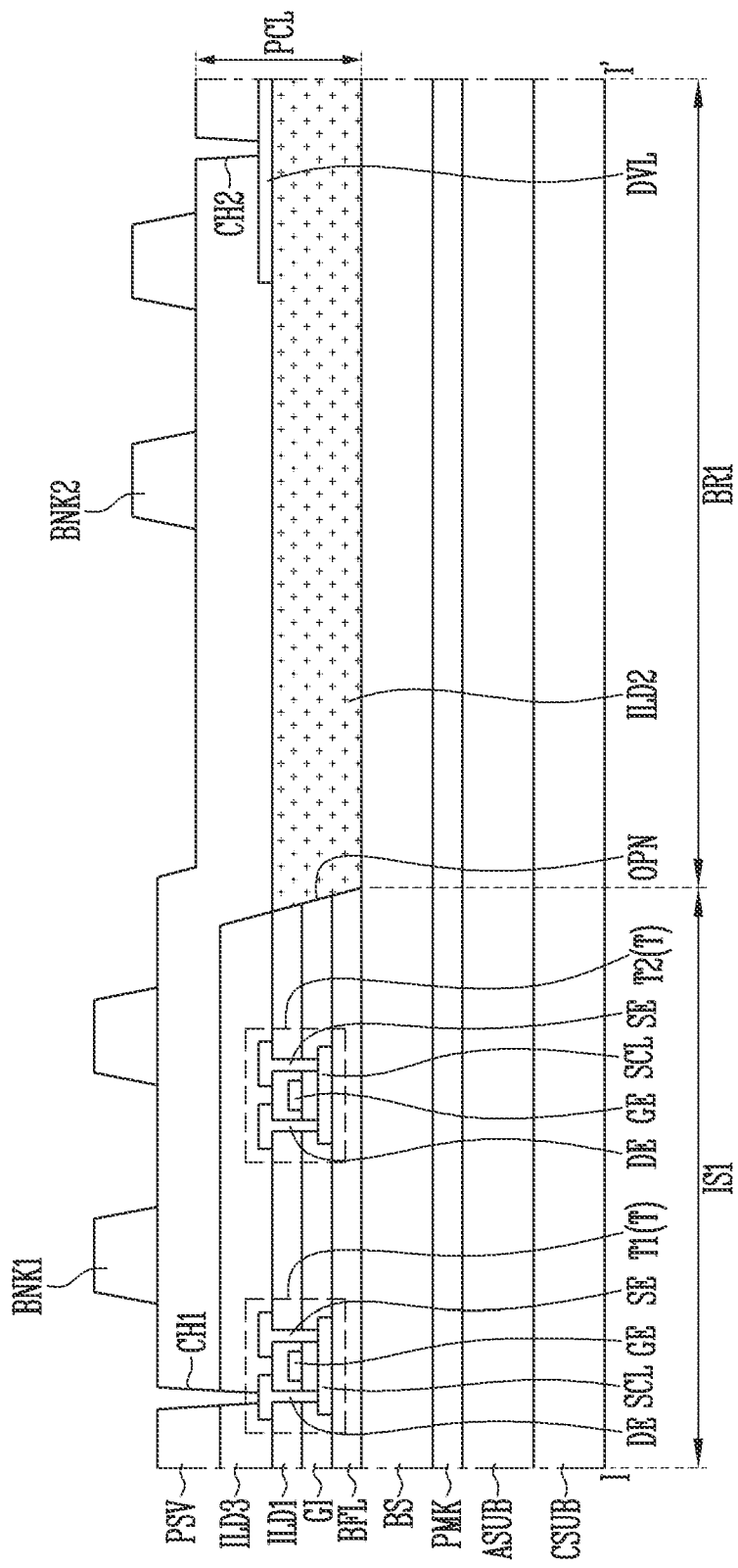
Figure 17C:
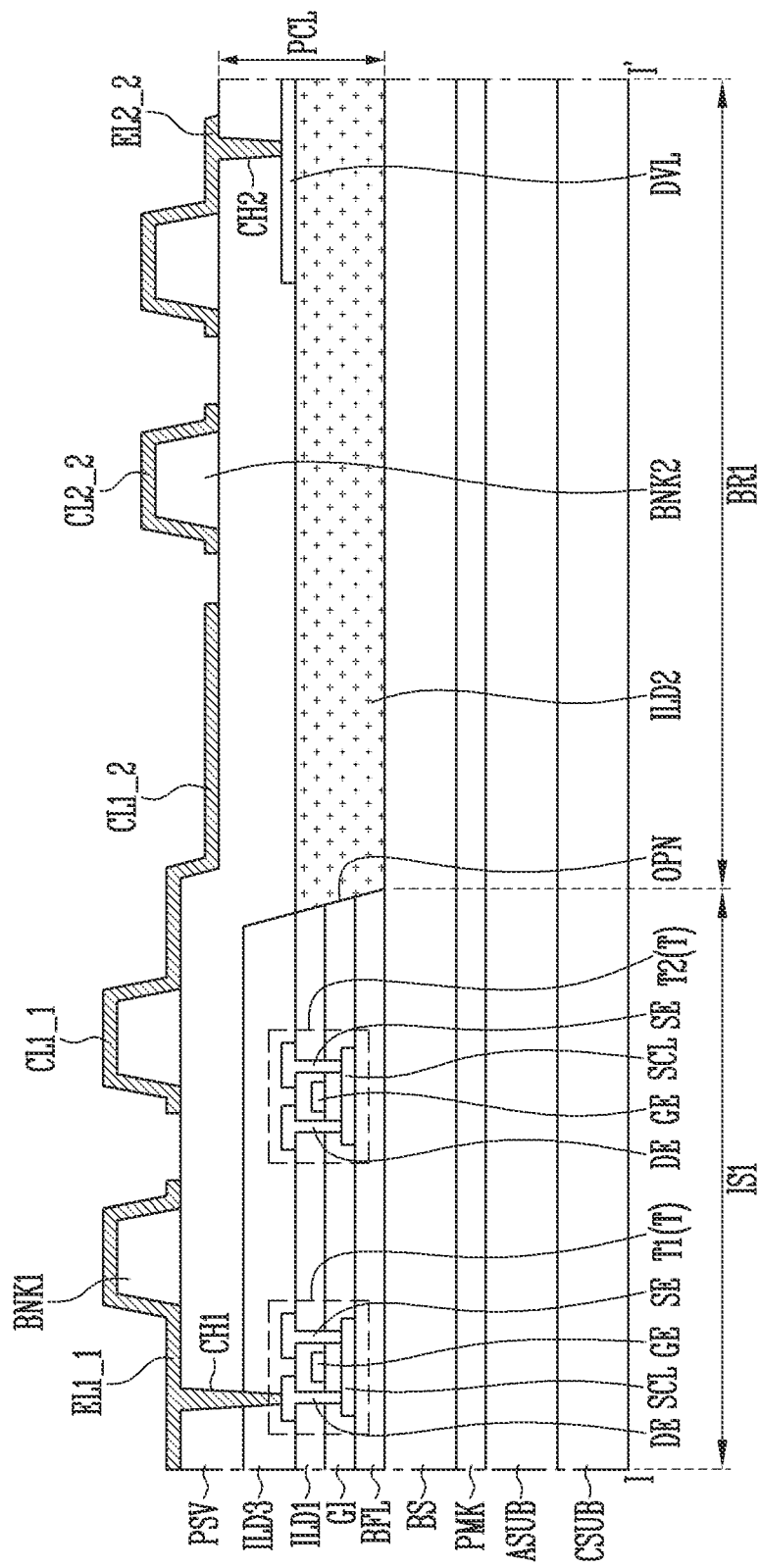
Figure 17D:
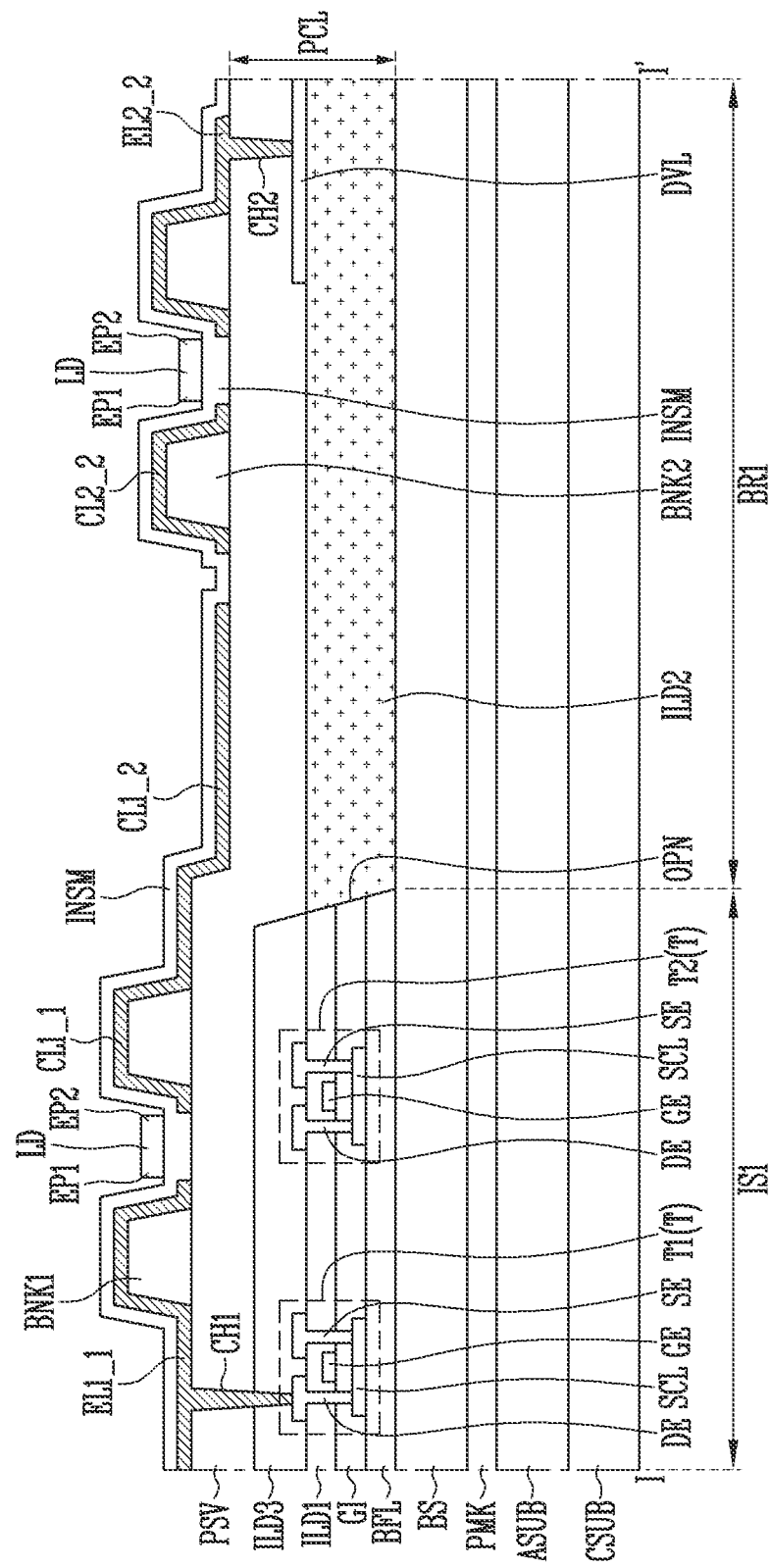
Figure 17E:
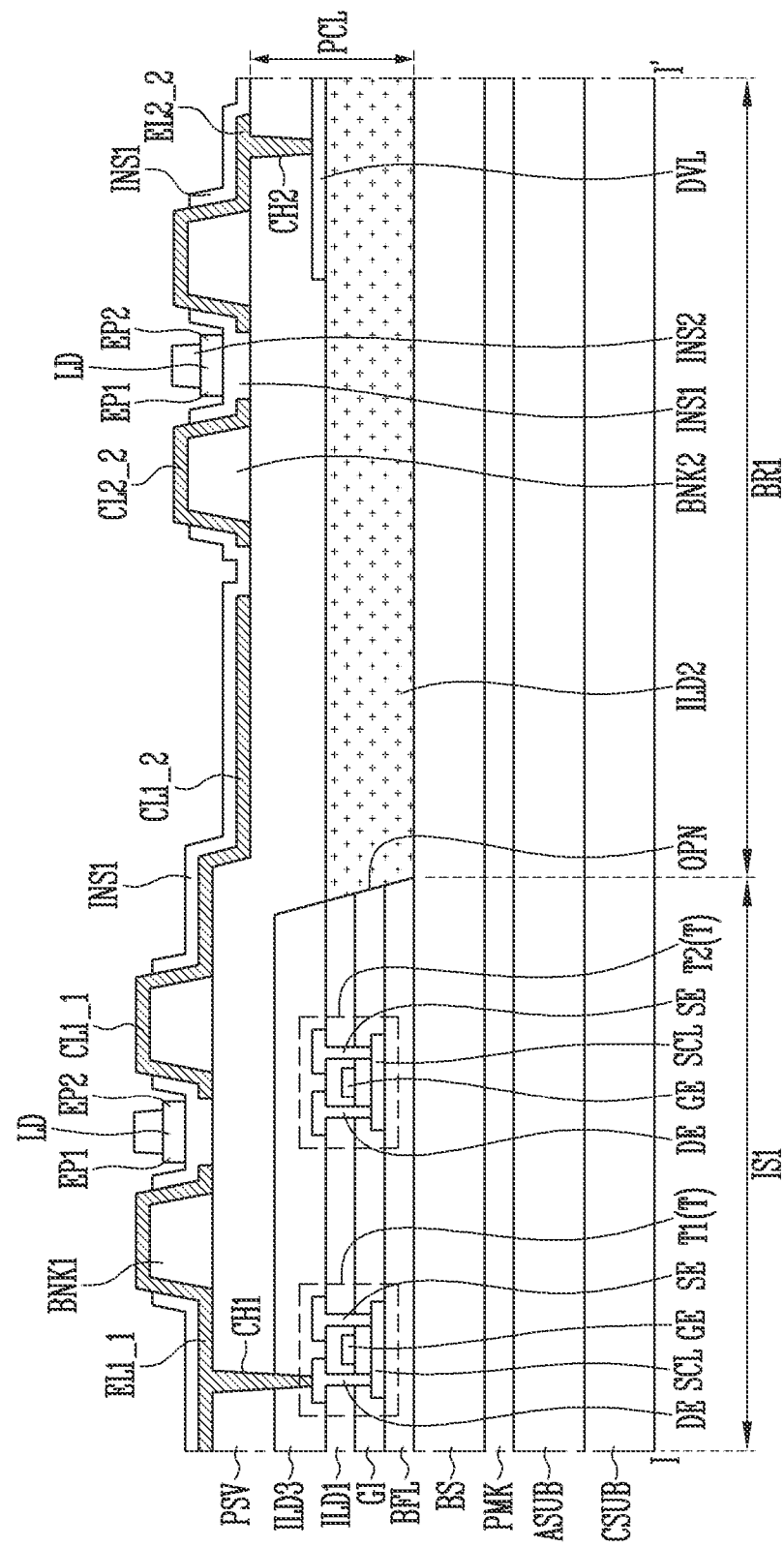
Figure 17F:
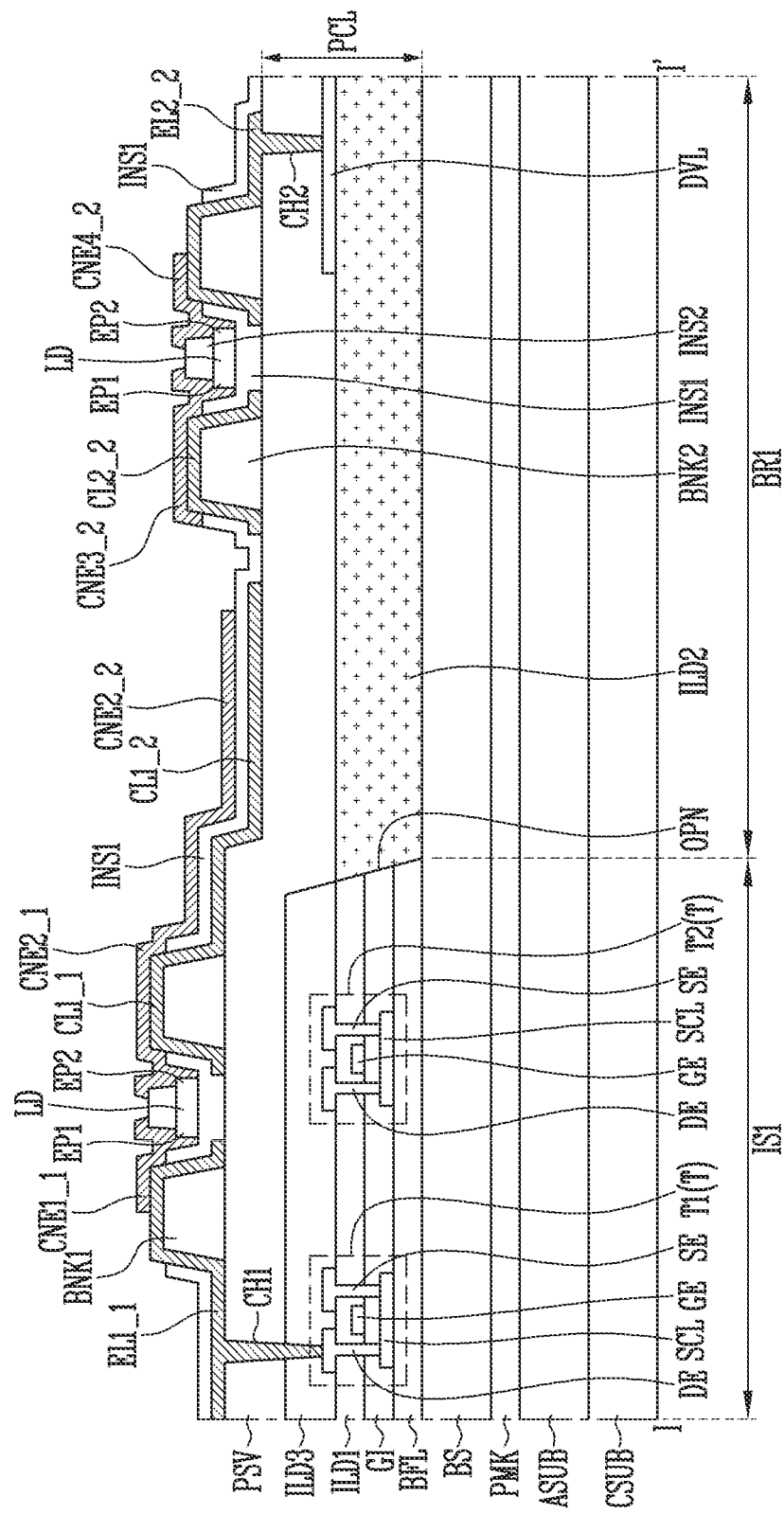
Figure 17G:
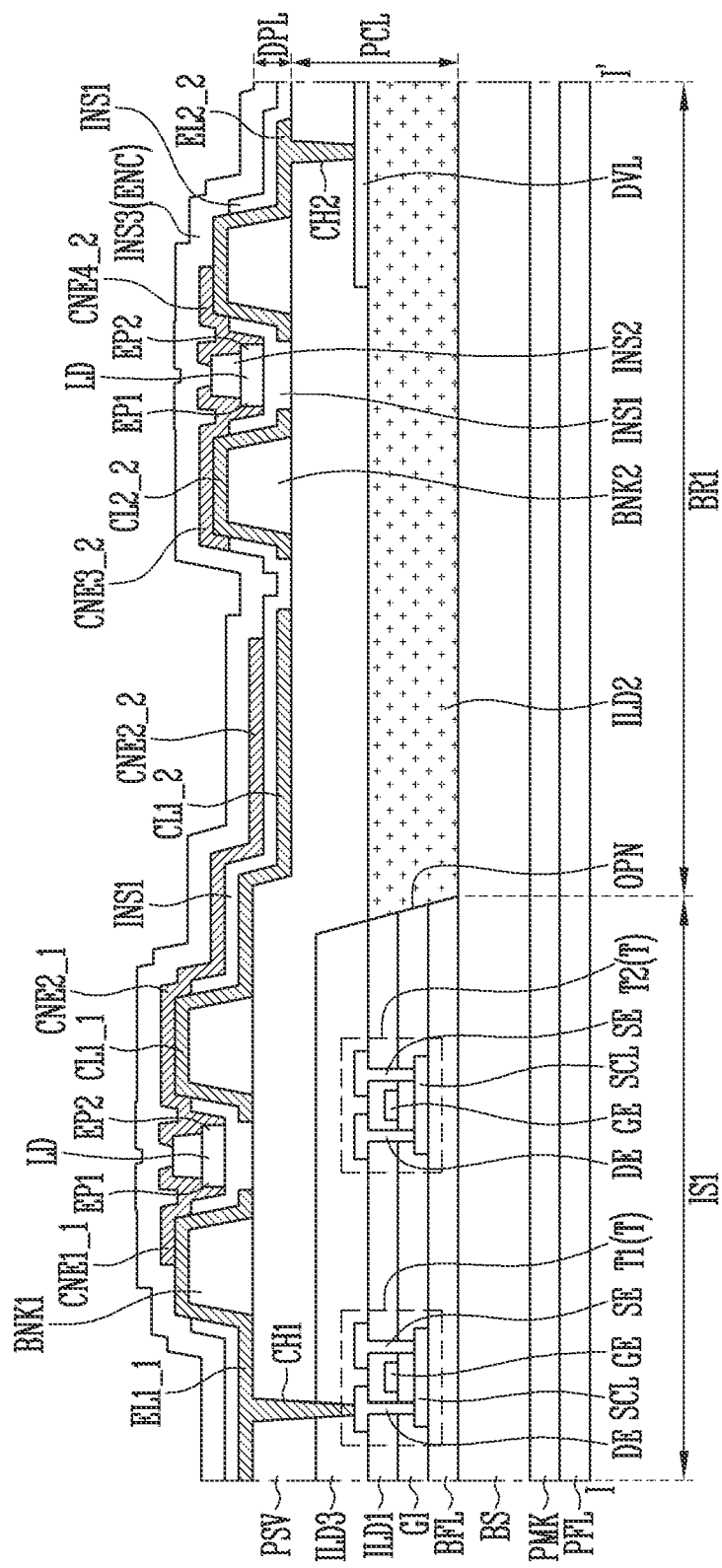

FIG. 8 is a plan view schematically illustrating one of the pixels shown in FIG. 1. FIG. 9A is a plan view schematically illustrating a first sub-pixel of FIG. 8. FIG. 9B is an enlarged plan view of portion EA2 of FIG. 9A. FIG. 10 is a sectional view taken along the line I-I' of FIG. 9A. FIG. 11 illustrates an embodiment in which first and third contact electrodes and second and fourth contact electrodes of FIG. 10 are disposed on different layers, and is a sectional view corresponding to the line I-I' of FIG. 9A. FIG. 12 illustrates an embodiment in which capping layers are respectively disposed on first to fourth electrodes shown in FIG. 10, and is a sectional view corresponding to the line I-I' of FIG. 9A FIG. 13 is a sectional view taken along the line I-II' of FIG. 9A. FIG. 14 illustrates another shape of a first bank illustrated in FIG. 13, and is a sectional view corresponding to the line II-II' of FIG. 9A. FIG. 15 is a sectional view taken along the line III-III' of FIG. 9A.

For the sake of illustration, FIG. 8 illustrates only the first and second electrodes, the first and second sub-electrodes, light emitting elements provided between the first and second electrodes and the first and second sub-electrodes.

In FIGS. 8 and 9A, for the sake of explanation, illustration of transistors connected to the light emitting elements and signal lines connected to the transistors is omitted.

The first sub-pixel illustrated in FIG. 9A may be any one of the sub-pixels illustrated in each of FIGS. 7A to 7D. For example, the sub-pixel illustrated FIG. 9A may be the sub-pixel illustrated in FIG. 7A.

Although FIGS. 8 to 15 simply illustrate the structure of a pixel PXL, e.g., illustrating that each electrode is formed of a single electrode layer and each insulating layer is formed of a single insulating layer, the present disclosure is not limited thereto.

In addition, in the description of embodiments of the present disclosure, "components are provided and/or formed on (or at) the same layer" may mean that the components are formed through the same process, and "components are provided and/or formed on different layers" may mean that the components are formed through different processes.

Referring to FIGS. 1 to 7A and 8 to 15, the display device in accordance with one or more embodiments of the present disclosure may include a base layer BS, a line component, and at least one pixel PXL.

In one or more embodiments of the present disclosure, the base layer BS may be a stretchable substrate formed of material having flexibility so as to be bendable or foldable, and may have a single- or multi-layer structure. For example, the base layer BS may include polymer material such as silicon elastomer, or polyurethane, but the present disclosure is not limited thereto.

The pixel PXL may include first to fourth sub-pixels SP1 to SP4 provided in the base layer BS.

The first sub-pixel SP1 may be a sub-pixel disposed in a first pixel row R1 and a first pixel column C1. The second sub-pixel SP2 may be a sub-pixel disposed in the first pixel row R1 and a second pixel column C2. The third sub-pixel SP3 may be a sub-pixel disposed in a second pixel row R2 and the first pixel column C1. The fourth sub-pixel SP4 may be a sub-pixel disposed in the second pixel row R2 and the second pixel column C2.

In one or more embodiments of the present disclosure, the first sub-pixel SP1 may be a red sub-pixel. Each of the second and third sub-pixels SP2 and SP3 may be a green sub-pixel. The fourth sub-pixel SP4 may be a blue sub-pixel. However, the present disclosure is not limited thereto.

Each of the first to fourth sub-pixels SP1 to SP4 may include one island IS and at least one bridge BR connected to the island IS. For example, the first sub-pixel SP1 may include a first island IS1 and a bridge BR connected to the first island IS1. The second sub-pixel SP2 may include a second island IS2 and a bridge BR connected to the second island IS2. The third sub-pixel SP3 may include a third island IS3 and a bridge BR connected to the third island IS3. The fourth sub-pixel SP4 may include a fourth island IS4 and a bridge BR connected to the fourth island IS4.

In one or more embodiments of the present disclosure, the bridge BR may include first to fourth bridges BR1 to BR4 respectively connected to four sides of the corresponding island IS of the corresponding sub-pixel. For example, the first bridge BR1 of the first sub-pixel SP1 may be connected to a first side S1 of the first island IS1 included in the first sub-pixel SP1. The second bridge BR2 of the first sub-pixel SP1 may be connected to a second side S2 of the first island IS1. The third bridge BR3 of the first sub-pixel SP1 may be connected to a third side S3 of the first island IS1. The fourth bridge BR4 of the first sub-pixel SP1 may be connected to a fourth side S4 of the first island IS1.

The first and third bridges BR1 and BR3 of each of the first to fourth sub-pixels SP1 to SP4 may be one area of the base layer BS that extends in the first direction DR1 in a plan view, and connect two sub-pixels adjacent (e.g., next) to each other in the first direction DR1 (or 'row direction'). For example, the first bridge BR1 of the first sub-pixel SP1 and the first bridge BR1 of the second sub-pixel SP2 that is disposed in the same row as that of the first sub-pixel SP1 may be integrally provided and connected with each other. Likewise, the first bridge BR1 of the third sub-pixel SP3 and the first bridge BR1 of the fourth sub-pixel SP4 that is disposed in the same row as that of the third sub-pixel SP3 may be integrally provided and connected with each other.

The second and fourth bridges BR2 and BR4 of each of the first to fourth sub-pixels SP1 to SP4 may be one area of the base layer BS that extends in the second direction DR2 in a plan view, and connect two sub-pixels adjacent (e.g., next) to each other in the second direction DR2 (or 'column direction'). For example, the fourth bridge BR4 of the first sub-pixel SP1 and the fourth bridge BR4 of the third sub-pixel SP3 that is disposed in the same column as that of the first sub-pixel SP1 may be integrally provided and connected with each other. Furthermore, the fourth bridge BR4 of the second sub-pixel SP2 and the fourth bridge BR4 of the fourth sub-pixel SP4 that is disposed in the same column as that of the second sub-pixel SP2 may be integrally provided and connected with each other.

In one or more embodiments of the present disclosure, a second virtual line VL2 extending in the second direction DR2 may be provided between the first sub-pixel SP1 and the second sub-pixel SP2 and between the third sub-pixel SP3 and the fourth sub-pixel SP4. Furthermore, a first virtual line VL1 extending in the first direction DR1 may be provided between the first sub-pixel SP1 and the third sub-pixel SP3 and between the second sub-pixel SP2 and the fourth sub-pixel SP4.

The first sub-pixel SP1 and the second sub-pixel SP2 may be mirror-symmetrical with respect to the second virtual line VL2. The first sub-pixel SP1 and the third sub-pixel SP3 may be mirror-symmetrical with respect to the first virtual line VL1. The second sub-pixel SP2 and the fourth sub-pixel SP4 may be mirror-symmetrical with respect to the first virtual line V1. The third sub-pixel SP3 and the fourth sub-pixel SP4 may be mirror-symmetrical with respect to the second virtual line VL2.

The slit V may be provided (or located) between the first island IS1 of the first sub-pixel SP1 and the second island IS2 of the second sub-pixel SP2, between the first island IS1 of the first sub-pixel SP1 and the third island IS3 of the third sub-pixel SP3, between the second island IS2 of the second sub-pixel SP2 and the fourth island IS4 of the fourth sub-pixel SP4, and between the third island IS3 and the fourth island IS4. Furthermore, the slit V may be provided (or located) between the fourth bridge BR4 of the first sub-pixel SP1 and the fourth bridge BR4 of the second sub-pixel SP2 and between the fourth bridge BR4 of the third sub-pixel SP3 and the fourth bridge BR4 of the fourth sub-pixel SP4.

Furthermore, the slit V may be provided (or located) between the third bridge BR3 of the first sub-pixel SP1 and the third bridge BR3 of the third sub-pixel SP3 and between the third bridge BR3 of the second sub-pixel SP2 and the third bridge BR3 of the fourth sub-pixel SP4.

In one or more embodiments of the present disclosure, the slit V may be formed to pass through the base layer BS, and provide a spacing area between the first to fourth islands IS1 to IS4 included in the first to fourth sub-pixels SP1 to SP4.

Each of the first to fourth sub-pixels SP1 to SP4 may include an emission area EMA configured to emit light, and a peripheral area which encloses a perimeter of the emission area EMA. Here, the term "peripheral area" may include a non-emission area from which no light is emitted.

The emission area EMA of each of the first to fourth sub-pixels SP1 to SP4 may include a first emission area MEMA and a second emission area SEMA. The emission area EMA of each of the first to fourth sub-pixels SP1 to SP4 may include a base layer BS, a pixel circuit layer PCL provided on the base layer BS, and a display element layer DPL provided on the pixel circuit layer PCL.

The display element layer DPL may include first and second electrodes EL1 and EL2, first and second sub-electrodes CL1 and CL2, a plurality of light emitting elements LD, and first to fourth contact electrodes CNE1 to CNE4.

In one or more embodiments of the present disclosure, the first emission area MEMA may be provided in the island IS of the corresponding sub-pixel. The second emission area SEMA may be provided in at least one or more bridges BR of the bridges BR of the corresponding sub-pixel. For example, the first emission area MEMA of the first sub-pixel SP1 may be provided in the first island IS1 of the first sub-pixel SP1. The second emission area SEMA of the first sub-pixel SP1 may be provided in each of the first and third bridges BR1 and BR3 of the first sub-pixel SP1. The second and fourth bridges BR2 and BR4 of the first sub-pixel SP1 may include a non-emission area from which no light is emitted. However, the present disclosure is not limited thereto. In one or more embodiments, the display element layer DPL may be provided in each of the second and fourth bridges BR2 and BR4 so that the second and fourth bridges BR2 and BR4 may also include the second emission area SEMA from which light may be emitted.

In one or more embodiments of the present disclosure, a pixel area of each of the first to fourth sub-pixels SP1 to SP4 may include an emission area EMA and a peripheral area of the corresponding sub-pixel.

For the sake of explanation, components formed and/or provided in the island IS of each of the first to fourth sub-pixels SP1 to SP4 will be first described, and then components formed and/or provided in the bridge BR of each of the first to fourth sub-pixels SP1 to SP4 will be described.

The island IS of each of the first to fourth sub-pixels SP1 to SP4 may include the first emission area MEMA and a peripheral area which encloses the first emission area MEMA. The pixel circuit layer PCL and the display element layer DPL may be provided in the island IS of each of the first to fourth sub-pixels SP1 to SP4. In one or more embodiments of the present disclosure, the island IS of each of the first to fourth sub-pixels SP1 to SP4 may refer to one area of the base layer BS that has an island shape.

The pixel circuit layer PCL of each of the first to fourth sub-pixels SP1 to SP4 may include a buffer layer BFL disposed on the base layer BS, at least one transistor T disposed on the buffer layer BFL, and a passivation layer PSV.

The buffer layer BFL may prevent impurities from diffusing into the transistor T. The buffer layer BFL may be provided in a single layer structure or a multilayer structure having at least two or more layers. In the case where the buffer layer BFL has a multilayer structure, the respective layers may be formed of an identical material or different materials. The buffer layer BFL may be omitted depending on the material of the base layer BS and/or processing conditions.

The transistor T may include a first transistor T1 (T) and a second transistor T2 (T). In one or more embodiments of the present disclosure, the first transistor T1 (T) may be a driving transistor electrically connected to light emitting elements LD of the corresponding sub-pixel and configured to drive the light emitting elements LD. The second transistor T2 (T) may be a switching transistor configured to switch the first transistor T1 (T).

Each of the first transistor T1 (T) and the second transistor T2 (T) may include a transistor semiconductor layer SCL, a gate electrode GE, a first terminal SE, and a second terminal DE. The first terminal SE may be either a source electrode or a drain electrode, and the second terminal DE may be the other electrode of the source or drain electrode. For example, in case that the first terminal SE is a source electrode, the second terminal DE may be a drain electrode.

The transistor semiconductor layer SCL may be disposed on the buffer layer BFL. The transistor semiconductor layer SCL may include a first area which contacts the first terminal SE, and a second area which contacts the second terminal DE. An area between the first area and the second area may be a channel area.

The transistor semiconductor layer SCL may be a semiconductor pattern formed of polysilicon, amorphous silicon, an oxide semiconductor, etc. The channel area may be an intrinsic semiconductor, which is an undoped semiconductor pattern. The first area and the second area each may be a semiconductor pattern doped with impurities.

The gate electrode GE may be provided on the transistor semiconductor layer SCL with the gate insulating layer GI interposed therebetween. The gate insulating layer GI may be an inorganic insulating layer including inorganic material.

In one or more embodiments, the first terminal SE and the second terminal DE may be on the first interlayer insulating layer ILD1. The first terminal SE and the second terminal DE may respectively contact the first area and the second area of the transistor semiconductor layer SCL through corresponding contact holes that pass through a first interlayer insulating layer ILD1 and the gate insulating layer GI. The first interlayer insulating layer ILD1 may be an inorganic insulating layer including inorganic material. In one or more embodiments, the first interlayer insulating layer ILD1 may cover the gate elec.

Although in the foregoing embodiment there has been described that the first and second terminals SE and DE of each of the first transistor T1 (T) and the second transistor T2 (T) are separate electrodes electrically connected with the transistor semiconductor layer SCL, the present disclosure is not limited thereto. In one or more embodiments, the first terminal SE of each of the first transistor T1 (T) and the second transistor T2 (T) may be one area of the first and second areas adjacent to the channel area of each transistor semiconductor layer SCL. The second terminal DE of each of the first transistor T1 (T) and the second transistor T2 (T) may be the other area of the first and second areas adjacent to the channel area of each transistor semiconductor layer SCL. In this case, the second terminal DE of the first transistor T1(T) may be electrically connected to the emission unit EMU of each of the first to fourth sub-pixels SP1 to SP4 through a bridge electrode, a contact electrode, or the like.

In one or more embodiments of the present disclosure, at least one transistor T included in the pixel circuit layer PCL of each of the first to fourth sub-pixels SP1 to SP4 may be formed of an LTPS thin-film transistor, but the present disclosure is not limited thereto. In one or more embodiments, the at least one transistor T may be formed of an oxide semiconductor thin-film transistor. Furthermore, in one or more embodiments, the pixel circuit layer PCL of each of the first to fourth sub-pixels SP1 to SP4 may include at least one transistor T formed of an LTPS thin-film transistor, and at least one transistor T formed of an oxide semiconductor thin-film transistor. In addition, in one or more embodiments of the present disclosure, there has been illustrated the case where the transistor T is a thin film transistor having a top gate structure, but the present disclosure is not limited thereto. In one or more embodiments, the transistor T may be a thin film transistor having a bottom gate structure.

A third interlayer insulating layer ILD3 may be provided on the transistor T (e.g., on the first terminal SE and the second terminal DE). The third interlayer insulating layer ILD3 may be an inorganic insulating layer including inorganic material, but the present disclosure is not limited thereto. The third interlayer insulating layer ILD3 may be omitted depending on embodiments.

The passivation layer PSV may be provided on the third interlayer insulating layer ILD3. The passivation layer PSV may be provided and/or formed on the transistor T and cover the transistor T. The passivation layer PSV may be provided in the form of an organic insulating layer, an inorganic insulating layer, or a structure including the organic insulating layer disposed on the inorganic insulating layer. The inorganic insulating layer may include at least one of silicon oxide ($SiO_x$) and silicon nitride ($SiN_x$). The organic insulating layer may include organic insulating material allowing light to pass therethrough. The organic insulating layer may include, for example, at least one of polyacrylates resin, epoxy resin, phenolic resin, polyamides resin, polyimides rein, unsaturated polyesters resin, poly-phenylen ethers resin, poly-phenylene sulfides resin, and benzocyclobutene resin.

Next, the display element layer DPL included in the island IS of each of the first to fourth sub-pixels SP1 to SP4 will be described. In one or more embodiments of the present disclosure, some components of the display element layer DPL of each of the first to fourth sub-pixels SP1 to SP4 may be disposed in a peripheral area of the island IS of the corresponding sub-pixel, and the other components may be disposed in the first emission area MEMA of the island IS.

The display element layer DPL included in the island IS of each of the first to fourth sub-pixels SP1 to SP4 may include a first bank BNK1, a 1-1-th electrode EL1_1, a 2-1-th electrode EL2_1, a 1-1-th sub-electrode CL1_1, a 2-1-th sub-electrode CL2_1, and a plurality of light emitting elements LD. In one or more embodiments of the present disclosure, the display element layer DPL included in the island IS of each of the first to fourth sub-pixels SP1 to SP4 may have a substantially similar or identical structure. Hence, for the sake of explanation, the description of the display element layer DPL included in the first island IS1 of the first sub-pixel SP1 will substitute for description of the display element layer DPL included in the island IS of each of the first to fourth sub-pixels SP1 to SP4.

At least one first bank BNK1 may be disposed in the first emission area MEMA of the first sub-pixel SP1.

The first bank BNK1 may be provided and/or formed each between the passivation layer PSV and the 1-1-th electrode EL1_1, between the passivation layer PSV and the 2-1-th electrode EL2_1, between the passivation layer PSV and the 1-1-th sub-electrode CL1_1, and between the passivation layer PSV and the 2-1-th sub-electrode CL2_1 (e.g., see, FIG. 13), in the first emission area MEMA provided in the first island IS1.

The first bank BNK1 may be a support or an insulating pattern which supports each of the 1-1-th and 2-1-th electrodes EL1_1 and EL2_1 and the 1-1-th and 2-1-th sub-electrodes CL1_1 and CL2_1 so as to change a surface profile of each of the 1-1-th and 2-1-th electrodes EL1_1 and EL2_1 and the 1-1-th and 2-1-th sub-electrodes CL1_1 and CL2_1 so that light emitted from the light emitting elements LD can more reliably travel in an image display direction (e.g., a thickness direction of the base layer BS or a third direction DR3) of the display device.

The first bank BNK1 may be formed of an inorganic insulating layer including inorganic material, or an organic insulating layer including organic material. In one or more embodiments, the first bank BNK1 may include an organic insulating layer having a single layer structure and/or an inorganic insulating layer having a single layer structure, but the present disclosure is not limited thereto. In one or more embodiments, the first bank BNK1 may be provided in the form of a multilayer structure formed by stacking at least one organic insulating layer and at least one inorganic insulating layer.

The first bank BNK1 may have a trapezoidal cross-section in which the width thereof is reduced from one surface of the passivation layer PSV upward, but the present disclosure is not limited thereto. In one or more embodiments, the first bank BNK1 may include a curved surface having a cross-section having a semi-elliptical shape, a semi-circular shape, etc., which is reduced in width upward from one surface of the passivation layer PSV, as illustrated in FIG. 14. In a cross-sectional view, the shape of the first bank BNK1 is not limited to the foregoing examples, and may be changed in various ways within a range in which the efficiency of light emitted from each of the light emitting elements LD can be enhanced. First banks BNK1 adjacent to each other may be disposed at the same plane on the passivation layer PSV and have the same height.

The display element layer DPL of the first sub-pixel SP1 may further include a third bank disposed in the peripheral area of the first sub-pixel SP1. The third bank may be a structure that defines the first emission area MEMA of each of the first sub-pixel SP1 and the sub-pixels (e.g., the second sub-pixel SP2 or the third sub-pixel SP3) adjacent thereto, and may be, for example, a pixel defining layer. The third bank may include at least one light shielding material and/or reflective material, thus preventing a light leakage defect in which light (or rays) leaks between the first sub-pixel SP1 and the sub-pixels adjacent thereto. In one or more embodiments, a reflective material layer may be formed and/or provided on the third bank to further enhance the efficiency of light emitted from each first sub-pixel SP1. Although the third bank may be formed and/or provided on a layer different from that of the first bank BNK1, the present disclosure is not limited thereto. In one or more embodiments, the third bank may be formed and/or provided at the same layer as that of the first bank BNK1. Furthermore, the third bank disposed in the peripheral area of the first sub-pixel SP1 may have a height different from the first bank BNK1 disposed in the first emission area MEMA of the first sub-pixel SP1.

In one or more embodiments of the present disclosure, the first emission area MEMA of the first sub-pixel SP1 may have a shape corresponding to the first island IS1 that is one area of the base layer BS having an island shape in a plan view, but the present disclosure is not limited thereto. In one or more embodiments, the first emission area MEMA of the first sub-pixel SP1 may not correspond to the shape of the first island IS1 in a plan view, and may have a shape different from the shape of the first island IS1.

The 1-1-th and 2-1-th electrodes EL1_1 and EL2_1 may be disposed at positions spaced from each other in the first emission area MEMA of the first sub-pixel SP1. The 1-1-th sub-electrode CL1_1 and the 2-1-th sub-electrode CL2_1 may be disposed between the 1-1-th electrode EL1_1 and the 2-1-th electrode EL2_1. For example, the 1-1-th sub-electrode CL1_1 may be disposed between the 1-1-th electrode EL1_1 and the 2-1-th sub-electrode CL2_1. The 2-1-th sub-electrode CL2_1 may be disposed between the 1-1-th sub-electrode CL1_1 and the 2-1-th electrode EL2_1. In a plan view, the 1-1-th electrode EL1_1, the 1-1-th sub-electrode CL1_1, the 2-1-th sub-electrode CL2_1, and the 2-1-th electrode EL2_1 may be disposed at positions spaced from each other.

In one or more embodiments of the present disclosure, the 1-1-th electrode EL1_1 and the 1-1-th sub-electrode CL1_1 may be spaced from each other (e.g., spaced from each other by a predetermined distance). The 1-1-th sub-electrode CL1_1 and the 2-1-th sub-electrode CL2_1 may be spaced from each other (e.g., spaced from each other by a predetermined distance). The 2-1-th sub-electrode CL2_1 and the 2-1-th electrode EL2_1 may be spaced from each other (e.g., spaced from each other by a predetermined distance). In the first emission area MEMA of the first sub-pixel SP1, space between the 1-1-th electrode EL1_1 and the 1-1-th sub-electrode CL1_1, space between the 1-1-th sub-electrode CL1_1 and the 2-1-th sub-electrode CL2_1, and space between the 2-1-th sub-electrode CL2_1 and the 2-1-th electrode EL2_1 may have an identical (or uniform) distance. Therefore, the light emitting elements LD may be more uniformly aligned in the first emission area MEMA of the first sub-pixel SP1. Here, the present disclosure is not limited thereto. In one or more embodiments, the space between the 1-1-th electrode EL1_1 and the 1-1-th sub-electrode CL1_1, the space between the 1-1-th sub-electrode CL1_1 and the 2-1-th sub-electrode CL2_1, and the space between the 2-1-th sub-electrode CL2_1 and the 2-1-th electrode EL2_1 may have different distances.

The 1-1-th electrode EL1_1, the 1-1-th sub-electrode CL1_1, the 2-1-th sub-electrode CL2_1, and the 2-1-th electrode EL2_1 each may be disposed on the first bank BNK1 and have a surface profile corresponding to the shape of the first bank BNK1. For example, each of the 1-1-th and 2-1-th electrodes EL1_1 and EL2_1 and the 1-1-th and 2-1-th sub-electrodes CL1_1 and CL2_1 may have a protrusion portion corresponding to the first bank BNK1 and a planar portion corresponding to the passivation layer PSV. The 1-1-th electrode EL1_1, the 1-1-th sub-electrode CL1_1, the 2-1-th sub-electrode CL2_1, and the 2-1-th electrode EL2_1 may be made of material having a suitable reflectivity (e.g., a set or predetermined reflectivity) to allow light emitted from the opposite ends EP1 and EP2 of each of the light emitting elements LD to travel in the image display direction (e.g., in a frontal direction) of the display device.

Each of the 1-1-th electrode EL1_1, the 1-1-th sub-electrode CL1_1, the 2-1-th sub-electrode CL2_1, and the 2-1-th electrode EL2_1 may be formed of conductive material having a suitable reflectivity (e.g., a set or predetermined reflectivity). The conductive material may include opaque metal that is suitable for in reflecting, in the image display direction of the display device, light emitted from the light emitting elements LD. The opaque metal may include metal, for example, Ag, Mg, Al, Pt, Pd, Au, Ni, Nd, Ir, Cr, Ti, and an alloy thereof. In one or more embodiments, each of the 1-1-th electrode EL1_1, the 1-1-th sub-electrode CL1_1, the 2-1-th sub-electrode CL2_1, and the 2-1-th electrode EL2_1 may include transparent conductive material. The transparent conductive material may include conductive oxide such as indium tin oxide (ITO), indium zinc oxide (IZO), zinc oxide (ZnO), or indium tin zinc oxide (ITZO), or a conductive polymer such as PEDOT. In the case where each of the 1-1-th electrode EL1_1, the 1-1-th sub-electrode CL1_1, the 2-1-th sub-electrode CL2_1, and the 2-1-th electrode EL2_1 includes transparent conductive material, a separate conductive layer made of opaque metal to reflect light emitted from the light emitting elements LD in the image display direction of the display device may be further included therein. However, the material for each of the 1-1-th electrode EL1_1, the 1-1-th sub-electrode CL1_1, the 2-1-th sub-electrode CL2_1, and the 2-1-th electrode EL2_1 is not limited to the foregoing materials.

Furthermore, although each of the 1-1-th electrode EL1_1, the 1-1-th sub-electrode CL1_1, the 2-1-th sub-electrode CL2_1, and the 2-1-th electrode EL2_1 is formed of a single layer, the present disclosure is not limited thereto. In one or more embodiments, each of the 1-1-th electrode EL1_1, the 1-1-th sub-electrode CL1_1, the 2-1-th sub-electrode CL2_1, and the 2-1-th electrode EL2_1 may be formed in a multilayer structure formed by stacking two or more materials among metals, alloys, conductive oxides, and conductive polymers. Each of the 1-1-th electrode EL1_1, the 1-1-th sub-electrode CL1_1, the 2-1-th sub-electrode CL2_1, and the 2-1-th electrode EL2_1 may be formed of a multilayer structure having at least two or more layers so as to minimize distortion which may occur due to a signal delay when signals (or voltages) are transmitted to the opposite ends EP1 and EP2 of each of the light emitting elements LD. For example, each of the 1-1-th electrode EL1_1, the 1-1-th sub-electrode CL1_1, the 2-1-th sub-electrode CL2_1, and the 2-1-th electrode EL2_1 may have a multilayer structure in which layers are stacked in a sequence of ITO/Ag/ITO.

As described above, the 1-1-th electrode EL1_1, the 1-1-th sub-electrode CL1_1, the 2-1-th sub-electrode CL2_1, and the 2-1-th electrode EL2_1 each may have a surface profile corresponding to the shape of the first bank BNK1 disposed thereunder. Hence, light emitted from the opposite ends EP1 and EP2 of each of the light emitting elements LD may be reflected by the 1-1-th electrode EL1_1, the 1-1-th sub-electrode CL11, the 2-1-th sub-electrode CL2_1, and the 2-1-th electrode EL2_1 and more reliably travel in the image display direction of the display device. Consequently, the output efficiency of light emitted from each of the light emitting elements LD may be further enhanced.

In one or more embodiments of the present disclosure, the first bank BNK1, the 1-1-th electrode EL1_1, the 1-1-th sub-electrode CL1_1, the 2-1-th sub-electrode CL2_1, and the 2-1-th electrode EL2_1 each may function as a reflector that guides light emitted from the light emitting elements LD in a desired direction, thus enhancing the light efficiency of the display device. In other words, the first bank BNK1, the 1-1-th electrode EL1_1, the 1-1-th sub-electrode CL1_1, the 2-1-th sub-electrode CL2_1, and the 2-1-th electrode EL2_1 each may function as a reflector that allows light emitted from the light emitting elements LD to travel in the image display direction of the display device, thus enhancing the light output efficiency of the light emitting elements LD.

In the first emission area MEMA, a plurality of light emitting elements LD may be aligned and/or provided each between the 1-1-th electrode EL1_1 and the 1-1-th sub-electrode CL1_1, between the 1-1-th sub-electrode CL1_1 and the 2-1-th sub-electrode CL2_1, and between the 2-1-th sub-electrode CL2_1 and the 2-1-th electrode EL2_1. In the first emission area MEMA, the light emitting elements LD that are aligned and/or provided each between the 1-1-th electrode EL1_1 and the 1-1-th sub-electrode CL1_1, between the 1-1-th sub-electrode CL1_1 and the 2-1-th sub-electrode CL2_1, and between the 2-1-th sub-electrode CL2_1 and the 2-1-th electrode EL2_1 may form the emission unit EMU of the first sub-pixel SP1.

The 1-1-th electrode EL1_1 included in the emission unit EMU of the first sub-pixel SP1 may be an anode electrode of the emission unit EMU, and the 2-1-th electrode EL2_1 may be a cathode electrode of the emission unit EMU.

The 1-1-th electrode EL1_1 may be electrically connected with the pixel circuit layer PCL of the first sub-pixel SP1 through a first contact hole CH1. For example, the 1-1-th electrode EL1_1 may be electrically connected with the pixel circuit layer PCL of the first sub-pixel SP1 through the first contact hole CH1 in the first emission area MEMA of the first sub-pixel SP1. The 1-1-th electrode EL1_1 may be electrically connected with the second terminal DE of the first transistor T1 (T) of the pixel circuit layer PCL of the first sub-pixel SP1 through the first contact hole CH1. Hence, a signal (or a voltage) applied to the first transistor T1 (T) may be transmitted to the 1-1-th electrode EL1_1.

The 2-1-th electrode EL2_1 may be electrically and/or physically connected with the 2-2-th electrode EL2_2 provided in the first bridge BR1 (e.g., see FIG. 9A) and may be supplied with a voltage of the second driving power supply VSS from the 2-2-th electrode EL2_2. In one or more embodiments, the 2-2-th electrode EL2_2 provided in the first bridge BR1 may be electrically connected with the pixel circuit layer PCL of the first sub-pixel SP1 through the second contact hole CH2 in the second emission area SEMA of the first sub-pixel SP1. For example, the 2-2-th electrode EL2_2 may be electrically connected with a driving voltage line DVL of the pixel circuit layer PCL of the first sub-pixel SP1 through the second contact hole CH2. Detailed description of connection relationship between the 2-1-th electrode EL2_1 and the 2-2-th electrode EL2_2 may be made below in relation to description of the bridge BR of the first sub-pixel SP1.

In the foregoing embodiment, each of the light emitting elements LD may be formed of a light emitting element which is made of material having an inorganic crystal structure and has a subminiature size, e.g., ranging from the nanometer scale to the micrometer scale. For example, each of the light emitting elements LD may be a subminiature light emitting element having a size ranging from the nanometer scale to the micrometer scale, as illustrated in FIGS. 3A to 6B. The size, the type, the shape, etc. of the light emitting elements LD may be changed in various ways. Although at least two or tens of light emitting elements LD are aligned in the first emission area MEMA of the first sub-pixel SP1, the present disclosure is not limited thereto. In one or more embodiments, the number of light emitting elements LD provided and/or aligned in the first emission area MEMA of the first sub-pixel SP1 may be changed in various ways.

The light emitting elements LD may be provided in a diffused form in a solution and then supplied to the first emission area MEMA of the first sub-pixel SP1. In one or more embodiments of the present disclosure, the light emitting elements LD may be supplied to the first emission area MEMA of the first sub-pixel SP1 by an inkjet printing scheme, a slit coating scheme, or other various schemes. For example, the light emitting elements LD may be mixed with a volatile solvent and then supplied to the first emission area MEMA of the first sub-pixel SP1 by an inkjet printing scheme or a slit coating scheme. Here, if corresponding alignment signals (or alignment voltages) are respectively applied to the 1-1-th electrode EL1_1, the 1-1-th sub-electrode CL1_1, the 2-1-th sub-electrode CL2_1, and the 2-1-th electrode EL2_1 that are disposed in the first emission area MEMA of the first sub-pixel SP1, an electric field may be formed each between the 1-1-th electrode EL1_1 and the 1-1-th sub-electrode CL1_1, between the 1-1-th sub-electrode CL1_1 and the 2-1-th sub-electrode CL2_1, and between the 2-1-th sub-electrode CL2_1 and the 2-1-th electrode EL2_1. Consequently, the light emitting elements LD may be aligned each between the 1-1-th electrode EL1_1 and the 1-1-th sub-electrode CL1_1, between the 1-1-th sub-electrode CL1_1 and the 2-1-th sub-electrode CL2_1, and between the 2-1-th sub-electrode CL2_1 and the 2-1-th electrode EL2_1. After the light emitting elements LD have been aligned, the solvent may be removed by a volatilization scheme or other schemes, so that the light emitting elements LD may be ultimately aligned in the first emission area MEMA of the first sub-pixel SP1.

As described above, when the light emitting elements LD are aligned in the first emission area MEMA of the first sub-pixel SP1, the 1-1-th and 2-1-th electrodes EL1_1 and EL2_1 and the 1-1-th and 2-1-th sub-electrodes CL1_1 and CL2_1 may function as alignment electrodes (or alignment lines) for alignment of the light emitting elements LD. For example, the 1-1-th electrode EL1_1 and the 2-1-th sub-electrode CL2_1 may be first alignment electrodes to which an identical first alignment signal (or a first alignment voltage) is to be applied, and the 1-1-th sub-electrode CL1_1 and the 2-1-th electrode EL2_1 may be second alignment electrodes to which an identical second alignment signal (or a second alignment voltage) is to be applied. The first alignment signal and the second alignment signal may have different voltage levels. Here, if corresponding alignment signals are respectively applied to the 1-1-th electrode EL1_1, the 1-1-th sub-electrode CL1_1, the 2-1-th sub-electrode CL2_1, and the 2-1-th electrode EL2_1, an electric field may be formed each between the 1-1-th electrode EL1_1 and the 1-1-th sub-electrode CL1_1, between the 1-1-th sub-electrode CL1_1 and the 2-1-th sub-electrode CL2_1, and between the 2-1-th sub-electrode CL2_1 and the 2-1-th electrode EL2_1. The light emitting elements LD may be aligned in the first emission area MEMA of the first sub-pixel SP1 by the electric fields that are respectively formed between the 1-1-th electrode EL1_1 and the 1-1-th sub-electrode CL1_1, between the 1-1-th sub-electrode CL1_1 and the 2-1-th sub-electrode CL2_1, and between the 2-1-th sub-electrode CL2_1 and the 2-1-th electrode EL2_1.

In one or more embodiments of the present disclosure, at the step of aligning the light emitting elements LD in the first emission area MEMA of the first sub-pixel SP1, the light emitting elements LD supplied to the first emission area MEMA may be controlled to be relatively biasedly aligned by controlling the alignment signals (or the alignment voltages) to be applied to the 1-1-th and 2-1-th electrodes EL1_1 and EL2_1 and the 1-1-th and 2-1-th sub-electrodes CL1_1 and CL2_1 or forming a magnetic field. For example, at the alignment step of the light emitting elements LD, as the waveforms of the alignment signals are adjusted or a magnetic field is formed in the first emission area MEMA, the number of light emitting elements LD oriented in the forward direction such that the first end EP1 of each of the light emitting elements LD is oriented toward the first alignment electrode and the second end EP2 thereof is oriented toward the second alignment electrode may be controlled to be greater than the number of reverse light emitting elements (refer to LDr of FIG. 7D) oriented in a direction opposite thereto.

Each of the light emitting elements LD may include a cylindrical light emitting element LD fabricated by an etching scheme, or a core-shell light emitting element LD' fabricated by a growth scheme. In case that each of the light emitting elements LD is a light emitting element fabricated by the etching scheme, each light emitting element LD may include an emission stack (or a stacked pattern) formed by successively stacking a first semiconductor layer 11, an active layer 12, a second semiconductor layer 13, and an electrode layer 15 in the longitudinal direction (L) of each light emitting element LD. In case that each of the light emitting elements LD a light emitting element having a core-shell structure, each light emitting element LD' may include a light emission pattern 10' having a first semiconductor layer 11 disposed in a central portion of the light emitting element LD', an active layer 12' which encloses at least one side of the first semiconductor layer 11', a second semiconductor layer 13' which encloses at least one side of the active layer 12', and an electrode layer 15' which encloses at least one side of the second semiconductor layer 13'.

Each of the light emitting elements LD may include a first end EP1 electrically connected to one of two electrodes spaced from each other (e.g., spaced from each other by a predetermined distance), and a second end EP2 electrically connected to the other electrode. For example, each of the light emitting elements LD aligned (or disposed) between the 1-1-th electrode EL1_1 and the 1-1-th sub-electrode CL1_1 may include a first end EP1 electrically connected to the 1-1-th electrode EL1_1, and a second end EP2 electrically connected to the 1-1-th sub-electrode CL1_1. Each of the light emitting elements LD aligned (or disposed) between the 1-1-th sub-electrode CL1_1 and the 2-1-th sub-electrode CL2_1 may include a second end EP2 electrically connected to the 1-1-th sub-electrode CL1_1, and a first end EP1 electrically connected to the 2-1-th sub-electrode CL2_1. Each of the light emitting elements LD aligned (or disposed) between the 2-1-th sub-electrode CL2_1 and the 2-1-th electrode EL2_1 may include a first end EP1 electrically connected to the 2-1-th sub-electrode CL2_1, and a second end EP2 electrically connected to the 2-1-th electrode EL2_1.

In one or more embodiments of the present disclosure, the first end EP1 of each light emitting element LD may be a second semiconductor layer 13 including a p-type semiconductor layer, and the second end EP2 thereof may be a first semiconductor layer 11 including an n-type semiconductor layer. In other words, in the first emission area MEMA of the first sub-pixel SP1, each light emitting element LD may be connected between two adjacent electrodes in a forward direction. As described above, the light emitting elements LD connected between the two adjacent electrodes in the forward direction may form valid light sources of the emission unit EMU of the first sub-pixel SP1. Although in the above-mentioned embodiment there has been described that the light emitting elements LD aligned (or disposed) between the two adjacent electrodes are connected in the forward direction, the present disclosure is not limited thereto. In one or more embodiments, some of the light emitting elements LD aligned (or disposed) between the two adjacent electrodes may be connected in a direction opposite to the forward direction. In the following embodiments, there will be described an example in which the light emitting elements LD aligned (or disposed) between the two adjacent electrodes in the first emission area MEMA of the first sub-pixel SP1 are connected in the forward direction.

The first end EP1 of each of the light emitting elements LD may be directly connected to one of the two electrodes disposed adjacent to each other with a suitable distance (e.g., a predetermined distance) therebetween, or may be connected to the one electrode through a contact electrode. Furthermore, the second end EP2 of each of the light emitting elements LD may be directly connected to the other electrode of the two adjacent electrodes, or may be connected to the electrode through another contact electrode.

In one or more embodiments of the present disclosure, the first end EP1 of each of the light emitting elements LD disposed between the 1-1-th electrode EL1_1 and the 1-1-th sub-electrode CL1_1 may be directly connected to the 1-1-th electrode EL1_1, or may be connected to a 1-1-th contact electrode CNE1_1 and thus indirectly connected to the 1-1-th electrode EL1_1. Furthermore, the second end EP2 of each of the light emitting elements LD disposed between the 1-1-th electrode EL1_1 and the 1-1-th sub-electrode CL1_1 may be directly connected to one side of the 1-1-th sub-electrode CL1_1, or may be connected to a 2-1-th contact electrode CNE2_1 and thus indirectly connected to the 1-1-th sub-electrode CL1_1.

The second end EP2 of each of the light emitting elements LD disposed between the 1-1-th sub-electrode CL1_1 and the 2-1-th sub-electrode CL2_1 may be directly connected to the other side of the 1-1-th sub-electrode CL1_1, or may be connected to the 2-1-th contact electrode CNE2_1 and thus indirectly connected to the 1-1-th sub-electrode CL1_1. Furthermore, the first end EP1 of each of the light emitting elements LD disposed between the 1-1-th sub-electrode CL1_1 and the 2-1-th sub-electrode CL2_1 may be directly connected to one side of the 2-1-th sub-electrode CL2_1, or may be connected to a 3-1-th contact electrode CNE3_1 and thus indirectly connected to the 2-1-th sub-electrode CL2_1.

The first end EP1 of each of the light emitting elements LD disposed between the 2-1-th sub-electrode CL2_1 and the 2-1-th electrode EL2_1 may be directly connected to the other side of the 2-1-th sub-electrode CL2_1, or may be connected to the 3-1-th contact electrode CNE3_1 and thus indirectly connected to the 2-1-th sub-electrode CL2_1. Furthermore, the second end EP2 of each of the light emitting elements LD disposed between the 2-1-th sub-electrode CL2_1 and the 2-1-th electrode EL2_1 may be directly connected to the 2-1-th electrode EL2_1, or may be connected to a 4-1-th contact electrode CNE4_1 and thus indirectly connected to the 2-1-th electrode EL2_1.

The light emitting elements LD may be provided and/or formed on a first insulating layer INS1 in the first emission area MEMA of the first sub-pixel SP1.

The first insulating layer INS1 may be formed and/or provided under each of the light emitting elements LD aligned between one electrode of two electrodes spaced from each other (e.g., spaced from each other by a predetermined distance) and the other electrode in the first emission area MEMA of the first sub-pixel SP1. The first insulating layer INS1 may be charged into space between the passivation layer PSV and each of the light emitting elements LD to stably support the light emitting elements LD and prevent the light emitting elements LD from being removed from the passivation layer PSV. For example, the first insulating layer INS1 may be formed and/or provided under each of the light emitting elements LD aligned between the 1-1-th electrode EL1_1 and the 1-1-th sub-electrode CL1_1. Furthermore, the first insulating layer INS1 may be formed and/or provided under each of the light emitting elements LD aligned between the 1-1-th sub-electrode CL1_1 and the 2-1-th sub-electrode CL2_1. Furthermore, the first insulating layer INS1 may be formed and/or provided under each of the light emitting elements LD aligned between the 2-1-th sub-electrode CL2_1 and the 2-1-th electrode EL2_1.

In the first emission area MEMA of the first sub-pixel SP1, the first insulating layer INS1 may expose one area of one electrode of two electrodes that are spaced from each other (e.g., spaced from each other by a predetermined distance), and cover a remaining area other than the exposed area to protect the remaining area of the one electrode. Furthermore, the first insulating layer INS1 may expose one area of the other electrode of the two electrodes that are spaced from each other (e.g., spaced from each other by the predetermined distance), and cover a remaining area other than the exposed area to protect the remaining area of the other electrode.

The first insulating layer INS1 may be formed of an inorganic insulating layer including inorganic material, or an organic insulating layer including organic material. Although in one or more embodiments of the present disclosure the first insulating layer INS1 may be formed of inorganic insulating layer for protecting the light emitting elements LD from the pixel circuit layer PCL of the first sub-pixel SP1, the present disclosure is not limited thereto. In one or more embodiments, the first insulating layer INS1 may be formed of an organic insulating layer that may be suitable for planarization of support surfaces of the light emitting elements LD.

A second insulating layer INS2 may be provided and/or formed on the light emitting elements LD. The second insulating layer INS2 may be provided and/or formed on each of the light emitting elements LD to cover a portion of an upper surface of each of the light emitting elements LD, and expose the opposite ends EP1 and EP2 of each of the light emitting elements LD to the outside. The second insulating layer INS2 may be formed in an independent pattern in the first emission area MEMA of the first sub-pixel SP1, but the present disclosure is not limited thereto.

The second insulating layer INS2 may be formed of a single layer or multiple layers, and include an inorganic insulating layer including at least one inorganic material or an organic insulating layer including at least one organic material. The second insulating layer INS2 may fix in place each of the light emitting elements LD aligned in the first emission area MEMA of the first sub-pixel SP1. In one or more embodiments of the present disclosure, the second insulating layer INS2 may include an inorganic insulating layer suitable for protecting the active layer 12 of each of the light emitting elements LD from external oxygen, water, etc. However, the present disclosure is not limited thereto. The second insulating layer INS2 may be formed of an organic insulating layer including organic material, depending on design conditions of the display device to which the light emitting elements LD are applied.

In one or more embodiments of the present disclosure, after the alignment of the light emitting elements LD in the first emission area MEMA of the first sub-pixel SP1 has been completed, the second insulating layer INS2 is formed on the light emitting elements LD so that the light emitting elements LD may be prevented from being removed from the aligned positions. In case that space, e.g., a gap, is present between the first insulating layer INS1 and the light emitting elements LD before the formation of the second insulating layer INS2, the gap may be filled with the second insulating layer INS2 during a process of forming the second insulating layer INS2. Consequently, the light emitting elements LD may be more stably supported. Hence, the second insulating layer INS2 may be formed of an organic insulating layer suitable for filling the space between the first insulating layer INS1 and the light emitting elements LD with the second insulating layer INS2.

In one or more embodiments of the present disclosure, the second insulating layer INS2 may be formed on each of the light emitting elements LD so that the active layer 12 of each of the light emitting elements LD may be prevented from coming into contact with external conductive material. The second insulating layer INS2 may cover only a portion of the surface of each of the light emitting elements LD such that the opposite ends EP1 and EP2 of each of the light emitting elements LD may be exposed to the outside.

In the following embodiment, for the sake of description, the light emitting elements LD aligned between the 1-1-th electrode EL1_1 and the 1-1-th sub-electrode CL1_1 will be designated as "first light emitting elements LD", the light emitting elements LD aligned between the 1-1-th sub-electrode CL1_1 and the 2-1-th sub-electrode CL2_1 will be designated as "second light emitting elements LD", and the light emitting elements LD aligned between the 2-1-th sub-electrode CL2_1 and the 2-1-th electrode EL2_1 will be designated as "third light emitting elements LD".

In one or more embodiments of the present disclosure, after the light emitting elements LD are aligned in the first emission area MEMA of the first sub-pixel SP1, each of the 1-1-th electrode EL1_1 and the 2-1-th electrode EL2_1 may function as driving electrodes (or driving lines) for driving the light emitting elements LD. Furthermore, after the light emitting elements LD are aligned in the first emission area MEMA of the first sub-pixel SP1, each of the 1-1-th and 2-1-th sub-electrodes CL1_1 and CL2_1 may be, between the 1-1-th electrode EL1_1 and the 2-1-th electrode EL2_1, a passage for driving current to be transmitted from the 1-1-th electrode EL1_1 to the 2-1-th electrode EL2_1.

The 1-1-th contact electrode CNE1_1 may be provided and/or formed on the 1-1-th electrode EL1_1 and the first end EP1 of each of the first light emitting elements LD to electrically and/or physically reliably connect the 1-1-th electrode EL1_1 and the first end EP1 of each of the first light emitting elements LD with each other. In a plan view, the 1-1-th contact electrode CNE1_1 may overlap not only the 1-1-th electrode EL1_1 but also the first end EP1 of each of the first light emitting elements LD.

The 2-1-th contact electrode CNE2_1 may be provided and/or formed on the second end EP2 of each of the first light emitting elements LD, the 1-1-th sub-electrode CL1_1, and the second end EP2 of each of the second light emitting elements LD to electrically and/or physically reliably connect the second end EP2 of each of the first light emitting elements LD and one side of the 1-1-th sub-electrode CL1_1 with each other and the other side of the 1-1-th sub-electrode CL1_1 and the second end EP2 of each of the second light emitting elements LD with each other. In a plan view, the 2-1-th contact electrode CNE2_1 may overlap the second end EP2 of each of the first light emitting elements LD, overlap the 1-1-th sub-electrode CL1_1, and also overlap the second end EP2 of each of the second light emitting elements LD.

The 3-1-th contact electrode CNE3_1 may be provided and/or formed on the first end EP1 of each of the second light emitting elements LD, the 2-1-th sub-electrode CL2_1, and the first end EP1 of each of the third light emitting elements LD to electrically and/or physically reliably connect the first end EP1 of each of the second light emitting elements LD and one side of the 2-1-th sub-electrode CL2_1 with each other and the other side of the 2-1-th sub-electrode CL2_1 and the first end EP1 of each of the third light emitting elements LD with each other. In a plan view, the 3-1-th contact electrode CNE3_1 may overlap the first end EP1 of each of the second light emitting elements LD, overlap the 2-1-th sub-electrode CL2_1, and also overlap the first end EP1 of each of the third light emitting elements LD.

The 4-1-th contact electrode CNE4_1 may be provided and/or formed on the second end EP2 of each of the third light emitting elements LD and the 2-1-th electrode EL2_1 to electrically and/or physically reliably connect the second end EP2 of each of the third light emitting elements LD and the 2-1-th electrode EL2_1 with each other. In a plan view, the 4-1-th contact electrode CNE4_1 may overlap not only the second end EP2 of each of the third light emitting elements LD but also the 2-1-th electrode EL2_1.

Each of the 1-1-th to 4-1-th contact electrodes CNE1_1 to CNE4_1 may be formed of various transparent conductive materials. For example, each of the 1-1-th to 4-1-th contact electrodes CNE1_1 to CNE4_1 may be formed of transparent conductive material for reducing or minimizing loss of light that is emitted from each of the light emitting elements LD and reflected in the image display direction of the display device by the corresponding electrode. The transparent conductive material may include at least one of various conductive materials, e.g., ITO, IZO, and ITZO, and may be substantially transparent or semi-transparent to satisfy a desired transmittancy (e.g., a set or predetermined transmittancy).

Each of the 1-1-th to 4-1-th contact electrodes CNE1_1 to CNE4_1 may have a bar shape extending in one direction, but the present disclosure is not limited thereto, and for example, it may be changed in various shapes so long as it can electrically and/or physically reliably connect one electrode disposed thereunder with one of the opposite ends of each of the light emitting elements LD.

In one or more embodiments of the present disclosure, each of the 1-1-th to 4-1-th contact electrodes CNE1_1 to CNE4_1 may be disposed at a position spaced from an adjacent contact electrode, in a plan view. For example, the 1-1-th contact electrode CNE1_1 and the 2-1-th contact electrode CNE2_1 may be spaced from each other (e.g., spaced from each other by a predetermined distance). The 2-1-th contact electrode CNE2_1 and the 3-1-th contact electrode CNE3_1 may be spaced from each other (e.g., spaced from each other by a predetermined distance). The 3-1-th contact electrode CNE3_1 and the 4-1-th contact electrode CNE4_1 may be spaced from each other (e.g., spaced from each other by a predetermined distance).

In one or more embodiments of the present disclosure, the 1-1-th to 4-1-th contact electrodes CNE1_1 to CNE4_1 may be provided and/or formed on (or at) an identical layer. In this case, the 1-1-th to 4-1-th contact electrodes CNE1_1 to CNE4_1 may be provided and/or formed on the second insulating layer INS2. The 1-1-th contact electrode CNE1_1 and the 2-1-th contact electrode CNE2_1 may be spaced from each other on the second insulating layer INS2 on the first light emitting elements LD, in a sectional view, and thus electrically and/or physically separated from each other. The 2-1-th contact electrode CNE2_1 and the 3-1-th contact electrode CNE3_1 may be spaced from each other on the second insulating layer INS2 on the second light emitting elements LD, in a sectional view, and thus electrically and/or physically separated from each other. Although not directly illustrated in the drawings, the 3-1-th contact electrode CNE3_1 and the 4-1-th contact electrode CNE4_1 may be spaced from each other on the second insulating layer INS2 on the third light emitting elements LD and thus electrically and/or physically separated from each other.

In case that the 1-1-th to 4-1-th contact electrodes CNE1_1 to CNE4_1 are provided on (or at) an identical layer, the 1-1-th to 4-1-th contact electrodes CNE1_1 to CNE4_1 may be provided and/or formed on the second insulating layer INS2 and covered with a third insulating layer INS3. The third insulating layer INS3 may be an inorganic insulating layer including inorganic material or an organic insulating layer including organic material, but the present disclosure is not limited thereto. In one or more embodiments, the third insulating layer INS3 may be an encapsulation layer ENC including a plurality of insulating layers that covers the display element layer DPL including the light emitting elements LD. For example, the third insulating layer INS3 (ENC) may have a structure formed by alternately stacking at least one inorganic layer and at least one organic layer.

Although in the foregoing embodiment there has been described the case where the 1-1-th to 4-1-th contact electrodes CNE1_1 to CNE4_1 are provided and/or formed on (or at) the identical layer, the present disclosure is not limited thereto. In one or more embodiments, the 1-1-th to 4-1-th contact electrodes CNE1_1 to CNE4_1 may be provided and/or formed on different layers. In this case, some of the 1-1-th to 4-1-th contact electrodes CNE1_1 to CNE4_1 may be provided on the second insulating layer INS2, and the other may be provided on an auxiliary insulating layer AU_INS. For example, as illustrated in FIG. 11, in case that the 1-1-th contact electrode CNE1_1 and the 2-1-th contact electrode CNE2_1 that are adjacent (e.g., next) to each other are provided and/or formed on different layers, the 1-1-th contact electrode CNE1_1 may be provided on the second insulating layer INS2 and covered with the auxiliary insulating layer AU_INS, and the 2-1-th contact electrode CNE2_1 may be provided on the auxiliary insulating layer AU_INS and covered with the third insulating layer INS3 (ENC). However, the present disclosure is not limited thereto. In one or more embodiments, in case that the 2-1-th contact electrode CNE2_1 is provided on the second insulating layer INS2 and covered with the auxiliary insulating layer AU_INS, the 1-1-th contact electrode CNE1_1 may be provided on the auxiliary insulating layer AU_INS and covered with the third insulating layer INS3 (ENC).

In one or more embodiments of the present disclosure, the 1-1-th electrode EL1_1 may be electrically connected with some components of the pixel circuit 144 of the pixel circuit layer PCL of the first sub-pixel SP1 through the first contact hole CH1.

In case that driving current flows from the first power line PL1 to the second power line PL2 via the pixel circuit 144 by the first transistor T1 (T) included in the pixel circuit 144 of the first sub-pixel SP1, the driving current may be supplied to the emission unit EMU of the first sub-pixel SP1 through the first contact hole CH1. For example, driving current may be supplied to the 1-1-th electrode EL1_1 through the first contact hole CH1, and the driving current may flow to the 1-1-th sub-electrode CL1_1 via the first light emitting elements LD. Therefore, each of the first light emitting elements LD may emit light at a luminance corresponding to distributed current. Driving current flowing through the 1-1-th sub-electrode CL1_1 may flow to the 2-1-th sub-electrode CL2_1 via the second light emitting elements LD2. Therefore, each of the second light emitting elements LD may emit light at a luminance corresponding to distributed current. Driving current flowing through the 2-1-th sub-electrode CL2_1 may flow to the 2-1-th electrode EL2_1 via the third light emitting elements LD. Therefore, each of the third light emitting elements LD may emit light at a luminance corresponding to distributed current.

In one or more embodiments, a capping layer CPL may be provide and/or formed in the first emission area MEMA of the first sub-pixel SP1, as illustrated in FIG. 12.

In the first emission area MEMA, the capping layer CPL may be provided and/or formed each between the 1-1-th electrode EL1_1 and the 1-1-th contact electrode CNE1_1, between the 1-1-th sub-electrode CL1_1 and the 2-1-th contact electrode CNE2_1, between the 2-1-th sub-electrode CL2_1 and the 3-1-th contact electrode CNE3_1, and between the 2-1-th electrode EL2_1 and the 4-1-th contact electrode CNE4_1.

The capping layer CPL may prevent a corresponding electrode and a corresponding contact electrode from being damaged due to a failure caused during a process of fabricating the display device, and reinforce adhesive force between the corresponding electrode and the pixel circuit layer PCL disposed thereunder. Furthermore, the capping layer CPL may prevent a corresponding sub-electrode and a corresponding contact electrode from being damaged due to a failure caused during the process of fabricating the display device, and reinforce adhesive force between the corresponding sub-electrode and the pixel circuit layer PCL disposed thereunder.

The capping layer CPL may be formed of transparent conductive material such as indium zinc oxide (ZO) to reduce or minimize loss of light emitted from each of the light emitting elements LD and reflected by the corresponding electrode and the corresponding sub-electrode in the image display direction of the display device.

In one or more embodiments of the present disclosure, the display element layer DPL included in the bridge BR of each of the first to fourth sub-pixels SP1 to SP4 may have a substantially similar or identical structure. Hence, for the sake of explanation, the description of the display element layer DPL included in the bridge BR of the first sub-pixel SP1 will substitute for description of the display element layer DPL included in the bridge BR of each of the first to fourth sub-pixels SP1 to SP4.

The bridge BR of the first sub-pixel SP1 may include first to fourth bridges BR1 to BR4. The first to fourth bridges BR1 to BR4 each may be one area of the base layer BS other than the first island IS1, and integrally provided and connected with some bridges BR of the sub-pixels adjacent (or next) to the first sub-pixel SP1.

The first bridge BR1 may be connected to a portion of the first side S1 of the first island IS1 of the first sub-pixel SP1 and extend in the first direction DR1. The second bridge BR2 may be connected to a portion of the second side S2 of the first island IS1 and extend in the second direction DR2. The third bridge BR3 may be connected to a portion of the third side S3 of the first island IS1 and extend in the first direction DR1. The fourth bridge BR4 may be connected to a portion of a fourth side S4 of the first island IS1 and extend in the second direction DR2.

In one or more embodiments of the present disclosure, each of the first to fourth bridges BR1 to BR4 may include an opening OPN (e.g., see FIG. 10). The opening OPN may be formed by removing portions of the insulating layers provided on the base layer BS of each of the first to fourth bridges BR1 to BR4. Here, the insulating layers may include the buffer layer BFL, the gate insulating layer GI, and the first interlayer insulating layer ILD1 that are successively formed and/or provided on the base layer BS. For example, the insulating layers may include an inorganic insulating layer formed and/or provided on the base layer BS.

For reference, in FIGS. 10 to 12, there is illustrated an example where in a boundary area between the first bridge BR1 and the first island IS1 of the first sub-pixel SP1, respective inner side surfaces of the buffer layer BFL, the gate insulating layer GI, and the first interlayer insulating layer ILD1 are aligned with each other so that the opening OPN of the buffer layer BFL, the opening OPN of the gate insulating layer GI, and the opening OPN of the first interlayer insulating layer ILD1 are disposed on a collinear line, but the present disclosure is not limited thereto. In one or more embodiments, a boundary point of the opening OPN of the gate insulating layer GI may be disposed closer to the first bridge BR1 than is a boundary point of the opening OPN of the buffer layer BFL, and vice-versa.

In one or more embodiments of the present disclosure, the opening OPN may destroy, by the respective islands IS as a unit, continuity of the buffer layer BFL, the gate insulating layer GI, and the first interlayer insulating layer ILD1 that include inorganic material. In other words, the buffer layer BFL, the gate insulating layer GI, and the first interlayer insulating layer ILD1 that include inorganic material may be provided in only the first island IS1 of the first sub-pixel SP1, and may not be provided in the first to fourth bridges BR1 to BR4.

In one or more embodiments of the present disclosure, the first to fourth bridges BR1 to BR4 may include a base layer BS, and a pixel circuit layer PCL provided on the base layer BS.

The pixel circuit layer PCL of each of the first to fourth bridges BR1 to BR4 may include a second interlayer insulating layer ILD2 provided on the base layer BS, a plurality of lines provided on the second interlayer insulating layer ILD2, and a passivation layer PSV configured to cover the lines and the second interlayer insulating layer ILD2.

The second interlayer insulating layer ILD2 may be an organic insulating layer including organic material. The organic material may include a polyacryl-based compound, a polyimide-based compound, a fluorocarbon compound such as Teflon, a benzocyclobutene compound, etc. The second interlayer insulating layer ILD2 may be provided to fill the opening OPN therewith. The entirety of the opening OPN may be filled with the second interlayer insulating layer ILD2, but the present disclosure is not limited thereto. In one or more embodiments, at least a portion of the opening OPN may be filled with the second interlayer insulating layer ILD2. The second interlayer insulating layer ILD2 may be provided to fill the opening OPN of each of the first to fourth bridges BR1 to BR4 therewith, and may provide, due to material characteristics thereof, flexibility to each of the first to fourth bridges BR1 to BR4 when the display device is stretched. Consequently, impact resistance characteristics of the display device may be enhanced. In one or more embodiments of the present disclosure, the opening OPN and the second interlayer insulating layer ILD2 may not be provided and/or formed in the slit V of the base layer BS.

In one or more embodiments of the present disclosure, the lines LP provided in each of the first to fourth bridges BR1 to BR4 may be signal lines for supplying a driving voltage, a scan signal, a data signal, etc. to the pixel circuit 144 disposed in the first island IS1. Furthermore, at least one bridge BR of the first to fourth bridges BR1 to BR4 may be provided and/or formed with a driving voltage line DVL to which a voltage of the second driving power supply VSS may be applied. For example, the driving voltage line DVL may be provided and/or formed in the first bridge BR1. In one or more embodiments of the present disclosure, the driving voltage line DVL may be the second power line PL2 to which a voltage of the second driving power supply VSS is to be applied, in the pixel circuit 144 included in the pixel circuit layer PCL of the first sub-pixel SP1.

The passivation layer PSV may be provided and/or formed on the foregoing lines LP and the driving voltage line DVL. The passivation layer PSV may have the same configuration as that of the passivation layer PSV of the pixel circuit layer PCL provided in the first island IS1. The passivation layer PSV may include a second contact hole CH2 through which a portion of the driving voltage line DVL is exposed. In one or more embodiments of the present disclosure, the passivation layer PSV may not be provided and/or formed in the slit V of the base layer BS.

The display element layer DPL may be provided and/or formed on the pixel circuit layer PCL of each of the first and third bridges BR1 and BR3 that extend in the first direction DR1 among the first to fourth bridges BR1 to BR4. Each of the first and third bridges BR1 and BR3 may include a second emission area SEMA from which light may be emitted by components included in the display element layer DPL. Each of the second and fourth bridges BR2 and BR4 that extend in the second direction DR2 among the first to fourth bridges BR1 to BR4 may not include the display element layer DPL. The present disclosure is not limited thereto. In one or more embodiments, the display element layer DPL may also be provided and/or formed on the pixel circuit layer PCL of each of the second and fourth bridges BR2 and BR4 that extends in the second direction DR2.

Some components of the display element layer DPL of each of the first and third bridges BR1 and BR3 may be disposed in a peripheral area of the corresponding bridge BR, and the other components may be disposed in the second emission area SEMA of the corresponding bridge BR.

The display element layer DPL of each of the first and third bridges BR1 and BR3 may include a second bank BNK2, a 1-2-th electrode EL1_2, a 2-2-th electrode EL2_2, a 1-2-th sub-electrode CL1_2, a 2-2-th sub-electrode CL2_2, and a plurality of light emitting elements LD.

The second bank BNK2 may be provided and/or formed each between the passivation layer PSV and the 1-2-th electrode EL1_2, between the passivation layer PSV and the 2-2-th electrode EL22, between the passivation layer PSV and the 1-2-th sub-electrode CL1_2, and between the passivation layer PSV and the 2-2-th sub-electrode CL2_2, in the second emission area SEMA of each of the first and third bridges BR1 and BR3.

The second bank BNK2 may be a support or an insulating pattern which supports each of the 1-2-th and 2-2-th electrodes EL1_2 and EL2_2 and the 1-2-th and 2-2-th sub-electrodes CL1_2 and CL2_2 so as to change a surface profile of each of the 1-2-th and 2-2-th electrodes EL1_2 and EL2_2 and the 1-2-th and 2-2-th sub-electrodes CL1_2 and CL2_2 so that light emitted from the light emitting elements LD disposed (or aligned) in the second emission area SEMA may more reliably travel in an image display direction of the display device.

The second bank BNK2 may have material identical with as that of the first bank BNK1, and may be provided and/or formed on (or at) a layer identical with that of the first bank BNK1. In one or more embodiments of the present disclosure, the first bank BNK1 and the second bank BNK2 may be formed through an identical process, and may be integrally provided and connected with each other. For example, the second bank BNK2 of the first bridge BR1 may extend from one side of the first bank BNK1 of the first island IS1 in the first direction DR1, e.g., in a horizontal direction. The second bank BNK2 of the third bridge BR3 may extend from the other side of the first bank BNK1 of the first island IS1 in the horizontal direction.

Each of the first and third bridges BR1 and BR3 may include a peripheral area disposed around the second emission area SEMA. A third bank may be disposed in the peripheral area of each of the first and third bridges BR1 and BR3.

The 1-2-th and 2-2-th electrodes EL1_2 and EL2_2 may be disposed at positions spaced from each other in the second emission area SEMA of each of the first and third bridges BR1 and BR3. The 1-2-th sub-electrode CL1_2 and the 2-2-th sub-electrode CL2_2 may be disposed between the 1-2-th electrode EL1_2 and the 2-2-th electrode EL2_2. For example, the 1-2-th sub-electrode CL12 may be disposed between the 1-2-th electrode EL1_2 and the 2-2-th sub-electrode CL2_2. The 2-2-th sub-electrode CL2_2 may be disposed between the 1-2-th sub-electrode CL1_2 and the 2-2-th electrode EL2_2. In a plan view, the 1-2-th electrode EL1_2, the 1-2-th sub-electrode CL1_2, the 2-2-th sub-electrode CL2_2, and the 2-2-th electrode EL2_2 may be disposed at positions spaced from each other.

In one or more embodiments of the present disclosure, the 1-2-th electrode EL1_2 and the 1-2-th sub-electrode CL1_2 may be spaced from each other (e.g., spaced from each other by a predetermined distance). The 1-2-th sub-electrode CL1_2 and the 2-2-th sub-electrode CL2_2 may be spaced from each other (e.g., spaced from each other by a predetermined distance). The 2-2-th sub-electrode CL2_2 and the 2-2-th electrode EL2_2 may be spaced from each other (e.g., spaced from each other by a predetermined distance). In the second emission area SEMA of each of the first and third bridges BR1 and BR3, the distance between the 1-2-th electrode EL1_2 and the 1-2-th sub-electrode CL1_2, the distance between the 1-2-th sub-electrode CL1_2 and the 2-2-th sub-electrode CL2_2, and the distance between the 2-2-th sub-electrode CL2_2 and the 2-2-th electrode EL2_2 may be identical (or uniform) with each other. Therefore, the light emitting elements LD may be more uniformly aligned in the second emission area SEMA of each of the first and third bridges BR1 and BR3.

The 1-2-th electrode EL1_2, the 1-2-th sub-electrode CL1_2, the 2-2-th sub-electrode CL2_2, and the 2-2-th electrode EL2_2 each may be disposed on the second bank BNK2 and have a surface profile corresponding to the shape of the second bank BNK2. The 1-2-th electrode EL1_2, the 1-2-th sub-electrode CL1_2, the 2-2-th sub-electrode CL2_2, and the 2-2-th electrode EL2_2 may be made of material having a suitable reflectivity (e.g., a set or predetermined reflectivity) to allow light emitted from the opposite ends EP1 and EP2 of each of the light emitting elements LD to travel in the image display direction (e.g., in the frontal direction) of the display device.

In one or more embodiments of the present disclosure, the 1-2-th electrode EL1_2 of the first bridge BR1 may be connected to one side of the 1-1-th electrode EL1_1 of the first island IS1. The 1-2-th electrode EL1_2 of the third bridge BR3 may be connected to the other side of the 1-1-th electrode EL1_1. For example, the 1-2-th electrode EL1_2 of the first bridge BR1 may extend from the one side of the 1-1-th electrode EL1_1 of the first island IS1 in the first direction DR1, e.g., in the horizontal direction toward the first bridge BR1. The 1-2-th electrode EL1_2 of the third bridge BR3 may extend from the other side of the 1-1-th electrode EL1_1 of the first island IS1 in the first direction DR1, e.g., in the horizontal direction toward the third bridge BR3.

The 1-2-th electrode EL1_2 of the first bridge BR1, the 1-1-th electrode EL1_1 of the first island IS1, and the 1-2-th electrode EL1_2 of the third bridge BR3 may be integrally provided and connected with each other. For example, the 1-2-th electrode EL1_2 of the first bridge BR1 and the 1-2-th electrode EL1_2 of the third bridge BR3 may be integrally provided with the 1-1-th electrode EL1_1 of the first island IS1 and regarded as one area of the 1-1-th electrode EL1_1. The 1-2-th electrode EL1_2 of the first bridge BR1, the 1-1-th electrode EL1_1 of the first island IS1, and the 1-2-th electrode EL1_2 of the third bridge BR3 may form the first electrode EL1 in the emission area EMA of the first sub-pixel SP1.

In one or more embodiments of the present disclosure, the 2-2-th electrode EL2_2 of the first bridge BR1 may be connected to one side of the 2-1-th electrode EL2_1 of the first island IS1. The 2-2-th electrode EL2_2 of the third bridge BR3 may be connected to the other side of the 2-1-th electrode EL2_1. For example, the 2-2-th electrode EL2_2 of the first bridge BR1 may extend from the one side of the 2-1-th electrode EL2_1 of the first island IS1 toward the first bridge BR1 in the first direction DR1 (in the horizontal direction). The 2-2-th electrode EL2_2 of the third bridge BR3 may extend from the other side of the 2-1-th electrode EL2_1 of the first island IS1 toward the third bridge BR3 in the first direction DR1 (in the horizontal direction).

The 2-2-th electrode EL2_2 of the first bridge BR1, the 2-1-th electrode EL2_1 of the first island IS1, and the 2-2-th electrode EL2_2 of the third bridge BR3 may be integrally provided and connected with each other. For example, the 2-2-th electrode EL2_2 of the first bridge BR1 and the 2-2-th electrode EL2_2 of the third bridge BR3 may be integrally provided with the 2-1-th electrode EL2_1 of the first island IS1 and regarded as one area of the 2-1-th electrode EL2_1. The 2-2-th electrode EL2_2 of the first bridge BR1, the 2-1-th electrode EL2_1 of the first island IS1, and the 2-2-th electrode EL2_2 of the third bridge BR3 may form the second electrode EL2 in the emission area EMA of the first sub-pixel SP1.

In one or more embodiments of the present disclosure, the 1-2-th sub-electrode CL1_2 of the first bridge BR1 may be connected to one side of the 1-1-th sub-electrode CL1_1 of the first island IS1. The 1-2-th sub-electrode CL1_2 of the third bridge BR3 may be connected to the other side of the 1-1-th sub-electrode CL1_1. For example, the 1-2-th sub-electrode CL1_2 of the first bridge BR1 may extend from the one side of the 1-1-th sub-electrode CL1_1 of the first island IS1 toward the first bridge BR1 in the first direction DR1 (in the horizontal direction). The 1-2-th sub-electrode CL1_2 of the third bridge BR3 may extend from the other side of the 1-1-th sub-electrode CL1_1 of the first island IS1 toward the third bridge BR3 in the first direction DR1 (in the horizontal direction).

The 1-2-th sub-electrode CL1_2 of the first bridge BR1, the 1-1-th sub-electrode CL1_1 of the first island IS1, and the 1-2-th sub-electrode CL1_2 of the third bridge BR3 may be integrally provided and connected with each other. For example, the 1-2-th sub-electrode CL1_2 of the first bridge BR1 and the 1-2-th sub-electrode CL1_2 of the third bridge BR3 may be integrally provided with the 1-1-th sub-electrode CL1_1 of the first island IS1 and regarded as one area of the 1-1-th sub-electrode CL1_1. The 1-2-th sub-electrode CL1_2 of the first bridge BR1, the 1-1-th sub-electrode CL1_1 of the first island IS1, and the 1-2-th sub-electrode CL1_2 of the third bridge BR3 may form the first sub-electrode CL1 in the emission area EMA of the first sub-pixel SP1.

In one or more embodiments of the present disclosure, the 2-2-th sub-electrode CL2_2 of the first bridge BR1 may be connected to one side of the 2-1-th sub-electrode CL2_1 of the first island IS1. The 2-2-th sub-electrode CL2_2 of the third bridge BR3 may be connected to the other side of the 2-1-th sub-electrode CL2_1. For example, the 2-2-th sub-electrode CL2_2 of the first bridge BR1 may extend from the one side of the 2-1-th sub-electrode CL2_1 of the first island IS1 toward the first bridge BR1 in the first direction DR1 (in the horizontal direction). The 2-2-th sub-electrode CL2_2 of the third bridge BR3 may extend from the other side of the 2-1-th sub-electrode CL2_1 of the first island IS1 toward the third bridge BR3 in the first direction DR1 (in the horizontal direction).

The 2-2-th sub-electrode CL2_2 of the first bridge BR1, the 2-1-th sub-electrode CL2_1 of the first island IS1, and the 2-2-th sub-electrode CL2_2 of the third bridge BR3 may be integrally provided and connected with each other. For example, the 2-2-th sub-electrode CL2_2 of the first bridge BR1 and the 2-2-th sub-electrode CL2_2 of the third bridge BR3 may be integrally provided with the 2-1-th sub-electrode CL2_1 of the first island IS1 and regarded as one area of the 2-1-th sub-electrode CL2_1. The 2-2-th sub-electrode CL2_2 of the first bridge BR1, the 2-1-th sub-electrode CL2_1 of the first island IS1, and the 2-2-th sub-electrode CL2_2 of the third bridge BR3 may form the second sub-electrode CL2 in the emission area EMA of the first sub-pixel SP1.

In an plan view, in the emission area EMA of the first sub-pixel SP1, the first electrode EL1, the first sub-electrode CL1, the second sub-electrode CL2, and the second electrode EL2 may be disposed at positions spaced from each other. For example, the first electrode EL1 and the first sub-electrode CL1 may be spaced from each other (e.g., spaced from each other by a predetermined distance). The first sub-electrode CL1 and the second sub-electrode CL2 may be spaced from each other (e.g., spaced from each other by a predetermined distance). The second sub-electrode CL2 and the second electrode EL2 may be spaced from each other (e.g., spaced from each other by a predetermined distance).

In one or more embodiments of the present disclosure, in the emission area EMA of the first sub-pixel SP1, the first electrode EL1 may be provided and/or formed only in the first sub-pixel SP1 so as to allow the first sub-pixel SP1 to be driven independently (or individually) from adjacent sub-pixels, and may be electrically and/or physically separated from the first electrode EL1 provided and/or formed in each of the adjacent sub-pixels. Furthermore, in the emission area EMA of the first sub-pixel SP1, the first and second sub-electrodes CL1 and CL2 may be provided and/or formed only in the first sub-pixel SP1, and may be respectively electrically and/or physically separated from the first and second sub-electrodes CL1 and CL2 provided and/or formed in each of the sub-pixels adjacent to the first sub-pixel SP1. In the emission area EMA of the first sub-pixel SP1, the second electrode EL2 may be provided in common to the first sub-pixel SP1 and the sub-pixels adjacent to the first sub-pixel SP1 in the first direction DR1. Hence, a plurality of sub-pixels disposed in an identical sub-pixel row in the first direction DR1 may be connected in common to the second electrode EL2.

In one or more embodiments, the 2-2-th electrode EL2_2 of the first bridge BR1, the 2-1-th electrode EL2_1 of the first island IS1, and the 2-2-th electrode EL2_2 of the third bridge BR3 may be integrally provided and connected with each other. In one or more embodiments of the present disclosure, the 2-2-th electrode EL2_2 of the first bridge BR1 may be electrically connected, through the second contact hole CH2 passing through the passivation layer PSV, to the driving voltage line DVL included in the pixel circuit layer PCL of the first bridge BR1. Because the 2-2-th electrode EL2_2 of the first bridge BR1 is electrically connected to the driving voltage line DVL, the voltage of the second driving power supply VSS that is applied to the driving voltage line DVL may be transmitted to the second electrode EL2 of the first sub-pixel SP1 and the second electrode EL2 of each of a plurality of sub-pixels disposed in a sub-pixel row identical with that of the first sub-pixel SP1.

In the second emission area SEMA of each of the first and third bridges BR1 and BR3, a plurality of light emitting elements LD may be aligned and/or provided each between the 1-2-th electrode EL1_2 and the 1-2-th sub-electrode CL1_2, between the 1-2-th sub-electrode CL1_2 and the 2-2-th sub-electrode CL2_2, and between the 2-2-th sub-electrode CL2_2 and the 2-2-th electrode EL2_2. In the second emission area SEMA of each of the first and third bridges BR1 and BR3, the light emitting elements LD that are provided (or aligned) each between the 1-2-th electrode EL1_2 and the 1-2-th sub-electrode CL1_2, between the 1-2-th sub-electrode CL1_2 and the 2-2-th sub-electrode CL2_2, and between the 2-2-th sub-electrode CL2_2 and the 2-2-th electrode EL2_2 may additionally form an emission unit of the first sub-pixel SP1.

Although at least two to several tens of light emitting elements LD are aligned in the second emission area SEMA of each of the first and third bridges BR1 and BR3, the present disclosure is not limited thereto. Depending on embodiments, the number of light emitting elements LD may be changed in various ways.

The light emitting elements LD may be diffused in a solution and supplied into the emission area EMA of the first sub-pixel SP1.

If corresponding alignment signals (or alignment voltages) are respectively applied to the first and second electrodes EL1 and EL2 and the first and second sub-electrodes CL1 and CL2 that are disposed in the first sub-pixel SP1, an electric field may be formed each between the first electrode EL1 and the first sub-electrode CL1, between the first sub-electrode CL1 and the second sub-electrode CL2, and between the second sub-electrode CL2 and the second electrode EL2. Consequently, the light emitting elements LD may be aligned each between the first electrode EL1 and the first sub-electrode CL1, between the first sub-electrode CL1 and the second sub-electrode CL2, and between the second sub-electrode CL2 and the second electrode EL2. After the light emitting elements LD have been aligned, the solvent may be removed, so that the light emitting elements LD may be ultimately aligned in each of the first and second emission areas MEMA and SEMA of the first sub-pixel SP1.

As described above, when the light emitting elements LD are aligned in the first sub-pixel SP1, the first and second electrodes EL1 and EL2 and the first and second sub-electrodes CL1 and CL2 may function as alignment electrodes (or alignment lines) for alignment of the light emitting elements LD. In other words, when the light emitting elements LD are aligned in the first sub-pixel SP1, the 1-1-th and 1-2-th electrodes EL1_1 and EL1_2, the 1-1-th and 1-2-th sub-electrodes CL1_1 and CL1_2, the 2-1-th and 2-2-th sub-electrodes CL2_1 and CL22, and the 2-1-th and 2-2-th electrodes EL2_1 and EL2_2 may function as alignment electrodes (or alignment lines) for alignment of the light emitting elements LD. In one or more embodiments of the present disclosure, the 1-1-th and 1-2-th electrodes EL1_1 and EL1_2 that form the first electrode EL1, and the 2-1-th and 2-2-th sub-electrodes CL2_1 and CL2_2 that form the second sub-electrode CL2 may be first alignment electrodes to which an identical alignment signal (or an identical first alignment voltage) is to be applied. Furthermore, the 1-1-th and 1-2-th sub-electrodes CL1_1 and CL1_2 that form the first sub-electrode CL1, and the 2-1-th and 2-2-th electrodes EL2_1 and EL2_2 that form the second electrode EL2 may be second alignment electrodes to which an identical second alignment signal (or an identical second alignment voltage) is to be applied.

In one or more embodiments of the present disclosure, each of the light emitting elements LD aligned in the second emission area SEMA of each of the first and third bridges BR1 and BR3 may be connected in the forward direction between two adjacent electrodes.

The first end EP1 of each of the light emitting elements LD aligned in each of the first and third bridges BR1 and BR3 may be directly connected to one of the two electrodes disposed adjacent to each other with a distance therebetween (e.g., a predetermined distance therebetween), or may be connected to the one electrode through a contact electrode. Furthermore, the second end EP2 of each of the light emitting elements LD may be directly connected to the other electrode of the two adjacent electrodes, or may be connected to the electrode through another contact electrode.

In one or more embodiments of the present disclosure, the first end EP1 of each of the light emitting elements LD disposed between the 1-2-th electrode EL1_2 and the 1-2-th sub-electrode CL1_2 may be directly connected to the 1-2-th electrode EL1_2, or may be connected to a 1-2-th contact electrode CNE1_2 and thus indirectly connected to the 1-2-th electrode EL1_2. Furthermore, the second end EP2 of each of the light emitting elements LD disposed between the 1-2-th electrode EL1_2 and the 1-2-th sub-electrode CL1_2 may be directly connected to the 1-2-th sub-electrode CL1_2, or may be connected to a 2-2-th contact electrode CNE2_2 and thus indirectly connected to the 1-2-th sub-electrode CL1_2.

The second end EP2 of each of the light emitting elements LD disposed between the 1-2-th sub-electrode CL1_2 and the 2-2-th sub-electrode CL2_2 may be directly connected to the 1-2-th sub-electrode CL1_2, or may be connected to the 2-2-th contact electrode CNE2_2 and thus indirectly connected to the 1-2-th sub-electrode CL1_2. Furthermore, the first end EP1 of each of the light emitting elements LD disposed between the 1-2-th sub-electrode CL1_2 and the 2-2-th sub-electrode CL2_2 may be directly connected to the 2-2-th sub-electrode CL2_2, or may be connected to a 3-2-th contact electrode CNE3_2 and thus indirectly connected to the 2-2-th sub-electrode CL2_2.

The first end EP1 of each of the light emitting elements LD disposed between the 2-2-th sub-electrode CL2_2 and the 2-2-th electrode EL2_2 may be directly connected to the 2-2-th sub-electrode CL2_2, or may be connected to the 3-2-th contact electrode CNE3_2 and thus indirectly connected to the 2-2-th sub-electrode CL2_2. Furthermore, the second end EP2 of each of the light emitting elements LD disposed between the 2-2-th sub-electrode CL2_2 and the 2-2-th electrode EL2_2 may be directly connected to the 2-2-th electrode EL2_2, or may be connected to a 4-2-th contact electrode CNE4_2 and thus indirectly connected to the 2-2-th electrode EL2_2.

The light emitting elements LD that are disposed (or aligned) in the second emission area SEMA of each of the first and third bridges BR1 and BR3 may be provided and/or formed on a first insulating layer INS1. In one or more embodiments of the present disclosure, the first insulating layer INS1 may be a component corresponding to the first insulating layer INS1 provided in the first emission area MEMA of the first island IS1, and may include material identical with that of the first insulating layer INS1 provided in the first emission area MEMA and may be formed through the same process.

A second insulating layer INS2 may be provided and/or formed on each of the light emitting elements LD that are disposed (or aligned) in the second emission area SEMA of each of the first and third bridges BR1 and BR3. The second insulating layer INS2 may be provided and/or formed on each of the light emitting elements LD to cover a portion of an upper surface of each of the light emitting elements LD, and expose the opposite ends EP1 and EP2 of each of the light emitting elements LD to the outside. The second insulating layer INS2 may be a component corresponding to the second insulating layer INS2 provided in the first emission area MEMA of the first island IS1, and may include material identical with that of the second insulating layer INS2 provided in the first emission area MEMA and may be formed through the same process.

In one or more embodiments of the present disclosure, after the light emitting elements LD are aligned in the second emission area SEMA of each of the first and third bridges BR1 and BR3, each of the 1-2-th electrode EL1_2 and the 2-2-th electrode EL2_2 may function as driving electrodes (or driving lines) for driving the light emitting elements LD. Furthermore, after the light emitting elements LD are aligned in the second emission area SEMA of each of the first and third bridges BR1 and BR3, each of the 1-2-th and 2-2-th sub-electrodes CL1_2 and CL2_2 may be, between the 1-2-th electrode EL1_2 and the 2-2-th electrode EL2_2, a passage for driving current to be transmitted from the 1-2-th electrode EL1_2 to the 2-2-th electrode EL2_2.

In the following embodiment, for the sake of description, the light emitting elements LD aligned (or disposed) between the 1-2-th electrode EL1_2 and the 1-2-th sub-electrode CL1_2 will be designated as "fourth light emitting elements LD", the light emitting elements LD aligned (or disposed) between the 1-2-th sub-electrode CL1_2 and the 2-2-th sub-electrode CL2_2 will be designated as "fifth light emitting elements LD", and the light emitting elements LD aligned (or disposed) between the 2-2-th sub-electrode CL2_2 and the 2-2-th electrode EL2_2 will be designated as "sixth light emitting elements LD".

The 1-2-th contact electrode CNE1_2 may be provided and/or formed on the 1-2-th electrode EL1_2 and one end of the opposite ends EP1 and EP2 of each of the fourth light emitting elements LD to electrically and/or physically reliably connect the 1-2-th electrode EL1_2 and the one end of each of the fourth light emitting elements LD with each other. In a plan view, the 1-2-th contact electrode CNE1_2 may overlap not only the 1-2-th electrode EL1_2 but also the one end of each of the fourth light emitting elements LD. The 1-2-th contact electrode CNE1_2 of each of the first and third bridges BR1 and BR3 may include material identical with that of the 1-1-th contact electrode CNE1_1 of the first island IS1.

The 2-2-th contact electrode CNE2_2 may be provided and/or formed on the other end of the opposite ends EP1 and EP2 of each of the fourth light emitting elements LD, the 1-2-th sub-electrode CL1_2, and one end of the opposite ends EP1 and EP2 of each of the fifth light emitting elements LD. The 2-2-th contact electrode CNE2_2 may electrically and/or physically reliably connect the other end of each of the fourth light emitting elements LD with one side of the 1-2-th sub-electrode CL1_2. Furthermore, the 2-2-th contact electrode CNE2_2 may electrically and/or physically reliably connect the other side of the 1-2-th sub-electrode CL1_2 with one end of each of the fifth light emitting elements LD. In a plan view, the 2-2-th contact electrode CNE2_2 may overlap the other end of each of the fourth light emitting elements LD, overlap the 1-2-th sub-electrode CL1_2, and also overlap one end of each of the fifth light emitting elements LD. The 2-2-th contact electrode CNE2_2 of each of the first and third bridges BR1 and BR3 may include material identical with that of the 2-1-th contact electrode CNE2_1 of the first island IS1.

The 3-2-th contact electrode CNE3_2 may be provided and/or formed on the other end of the opposite ends EP1 and EP2 of each of the fifth light emitting elements LD, the 2-2-th sub-electrode CL2_2, and one end of the opposite ends EP1 and EP2 of each of the sixth light emitting elements LD. The 3-2-th contact electrode CNE3_2 may electrically and/or physically reliably connect the other end of each of the fifth light emitting elements LD with one side of the 2-2-th sub-electrode CL2_2. Furthermore, the 3-2-th contact electrode CNE3_2 may electrically and/or physically reliably connect the other side of the 2-2-th sub-electrode CL2_2 with one end of each of the sixth light emitting elements LD. In a plan view, the 3-2-th contact electrode CNE3_2 may overlap the other end of each of the fifth light emitting elements LD, overlap the 2-2-th sub-electrode CL2_2, and also overlap one end of each of the sixth light emitting elements LD. The 3-2-th contact electrode CNE3_2 of each of the first and third bridges BR1 and BR3 may include material identical with that of the 3-1-th contact electrode CNE3_1 of the first island IS1.

The 4-2-th contact electrode CNE4_2 may be provided and/or formed on the other end of the opposite ends EP1 and EP2 of each of the sixth light emitting elements LD and the 2-2-th electrode EL2_2. The 4-2-th contact electrode CNE4_2 may electrically and/or physically reliably connect the other end of each of the sixth light emitting elements LD with the 2-2-th electrode EL2_2. In a plan view, the 4-2-th contact electrode CNE4_2 may overlap not only the other end of each of the sixth light emitting elements LD but also overlap the 2-2-th electrode EL2_2. The 4-2-th contact electrode CNE4_2 of each of the first and third bridges BR1 and BR3 may include material identical with that of the 4-1-th contact electrode CNE4_1 of the first island IS1.

In one or more embodiments of the present disclosure, each of the 1-2-th to 4-2-th contact electrodes CNE1_2 to CNE4_2 may be disposed at a position spaced from an adjacent contact electrode, in a plan view. For example, the 1-2-th contact electrode CNE1_2 and the 2-2-th contact electrode CNE2_2 may be spaced from each other (e.g., spaced from each other by a predetermined distance). The 2-2-th contact electrode CNE2_2 and the 3-2-th contact electrode CNE3_2 may be spaced from each other (e.g., spaced from each other by a predetermined distance). The 3-2-th contact electrode CNE3_2 and the 4-2-th contact electrode CNE4_2 may be spaced from each other (e.g., spaced from each other by a predetermined distance).

In one or more embodiments of the present disclosure, the 1-2-th contact electrode CNE1_2 of the first bridge BR1, the 1-1-th contact electrode CNE1_1 of the first island IS1, and the 1-2-th contact electrode CNE1_2 of the third bridge BR3 may be integrally provided and connected with each other. For example, the 1-2-th contact electrode CNE1_2 of the first bridge BR1 and the 1-2-th contact electrode CNE1_2 of the third bridge BR3 may be integrally provided with the 1-1-th contact electrode CNE1_1 of the first island IS1 and regarded as one area of the 1-1-th contact electrode CNE1_1. The 1-2-th contact electrode CNE1_2 of the first bridge BR1, the 1-1-th contact electrode CNE1_1 of the first island IS1, and the 1-2-th contact electrode CNE1_2 of the third bridge BR3 may form the first contact electrode CNE1 in the emission area EMA of the first sub-pixel SP1.

In one or more embodiments of the present disclosure, the 2-2-th contact electrode CNE2_2 of the first bridge BR1, the 2-1-th contact electrode CNE2_1 of the first island IS1, and the 2-2-th contact electrode CNE2_2 of the third bridge BR3 may be integrally provided and connected with each other. For example, the 2-2-th contact electrode CNE2_2 of the first bridge BR1 and the 2-2-th contact electrode CNE2_2 of the third bridge BR3 may be integrally provided with the 2-1-th contact electrode CNE2_1 of the first island IS1 and regarded as one area of the 2-1-th contact electrode CNE2_1. The 2-2-th contact electrode CNE2_2 of the first bridge BR1, the 2-1-th contact electrode CNE2_1 of the first island IS1, and the 2-2-th contact electrode CNE2_2 of the third bridge BR3 may form the second contact electrode CNE2 in the emission area EMA of the first sub-pixel SP1.

In one or more embodiments of the present disclosure, the 3-2-th contact electrode CNE3_2 of the first bridge BR1, the 3-1-th contact electrode CNE3_1 of the first island IS1, and the 3-2-th contact electrode CNE3_2 of the third bridge BR3 may be integrally provided and connected with each other. For example, the 3-2-th contact electrode CNE3_2 of the first bridge BR1 and the 3-2-th contact electrode CNE3_2 of the third bridge BR3 may be integrally provided with the 3-1-th contact electrode CNE3_1 of the first island IS1 and regarded as one area of the 3-1-th contact electrode CNE3_1. The 3-2-th contact electrode CNE3_2 of the first bridge BR1, the 3-1-th contact electrode CNE3_1 of the first island IS1, and the 3-2-th contact electrode CNE3_2 of the third bridge BR3 may form the third contact electrode CNE3 in the emission area EMA of the first sub-pixel SP1.

In one or more embodiments of the present disclosure, the 4-2-th contact electrode CNE4_2 of the first bridge BR1, the 4-1-th contact electrode CNE4_1 of the first island IS1, and the 4-2-th contact electrode CNE4_2 of the third bridge BR3 may be integrally provided and connected with each other. For example, the 4-2-th contact electrode CNE4_2 of the first bridge BR1 and the 4-2-th contact electrode CNE4_2 of the third bridge BR3 may be integrally provided with the 4-1-th contact electrode CNE4_1 of the first island IS1 and regarded as one area of the 4-1-th contact electrode CNE4_1. The 4-2-th contact electrode CNE4_2 of the first bridge BR1, the 4-1-th contact electrode CNE4_1 of the first island IS1, and the 4-2-th contact electrode CNE4_2 of the third bridge BR3 may form the fourth contact electrode CNE4 in the emission area EMA of the first sub-pixel SP1.

In a plan view, the first to fourth contact electrodes CNE1 to CNE4 may be disposed at positions spaced from each other in the emission area EMA of the first sub-pixel SP1. The first to fourth contact electrodes CNE1 to CNE4 may be provided and/or formed on an identical layer. For example, the first to fourth contact electrodes CNE1 to CNE4 may be provided and/or formed on the second insulating layer INS2 and covered with the third insulating layer INS3. The third insulating layer INS3 formed on each of the first and third bridges BR1 and BR3 may be a component corresponding to the third insulating layer INS3 (ENC) formed in the first island IS1, and may include material identical with that of the third insulating layer INS3 (ENC) provided in the first emission area MEMA and may be formed through the same process.

As described above, suitable voltages (e.g., set or predetermined voltages) may be respectively applied to the opposite ends EP1 and EP2 of each of the light emitting elements LD disposed (or aligned) in the first sub-pixel SP1, so that each of the light emitting elements LD may emit light by coupling of electron-hole pairs in the active layer 12 of each of the light emitting elements LD. Each of the light emitting elements LD may emit light having a wavelength band, e.g., ranging from 400 nm to 900 nm.

As described above, due to the light emitting elements LD aligned in each of the first and third bridges BR1 and BR3, each of the first and third bridges BR1 and BR3 may include a second emission area SEMA which may emit light. The second emission area SEMA of each of the first and third bridges BR1 and BR3, along with the first emission area MEMA provided in the first island IS1, may form the emission area EMA of the first sub-pixel SP1. Hence, the emission area EMA of the first sub-pixel SP1 may include the first emission area MEMA of the first island IS1, the second emission area SEMA of the first bridge BR1, and the second emission area SEMA of the third bridge BR3.

Because the first sub-pixel SP1 further includes, as the emission area EMA formed to emit light, the second emission area SEMA provided in each of the first and third bridges BR1 and BR3 as well as including the first emission area MEMA provided in the first island IS1, an emission surface area with which light is ultimately emitted from the first sub-pixel SP1 may be further increased. Hence, the entire light output efficiency of the display device may be enhanced, so that the quality of an image displayed on the display device can be improved.

In addition, in accordance with the foregoing embodiment, the second interlayer insulating layer ILD2 including organic material may be disposed on the base layer BS of each of the first to fourth bridges BR1 to BR4, and the pixel circuit layer PCL including the lines LP and the driving voltage line DVL, and the display element layer DPL including the light emitting elements LD may be disposed over the second interlayer insulating layer ILD2. Hence, the pixel circuit layer PCL and the display element layer DPL may be prevented from being damaged by stress generated when the display device is stretched.

A protective mask PMK may be disposed on one surface of the base layer BS of the first sub-pixel SP1, e.g., a lower surface of the base layer BS. The protective mask PMK may be formed of either a metal layer including a conductive material and/or an inorganic insulating layer including an inorganic material. For example, the protective mask PMK may include silicon oxide, silicon nitride, etc. The protective mask PMK may block light of a specific area so that the light of the specific area may be blocked from being incident on a transistor T disposed on the base layer BS, whereby the characteristics of the transistor T can be prevented from being changed. A protective film layer PFL may be disposed on the protective mask PMK.

The protective film layer PFL may function to protect the base layer BS and may be formed of a single layer or multiple layers.

FIGS. 16A to 16F are schematic plan views sequentially illustrating a method of fabricating the first sub-pixel illustrated in FIG. 9A. FIGS. 17A to 17G are sectional views sequentially illustrating a method of fabricating the first sub-pixel illustrated in FIG. 10.

Hereinafter, the method of fabricating the first sub-pixel illustrated in FIGS. 9A and 10 in accordance with an embodiment of the present disclosure will be sequentially described with reference to FIGS. 16A to 16F and 17A to 17G.

Referring to FIGS. 1, 2A, 2B, 3A to 6B, 7A, 8, 9A, 10, 16A, and 17A, an auxiliary substrate ASUB formed of soft material is formed on a carrier substrate CSUB formed of a rigid substrate. The auxiliary substrate ASUB may have the form of a film including one selected from the group consisting of a polyester-based polymer, a silicon-based polymer, an acrylic based polymer, a polyolefin based polymer, and a copolymer thereof. For example, the auxiliary substrate ASUB may be formed of polyimide.

Thereafter, the protective mask PMK formed of inorganic insulating layer including inorganic material is formed on the auxiliary substrate ASUB. The protective mask PMK may include a single layer or multiple layers. For example, in case that the protective mask PMK is formed of multiple layers, the protective mask PMK may have a structure formed by successively stacking silicon oxide ($SiO_x$), silicon nitride ($SiN_x$), amorphous silicon (a-Si), etc.

Next, the base layer BS having flexibility is formed on the protective mask PMK. Although the base layer BS includes material identical with that of the auxiliary substrate ASUB, the present disclosure is not limited thereto. In one or more embodiments of the present disclosure, the base layer BS may include a first island IS1 having an island shape, and first to fourth bridges BR1 to BR4 connected to the first island IS1. The first island IS1 may be one area of the base layer BS having an island shape. Each of the first to fourth bridges BR1 to BR4 may be the other area of the base layer BS except the first island IS1.

The pixel circuit layer PCL of the first sub-pixel SP1 is formed on the base layer BS.

The pixel circuit layer PCL formed in the first island IS1 of the base layer BS may include at least one insulating layer, a pixel circuit 144 including at least one transistor T, and a passivation layer PSV configured to cover the transistor T. The pixel circuit layer PCL formed in each of the first to fourth bridges BR1 to BR4 of the base layer BS may include a second interlayer insulating layer ILD2 with which the opening OPN is filled, lines LP provided on the second interlayer insulating layer ILD2, and a passivation layer PSV configured to cover the lines LP. Here, the lines LP may include a driving voltage line DVL to which a voltage of the second driving power supply VSS is to be applied.

The passivation layer PSV may include a first contact hole CH1 which exposes the second terminal DE of the first transistor T1 (T), and a second contact hole CH2 which exposes a portion of the driving voltage line DVL. In one or more embodiments of the present disclosure, the first contact hole CH1 may be included in the passivation layer PSV formed in the first island IS1, and the second contact hole CH2 may be included in the passivation layer PSV formed in the first bridge BR1.

In one or more embodiments of the present disclosure, the passivation layer PSV may have a shape corresponding to the shape of the base layer BS.

Referring to FIGS. 1, 2A, 2B, 3A to 6B, 7A, 8, 9A, 10, 16B, 17A, and 17B, the first bank BNK1 and the second bank BNK2 are formed on the passivation layer PSV of the first sub-pixel SP1. In one or more embodiments of the present disclosure, the first bank BNK1 may be formed on the passivation layer PSV formed in the first island IS1. The second bank BNK2 may be formed on the passivation layer PSV formed in each of the first and third bridges BR1 and BR3.

The first bank BNK1 may be spaced from an adjacent first bank BNK1 (e.g., spaced by a predetermined distance) on the passivation layer PSV. In a plan view, the first bank BNK1 may extend in the second direction DR2 and have a shape bent at least one or more times, but the present disclosure is not limited thereto. The first bank BNK1 may be formed of an inorganic insulating layer including inorganic material, or an organic insulating layer including organic material.

The second bank BNK2 may be spaced from an adjacent second bank BNK2 (e.g., spaced by a predetermined distance) on the passivation layer PSV. In a plan view, the second bank BNK2 may extend in the first direction DR1. The second bank BNK2 may have material identical with that of the first bank BNK1 and be formed through a process identical therewith.

In one or more embodiments of the present disclosure, the first bank BNK1 and the second bank BNK2 may be integrally provided and connected with each other. For example, the second bank BNK2 on the passivation layer PSV formed in the first bridge BR1 may be connected to one side of the first bank BNK1 on the passivation layer PSV formed in the first island IS1. The second bank BNK2 on the passivation layer PSV formed in the third bridge BR3 may be connected to the other side of the first bank BNK1 on the passivation layer PSV at the first island IS1.

Referring to FIGS. 1, 2A, 2B, 3A to 6B, 7A, 8, 9A, 10, 16C, and 17A to 17C, the first and second electrodes EL1 and EL2 and the first and second sub-electrodes CL1 and CL2 that include conductive material having high reflectivity are formed on the passivation layer PSV including the first and second banks BNK1 and BNK2.

The first electrode EL1 may include a 1-1-th electrode EL1_1 formed on the first bank BNK1, and a 1-2-th electrode EL12 formed on the second bank BNK2. The 1-1-th electrode EL1_1 may be electrically connected, through the first contact hole CH1, with the pixel circuit 144 included in the pixel circuit layer PCL formed in the first island IS1. For example, the 1-1-th electrode EL1_1 may be electrically connected with the second terminal DE of the first transistor T1 (T) of the pixel circuit 144 through the first contact hole CH1.

The second electrode EL2 may include a 2-1-th electrode EL2_1 formed on the first bank BNK1, and a 2-2-th electrode EL2_2 formed on the second bank BNK2. The 2-2-th electrode EL2_2 may be electrically connected, through the second contact hole CH2, to the driving voltage line DVL included in the pixel circuit layer PCL formed in the first bridge BR1.

The first sub-electrode CL1 may include a 1-1-th sub-electrode CL1_1 formed on the first bank BNK1, and a 1-2-th sub-electrode CL1_2 formed on the second bank BNK2. The second sub-electrode CL2 may include a 2-1-th sub-electrode CL2_1 formed on the first bank BNK1, and a 2-2-th sub-electrode CL2_2 formed on the second bank BNK2.

The first and second electrodes EL1 and EL2 and the first and second sub-electrodes CL1 and CL2 each may be provided in common to the first sub-pixel SP1 and sub-pixels disposed in a pixel row identical with that of the first sub-pixel SP1. In other words, the first sub-pixel SP1 and the second sub-pixel SP2 that are disposed in an identical pixel row in the first direction DR1 may be connected in common to each of the first and second electrodes EL1 and EL2 and the first and second sub-electrodes CL1 and CL2. For example, the first electrode EL1 of the first sub-pixel SP1 and the first electrode EL1 of the second sub-pixel SP2 may be connected to each other. The second electrode EL2 of the first sub-pixel SP1 and the second electrode EL2 of the second sub-pixel SP2 may be connected to each other. Furthermore, the first sub-electrode CL1 of the first sub-pixel SP1 and the first sub-electrode CL1 of the second sub-pixel SP2 may be connected to each other. The second sub-electrode CL2 of the first sub-pixel SP1 and the second sub-electrode CL2 of the second sub-pixel SP2 may be connected to each other.

In a plan view, the first and second electrodes EL1 and EL2 and the first and second sub-electrodes CL1 and CL2 each may extend in one direction and have a shape bent at a boundary point between the first island IS1 and the first bridge BR1 and at a boundary point between the first island IS1 and the third bridge BR3.

Referring to FIGS. 1, 2A, 2B, 3A to 6B, 7A, 8, 9A, 10, 16D, and 17A to 17D, an insulating material layer INSM is formed on the passivation layer PSV including the first and second electrodes EL1 and EL2 and the first and second sub-electrodes CL1 and CL2. The insulating material layer INSM may be formed of an inorganic insulating layer including inorganic material, or an organic insulating layer including organic material.

Subsequently, the first and second electrodes EL1 and EL2 and the first and second sub-electrodes CL1 and CL2 are respectively supplied with corresponding alignment signals (or alignment voltages) so that an electric field is formed between two adjacent electrodes. In one or more embodiments of the present disclosure, a first alignment signal (or a first alignment voltage) may be applied to each of the first electrode EL1 and the second sub-electrode CL2. A second alignment signal (or a second alignment voltage) having a voltage level different from that of the first alignment signal may be applied to each of the first sub-electrode CL1 and the second electrode EL2. For example, in case that DC power or AC power having a suitable voltage (e.g., a set or predetermined voltage) and period is repeatedly applied several times to each of the first electrode EL1, the first sub-electrode CL1, the second sub-electrode CL2, and the second electrode EL2, an electric field may be formed between two adjacent electrodes of the first electrode EL1, the first sub-electrode CL1, the second sub-electrode CL2, and the second electrode EL2 by a difference in potential between the two adjacent electrodes.

While the electric fields are formed between the first electrode EL1 and the first sub-electrode CL1, between the first sub-electrode CL1 and the second sub-electrode CL2, and between the second sub-electrode CL2 and the second electrode EL2, a mixed solution including light emitting elements LD are supplied onto the insulating material layer INSM by an inkjet printing method or the like. For example, an inkjet nozzle is disposed on the insulating material layer INSM, and a solvent mixed with a plurality of light emitting elements LD may be supplied onto the insulating material layer INSM. Here, the solvent may be any one of acetone, water, alcohol, and toluene, but the present disclosure is not limited thereto. For example, the solvent may have the form of ink or paste. A method of supplying the light emitting elements LD is not limited to that of the foregoing embodiment. The method of supplying the light emitting elements LD may be changed in various ways.

After the supply of the light emitting elements LD has been completed, the solvent may be removed.

If the light emitting elements LD are supplied, self-alignment of the light emitting elements LD may be induced by the electric fields formed between the first electrode EL1 and the first sub-electrode CL1, between the first sub-electrode CL1 and the second sub-electrode CL2, and between the second sub-electrode CL2 and the second electrode EL2. Consequently, the light emitting elements LD may be aligned each between the first electrode EL1 and the first sub-electrode CL1, between the first sub-electrode CL1 and the second sub-electrode CL2, and between the second sub-electrode CL2 and the second electrode EL2. The light emitting elements LD may be aligned (or disposed) on the insulating material layer INSM.

The first sub-pixel SP1 may include an emission area EMA from which light may be emitted through the aligned (or disposed) light emitting elements LD. The emission area EMA of the first sub-pixel SP1 may include a first emission area MEMA from which light may be emitted by the light emitting elements LD aligned (or disposed) in the first island IS1, and a second emission area SEMA from which light is emitted by the light emitting elements LD aligned (or disposed) in the first and third bridges BR1 and BR3. In other words, the emission area EMA of the first sub-pixel SP1 may include the first emission area MEMA and the second emission area SEMA.

Referring to FIGS. 1, 2A, 2B, 3A to 6B, 7A, 8, 9A, 10, 16E, and 17A to 17E, after the light emitting elements LD are aligned, the second insulating layer INS2 may be formed on each of the light emitting elements LD. The second insulating layer INS2 may cover at least a portion of an upper surface of each of the light emitting elements LD such that the opposite ends EP1 and EP2 of each of the light emitting elements LD may be exposed to the outside.

The first insulating layer INS1 may be formed, through a process of forming the second insulating layer INS2 or an etching process to be performed before or after the process, by etching the insulating material layer INSM such that a portion of each of the first and second electrodes EL1 and EL2 and the first and second sub-electrodes CL1 and CL2 is exposed.

During the process of forming the first insulating layer INS1, the first electrode EL1, and the first and second sub-electrodes CL1 and CL2 are separated from each other between the first sub-pixel SP1 and the sub-pixels adjacent thereto by a laser cutting scheme, an etching scheme using a mask, or the like so that the first sub-pixel SP1 may be driven independently (or individually) from the adjacent sub-pixels. Hence, the first electrode EL1 of the first sub-pixel SP1 may be electrically and/or physically separated from the first electrode EL1 of the sub-pixel that is adjacent to the first sub-pixel SP1, e.g., the first electrode EL1 of the second sub-pixel SP2. Furthermore, each of the first and second sub-electrodes CL1 and CL2 of the first sub-pixel SP1 may be separated from each of the first and second sub-electrodes CL1 and CL2 of the second sub-pixel SP2.

In sectional and plan views, the light emitting elements LD may be disposed on the first insulating layer INS1 between two adjacent electrodes.

Referring to FIGS. 1, 2A, 2B, 3A to 6B, 7A, 8, 9A, 10, 16F, and 17A to 17F, the first to fourth contact electrodes CNE1 to CNE4 are formed on the first and second insulating layers INS1 and INS2.

The first contact electrode CNE1 may be directly disposed on the first electrode EL1 and one end of the opposite ends EP1 and EP2 of each of the light emitting elements LD aligned between the first electrode EL1 and the first sub-electrode CL1. The first contact electrode CNE1 may include a 1-1-th contact electrode CNE1_1 disposed in the first island IS1, and a 1-2-th contact electrode CNE1_2 disposed in each of the first and third bridges BR1 and BR3.

The second contact electrode CNE2 may directly disposed on the other end of each of the light emitting elements LD aligned between the first electrode EL1 and the first sub-electrode CL1, the first sub-electrode CL1 and one end of the opposite ends EP1 and EP2 of each of the light emitting elements LD aligned between the first sub-electrode CL1 and the second sub-electrode CL2. The second contact electrode CNE2 may include a 2-1-th contact electrode CNE2_1 disposed in the first island IS1, and a 2-2-th contact electrode CNE2_2 disposed in each of the first and third bridges BR1 and BR3.

The third contact electrode CNE3 may be directly disposed on the other end of each of the light emitting elements LD aligned between the first and second sub-electrodes CL1 and CL2, the second sub-electrode CL2, and one end of the opposite ends of each of the light emitting elements LD aligned between the second sub-electrode CL2 and the second electrode EL2. The third contact electrode CNE3 may include a 3-1-th contact electrode CNE3_1 disposed in the first island IS1, and a 3-2-th contact electrode CNE3_2 disposed in each of the first and third bridges BR1 and BR3.

The fourth contact electrode CNE4 may be directly disposed on the second electrode EL2 and the other end of each of the light emitting elements LD aligned between the second sub-electrode CL2 and the second electrode EL2. The fourth contact electrode CNE4 may include a 4-1-th contact electrode CNE4_1 disposed in the first island IS1, and a 4-2-th contact electrode CNE4_2 disposed in each of the first and third bridges BR1 and BR3.

Referring to FIGS. 1, 2A, 2B, 3A to 6B, 7A, 8, 9A, 10, and 17A to 17G, the third insulating layer INS3 is formed on the first to fourth contact electrodes CNE1 to CNE4. The third insulating layer INS3 may be an encapsulation layer ENC including a plurality of insulating layers that covers the display element layer DPL including the light emitting elements LD. For example, the third insulating layer INS3 (ENC) may have a structure formed by alternately stacking at least one inorganic layer and at least one organic layer.

Thereafter, the carrier substrate CSUB is separated from the auxiliary substrate ASUB by a laser, so that the carrier substrate CSUB is removed. Subsequently, the auxiliary substrate ASUB is removed from the protective mask PMK by performing a dry etching process or the like, and then the protective film layer PFL is formed on one surface of the protective mask PMK.

Figure 18A:
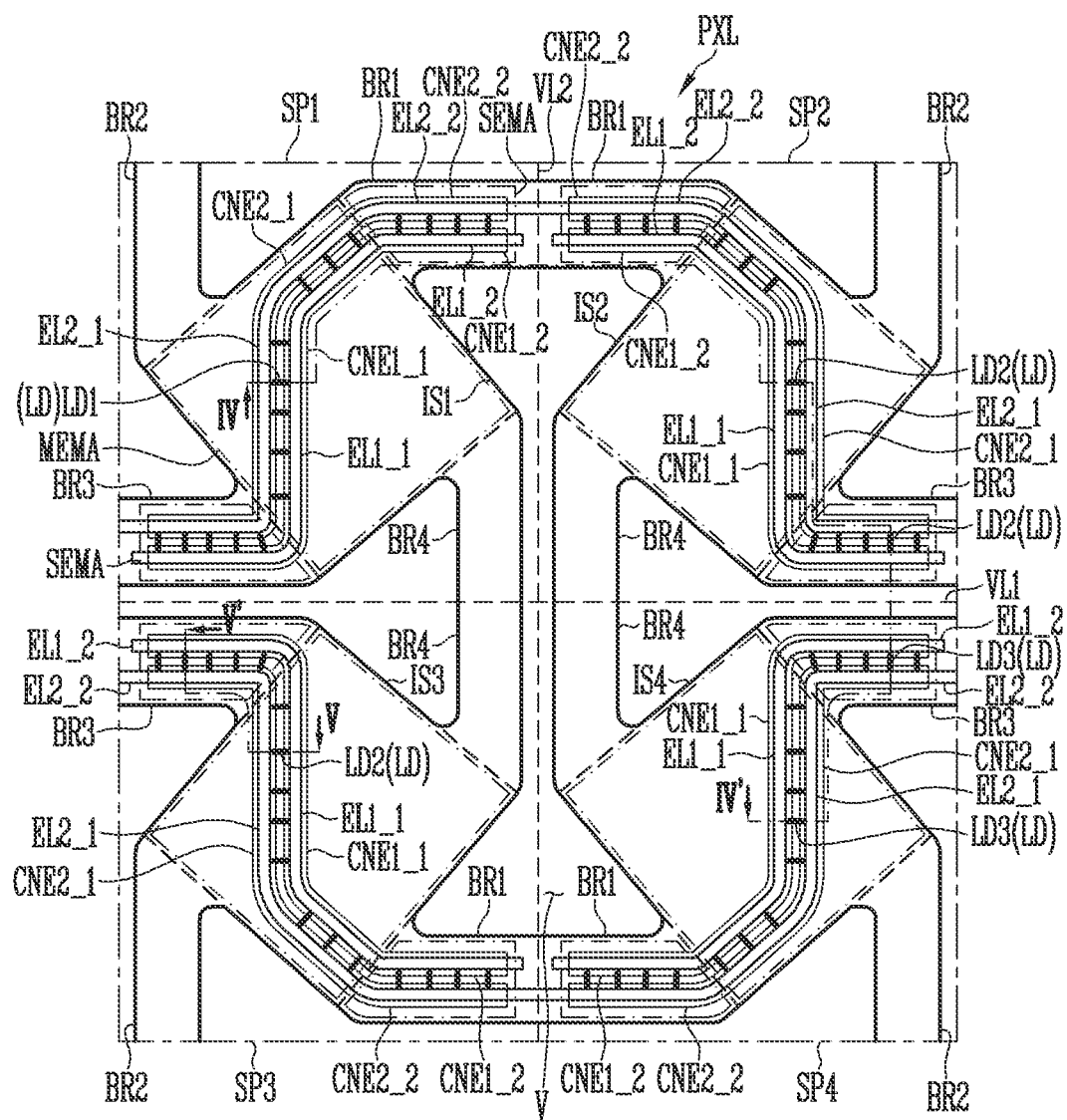
FIG. 18A is a plan view schematically illustrating one pixel of the pixels shown in FIG. 1.
Figure 18A:
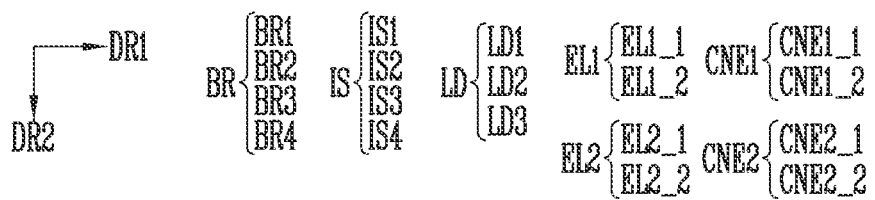
Figure 18B:
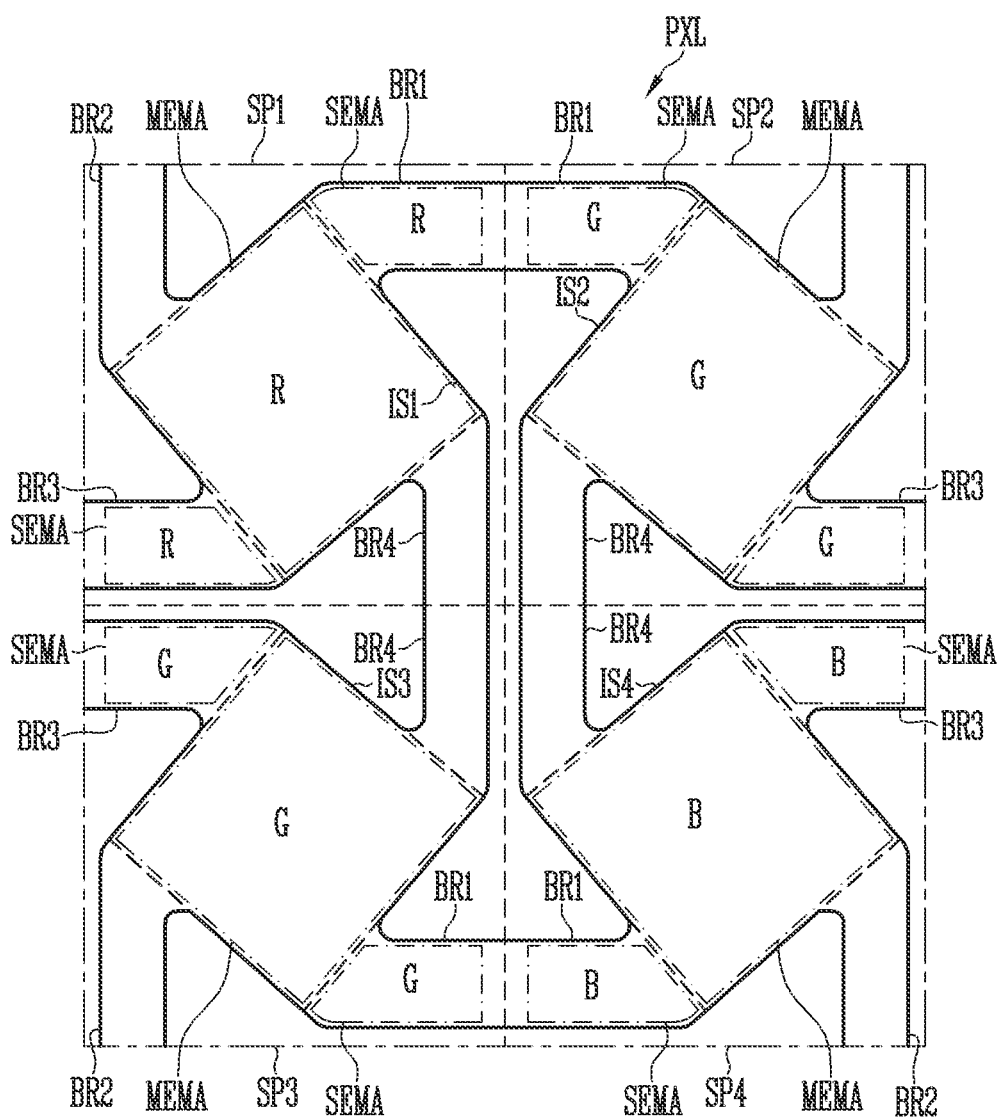
FIG. 18B is a plan view schematically illustrating emission areas of first to fourth sub-pixels of FIG. 18A
Figure 19:
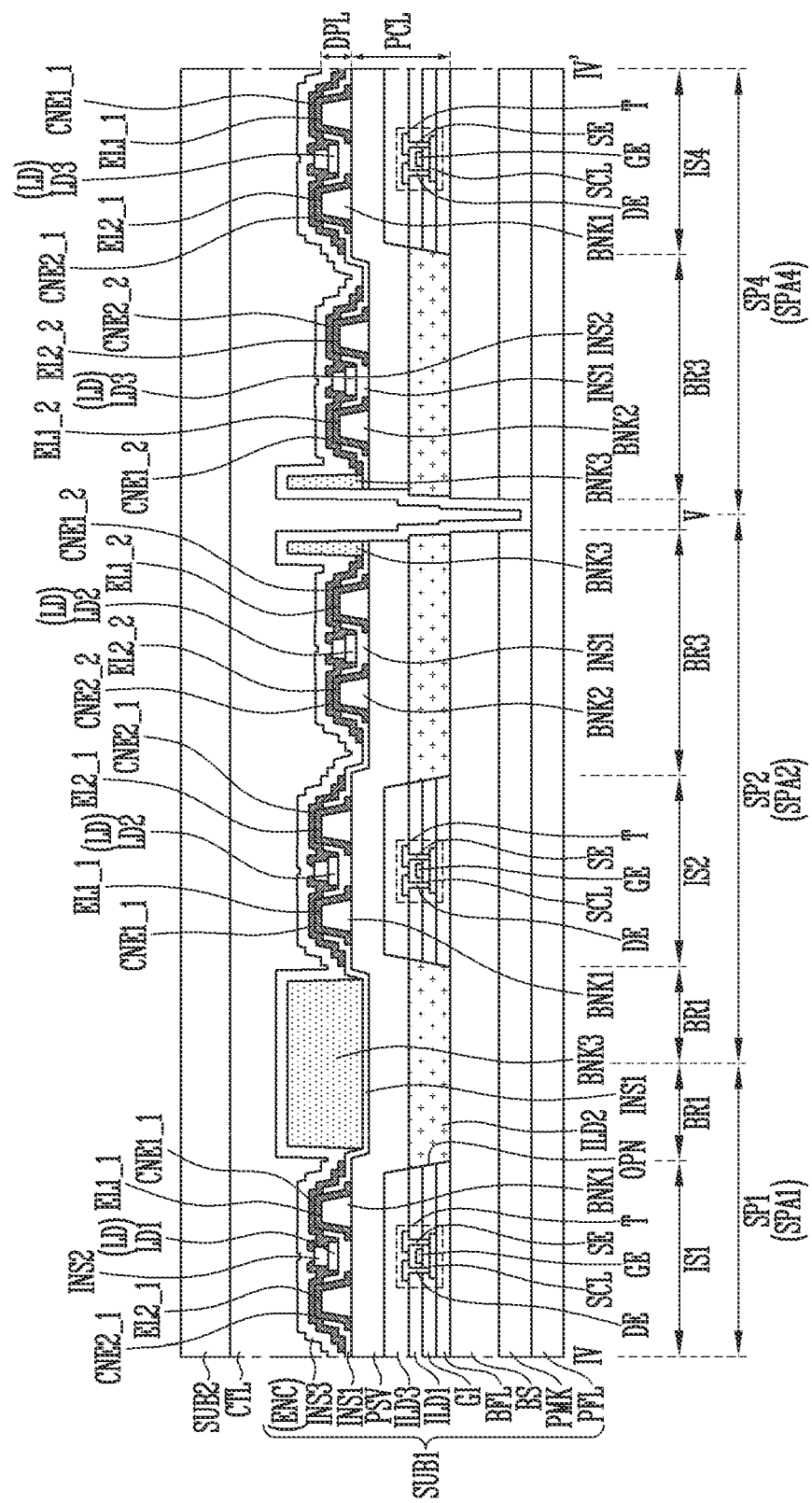
FIG. 19 is a sectional view taken along the line IV-IV of FIG. 18A.

FIG. 18A is a plan view schematically illustrating one pixel of the pixels shown in FIG. 1. FIG. 18B is a plan view schematically illustrating emission areas of first to fourth sub-pixels of FIG. 18A. FIG. 19 is a sectional view taken along line IV-IV of FIG. 18A.

To avoid redundant explanation, the description of the pixel of FIGS. 18A, 18B, and 19 will be focused on differences from that of the foregoing embodiments. Components that are not separately explained in the following description of the present embodiment comply with that of the foregoing embodiments. The same reference numeral will be used to designate the same component, and a similar reference numeral will be used to designate a similar component.

Referring to FIGS. 1, 18A, 18B, and 19, the display device in accordance with one or more embodiments of the present disclosure may include a first substrate SUB1 on which at least one pixel PXL including first to fourth sub-pixels SP1 to SP4 is provided, and a second substrate SUB2 connected with the first substrate SUB1.

In one or more embodiments of the present disclosure, the first substrate SUB1 may include a protective film layer PFL, a protective mask PMK, a base layer BS, a pixel circuit layer PCL, and a display element layer DPL.

The base layer BS may include a flexible substrate, and may include a plurality of island IS, a bridge BR, and a slit V.

The pixel PXL may be formed and/or provided in a pixel area defined on the base layer BS. The pixel area may include a first sub-pixel area SPA1 in which the first sub-pixel SP1 is formed and/or provided, a second sub-pixel area SPA2 in which a second sub-pixel SP2 is formed and/or provided, a third sub-pixel area in which the third sub-pixel SP3 is formed and/or provided, and a fourth sub-pixel area SPA4 in which the fourth sub-pixel SP4 is formed and/or provided.

In one or more embodiments of the present disclosure, the first sub-pixel SP1 may be a red sub-pixel configured to emit red light (R). Each of the second and third sub-pixels SP2 and SP3 may be a green sub-pixel configured to emit green light (G). The fourth sub-pixel SP4 may be a blue sub-pixel configured to emit blue light (B).

The first sub-pixel SP1 may include a first island IS1 and a bridge BR connected to the first island IS1. The second sub-pixel SP2 may include a second island IS2 and a bridge BR connected to the second island IS2. The third sub-pixel SP3 may include a third island IS3 and a bridge BR connected to the third island IS3. The fourth sub-pixel SP4 may include a fourth island IS4 and a bridge BR connected to the fourth island IS4. In one or more embodiments of the present disclosure, the bridge BR connected to the island IS of each of the first to fourth sub-pixels SP1 to SP4 may include first to fourth bridges BR1 to BR4 that are respectively connected to four sides of the island IS.

The sub-pixel area of each of the first to fourth sub-pixels SP1 to SP4 may include an emission area EMA configured to emit light, and a peripheral area which encloses a perimeter of the emission area EMA. The emission area EMA of each of the first to fourth sub-pixels SP1 to SP4 may include a first emission area MEMA and a second emission area SEMA. The first emission area MEMA may be provided in the island IS of the corresponding sub-pixel. The second emission area SEMA may be provided in at least one or more bridges BR of the bridges BR of the corresponding sub-pixel.

The first emission area MEMA of each of the first to fourth sub-pixels SP1 to SP4 may include a pixel circuit layer PCL which includes at least one transistor T provided on the base layer BS and a passivation layer PSV configured to cover the transistor T, and a display element layer DPL provided on the pixel circuit layer PCL. The second emission area SEMA of each of the first to fourth sub-pixels SP1 to SP4 may include a pixel circuit layer PCL which includes at least one or more lines (refer to LP of FIG. 15) provided on the base layer BS and a passivation layer PSV configured to cover the lines LP, and a display element layer DPL provided on the pixel circuit layer PCL.

The display element layer DPL provided in the emission area EMA of each of the first to fourth sub-pixels SP1 to SP4 may include first and second banks BNK1 and BNK2, first and second electrodes EL1 and EL2, a plurality of light emitting elements LD, and first and second contact electrodes CNE1 and CNE2.

The first bank BNK1 may be provided in the first emission area MEMA of each of the first to fourth sub-pixels SP1 to SP4. The second bank BNK2 may be provided in the second emission area SEMA of each of the first to fourth sub-pixels SP1 to SP4.

The first electrode EL1 may include a 1-1-th electrode EL1_1 provided in the first emission area MEMA of each of the first to fourth sub-pixels SP1 to SP4, and a 1-2-th electrode EL12 provided in the second emission area SEMA of each of the first to fourth sub-pixels SP1 to SP4. The second electrode EL2 may include a 2-1-th electrode EL2_1 provided in the first emission area MEMA of each of the first to fourth sub-pixels SP1 to SP4, and a 2-2-th electrode EL2_2 provided in the second emission area SEMA of each of the first to fourth sub-pixels SP1 to SP4.

The first contact electrode CNE1 may include a 1-1-th contact electrode CNE1_1 provided in the first emission area MEMA of each of the first to fourth sub-pixels SP1 to SP4, and a 1-2-th contact electrode CNE1_2 provided in the second emission area SEMA of each of the first to fourth sub-pixels SP1 to SP4. The second contact electrode CNE2 may include a 2-1-th contact electrode CNE2_1 provided in the first emission area MEMA of each of the first to fourth sub-pixels SP1 to SP4, and a 2-2-th contact electrode CNE2_2 provided in the second emission area SEMA of each of the first to fourth sub-pixels SP1 to SP4.

The light emitting elements LD may be disposed between the first electrode EL1 and the second electrode EL2 in the emission area EMA of each of the first to fourth sub-pixels SP1 to SP4. For example, the light emitting elements LD may be disposed between the 1-1-th electrode EL1_1 and the 2-1-th electrode EL2_1 in the first emission area MEMA of each of the first to fourth sub-pixels SP1 to SP4. Furthermore, the light emitting elements LD may be disposed between the 1-2-th electrode EL1_2 and the 2-2-th electrode EL2_2 in the second emission area SEMA of each of the first to fourth sub-pixels SP1 to SP4.

In one or more embodiments of the present disclosure, the light emitting elements LD may include first light emitting elements LD1 (LD) aligned in the emission area EMA of the first sub-pixel SP1, second light emitting elements LD2 (LD) aligned in the emission area EMA of each of the second and third sub-pixels SP2 and SP3, and third light emitting elements LD3 (LD) aligned in the emission area EMA of the fourth sub-pixel SP4.

The first light emitting elements LD1 (LD), the second light emitting elements LD2 (LD), and the third light emitting elements LD3 (LD) may emit different colors of light. For example, the first light emitting elements LD1 (LD) may emit red light (R), the second light emitting elements LD2 (LD) may emit green light (G), and the third light emitting elements LD3 (LD) may emit blue light (B). Because the first light emitting elements LD1 (LD), the second light emitting elements LD2 (LD), and the third light emitting elements LD3 (LD) may emit different colors of light, a light conversion pattern layer configured to convert light emitted from the display element layer DPL of the pixel PXL to a specific color of light may be omitted.

The third insulating layer INS3 may be disposed on the first to fourth contact electrodes CNE1 to CNE4 provided in the emission area EMA of each of the first to fourth sub-pixels SP1 to SP4.

The third insulating layer INS3 may entirely cover the display element layer DPL provided in the island IS of each of the first to fourth sub-pixels SP1 to SP4. Furthermore, the third insulating layer INS3 may entirely cover the structures provided in the bridge BR of each of the first to fourth sub-pixels SP1 to SP4. For example, the third insulating layer INS3 may cover the 1-2-th to 4-2-th contact electrodes CNE1_2 to CNE4_2 provided in the first and third bridges BR1 and BR3 each of the first to fourth sub-pixels SP1 to SP4. Furthermore, the third insulating layer INS3 may cover one area of the protective mask PMK exposed through the slit V of the base layer BS, but the present disclosure is not limited thereto. In one or more embodiments, the third insulating layer INS3 may cover only the structures respectively provided in the island IS and the bridge BR of each of the first to fourth sub-pixels SP1 to SP4 rather than covering the slit V of the base layer BS. In this case, one area of the protective mask PMK may be exposed to the outside.

Although for the sake of explanation FIG. 19 illustrates that the third insulating layer INS3 is provided to cover the entirety of the display element layer DPL included in the first to fourth sub-pixels SP1 to SP4, the present disclosure is not limited thereto. In one or more embodiments, the third insulating layer INS3 of the first sub-pixel SP1 may cover only the display element layer DPL in the first island IS1. The third insulating layer ISN3 of the second sub-pixel SP2 may cover only the display element layer DPL of the second island IS2. The third insulating layer INS3 of the third sub-pixel SP3 may cover only the display element layer DPL in the third island IS3. The third insulating layer INS3 of the fourth sub-pixel SP4 may cover only the display element layer DPL in the fourth island IS4.

Some components of the display element layer DPL may also be provided in the peripheral area of each of the first to fourth sub-pixels SP1 to SP4. For example, a third bank BNK3 may be provided in the peripheral area of each of the first to fourth sub-pixels SP1 to SP4. The third bank BNK3 may be a structure of defining the emission area EMA of each of the first to fourth sub-pixels SP1 to SP4, and may be a pixel defining layer. The third bank BNK3 may include at least one light shielding material and/or reflective material and thus prevent a light leakage defect, in which light (or rays) leaks between adjacent sub-pixels, from occurring.

The second substrate SUB2 may be disposed on the first substrate SUB1 to cover a display area DA in which the pixel PXL is provided. The second substrate SUB2 may form an upper substrate (e.g., an encapsulation substrate or a thin-film encapsulation layer) and/or a window component of the display device. In one or more embodiments, the second substrate SUB2 may be a rigid substrate or a flexible substrate, and the material or properties thereof are not particularly limited. Furthermore, the second substrate SUB2 may be formed of the same material as that of the base layer BS of the first substrate SUB1, or may be formed of material different from that of the base layer BS.

The second substrate SUB2 may be connected to the first substrate SUB1 through an intermediate layer CTL.

The intermediate layer CTL may be provided between the first substrate SUB1 and the second substrate SUB2. The intermediate layer CTL may protect, between the first substrate SUB1 and the second substrate SUB2, the display element layer DPL included in the first substrate SUB1 and bond the first substrate SUB1 to the second substrate SUB2. The intermediate layer CTL may have viscosity or adhesion to perform the bonding function. Furthermore, the intermediate layer CTL may be made of transparent material to allow an image to be transmitted to the second substrate SUB2. In addition, the intermediate layer CTL may be formed of insulating material and have flexibility.

The kind of material of the intermediate layer CTL is not limited so long as the intermediate layer CTL is made of a material which can protect the display element layer DPL in the first substrate SUB1 and function to bond the first substrate SUB1 to the second substrate SUB2. For example, the intermediate layer CTL may be formed of organic material.

As described above, each of the first to fourth sub-pixels SP1 to SP4 may include, as the emission area EMA, not only the first emission area MEMA provided in the island IS of the corresponding sub-pixel but also the second emission area SEMA provided in each of the first and third bridge BR1 and BR3 connected to the island IS, so that the emission surface area from which light is ultimately emitted may be further increased. Hence, the entire light output efficiency of the display device may be enhanced, so that the quality of an image displayed on the display device can be improved.

In the foregoing embodiment, there has been described the display device in which the first light emitting elements LD1 (LD), the second light emitting elements LD2 (LD), and the third light emitting elements LD3 (LD) may emit different colors of light. In one or more embodiments, the display device may include light emitting elements LD configured to emit the same color of light. Hereinafter, an embodiment in which light emitting elements LD disposed in each of the first to fourth sub-pixels SP1 to SP4 may emit the same color of light.

Figure 20:
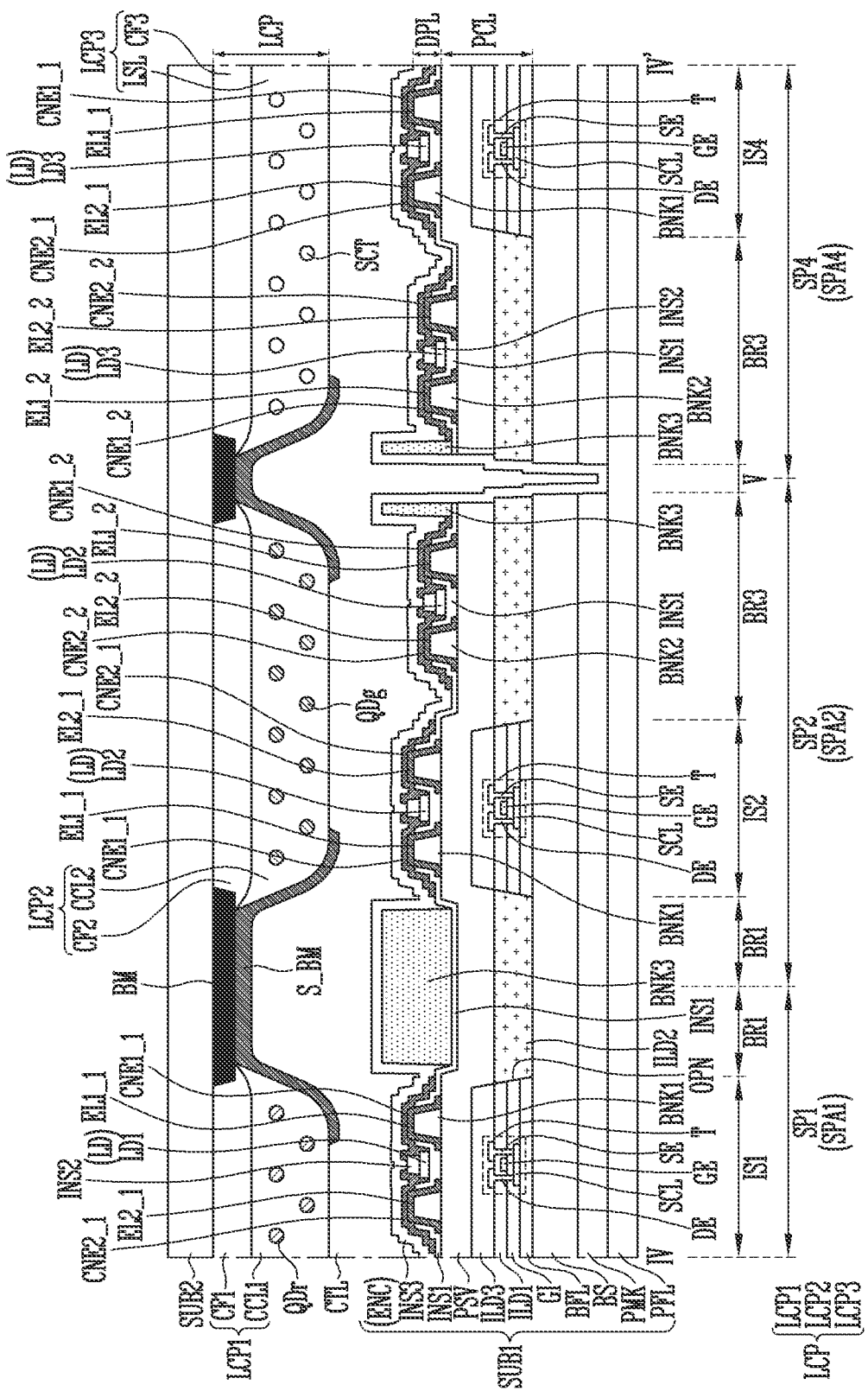
FIG. 20 illustrates a display device in accordance with one or more embodiments of the present disclosure, and is a sectional view corresponding to the line IV-IV of FIG. 18A.
Figure 21:
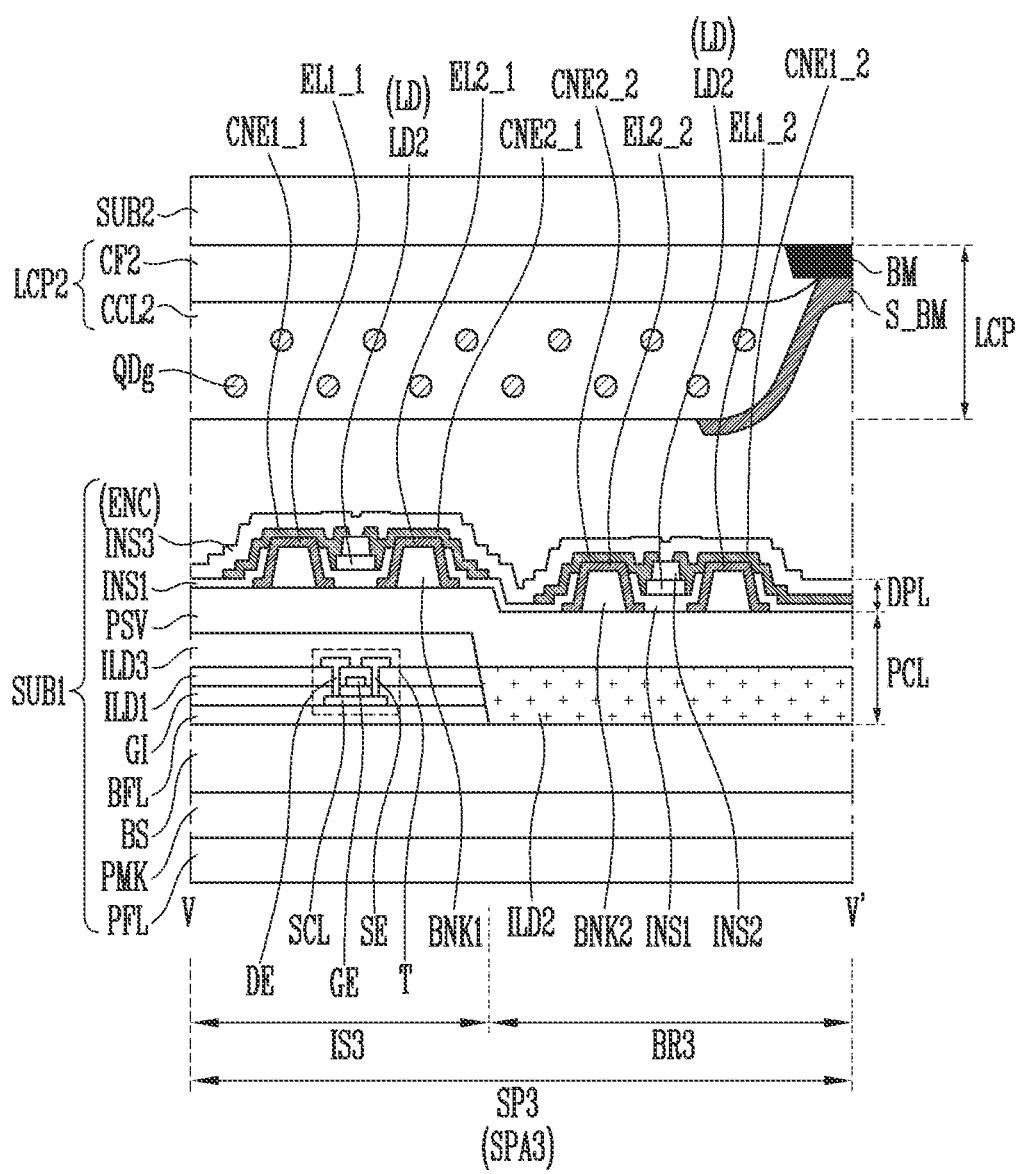
FIG. 21 is a sectional view taken along the line V-V of FIG. 18A.

FIG. 20 illustrates a display device in accordance with one or more embodiments of the present disclosure, and is a sectional view corresponding to line IV-IV of FIG. 18A. FIG. 21 is a sectional view taken along line V-V of FIG. 18A.

In FIGS. 20 and 21, because a first substrate SUB1 has the same configuration as that of the first substrate SUB1 illustrated in FIG. 19, detailed description thereof will be simplified, and components provided on a second substrate SUB2 will be mainly described.

To avoid redundant explanation, the description of each pixel illustrated in FIGS. 20 and 21 will be focused on differences from that of the foregoing embodiments. Components that are not separately explained in the following description of the present embodiment comply with that of the foregoing embodiments. The same reference numeral will be used to designate the same component, and a similar reference numeral will be used to designate a similar component.

Referring to FIGS. 1, 18A, 18B, 20, and 21, the display device in accordance with one or more embodiments of the present disclosure may include a first substrate SUB1 on which at least one pixel PXL including first to fourth sub-pixels SP1 to SP4 is provided, and a second substrate SUB2 connected with the first substrate SUB1.

In one or more embodiments of the present disclosure, the first substrate SUB1 may include a protective film layer PFL, a protective mask PMK, a base layer BS, a pixel circuit layer PCL, and a display element layer DPL.

The base layer BS may include a plurality of island IS, a bridge BR, and a slit V.

The pixel PXL may be formed and/or provided in a pixel area defined on the base layer BS. The pixel area may include a first sub-pixel area SPA1 in which the first sub-pixel SP1 is formed and/or provided, a second sub-pixel area SPA2 in which a second sub-pixel SP2 is formed and/or provided, a third sub-pixel area SPA3 in which the third sub-pixel SP3 is formed and/or provided, and a fourth sub-pixel area SPA4 in which the fourth sub-pixel SP4 is formed and/or provided.

In one or more embodiments of the present disclosure, the first sub-pixel SP1 may be a red sub-pixel configured to emit red light (R). Each of the second and third sub-pixels SP2 and SP3 may be a green sub-pixel configured to emit green light (G). The fourth sub-pixel SP4 may be a blue sub-pixel configured to emit blue light (B).

The display element layer DPL may include a plurality of light emitting elements LD disposed between the first electrode EL1 and the second electrode EL2 provided on the pixel circuit layer PCL.

The light emitting elements LD may include first light emitting elements LD1 (LD) disposed in the emission area EMA of the first sub-pixel SP1, second light emitting elements LD2 (LD) disposed in the emission area EMA of each of the second and third sub-pixels SP2 and SP3, and third light emitting elements LD3 (LD) disposed in the emission area EMA of the fourth sub-pixel SP4. In one or more embodiments of the present disclosure, the first light emitting elements LD1 (LD), the second light emitting elements LD2 (LD), and third light emitting elements LD3 (LD) may emit the same color of light. For example, the first light emitting elements LD1 (LD), the second light emitting elements LD2 (LD), and third light emitting elements LD3 (LD) may emit the same color of light, e.g., blue light.

The second substrate SUB2 may be disposed on the first substrate SUB1 to cover the display area DA in which the first to fourth sub-pixels SP1 to SP4 are disposed. The second substrate SUB2 may form an upper substrate (e.g., an encapsulation substrate or a thin-film encapsulation layer) and/or a window component of the display device. In one or more embodiments, the second substrate SUB2 may be a rigid substrate or a flexible substrate, and the material or properties thereof are not particularly limited. Furthermore, the second substrate SUB2 may be formed of the same material as that of the base layer BS of the first substrate SUB1, or may be formed of material different from that of the base layer BS.

The display device in accordance with one or more embodiments of the present disclosure may include a light conversion pattern layer LCP disposed on one surface of the second substrate SUB2 to face (or oppose) the first to fourth sub-pixels SP1 to SP4 of the first substrate SUB1.

In one or more embodiments, the light conversion pattern layer LCP may include a first light conversion pattern layer LCP1 disposed to face (or oppose) the first sub-pixel SP1, a second light conversion pattern layer LCP2 disposed to face (or oppose) each of the second and third sub-pixels SP2 and SP3, and a third light conversion pattern layer LCP3 disposed to face (or oppose) the fourth sub-pixel SP4.

In one or more embodiments, at least some of the first to third light conversion pattern layers LCP1 to LCP3 may include a color conversion layer and/or a color filter that corresponds to a predetermined color. For example, the first light conversion pattern layer LCP1 may include a first color conversion layer CCL1 including first color conversion particles corresponding to a first color, and a first color filter CF1 configured to allow the first color of light to selectively pass therethrough. Likewise, the second light conversion pattern layer LCP2 may include a second color conversion layer CCL2 including second color conversion particles corresponding to a second color, and a second color filter CF2 configured to allow the second color of light to selectively pass therethrough. The third light conversion pattern layer LCP3 may include at least one of a light scattering layer LSL including light scattering particles SCT, and a third color filter CF3 configured to allow the third color of light to selectively pass therethrough.

In one or more embodiments of the present disclosure, the light emitting elements LD aligned in the emission area EMA of each of the first to fourth sub-pixels SP1 to SP4 may emit the same color of light. A color conversion layer may be disposed over some sub-pixels of the first to fourth sub-pixels SP1 to SP4. For example, the first color conversion layer CCL1 may be disposed over the first sub-pixel SP1, and the second color conversion layer CCL2 may be disposed over each of the second and third sub-pixels SP2 and SP3. Consequently, the display device in accordance with one or more embodiments of the present disclosure may display a full-color image.

In one or more embodiments of the present disclosure, the first color conversion layer CCL1 may be disposed on one surface of the second substrate SUB2 to face (or oppose) the first sub-pixel SP1, and include first color conversion particles that convert the color of light emitted from first light emitting elements LD1 (LD) provided in the first sub-pixel SP1 to a first color of light. For example, in the case where the first sub-pixel SP1 is a red sub-pixel, the first color conversion layer CCL1 may include red quantum dots QDr that convert blue light emitted from the first light emitting elements LD1 (LD) to red light. If blue light is drawn into the first color conversion layer CCL1 including the red quantum dots QDr, the first color conversion layer CCL1 may absorb the blue light, shift the wavelength of the light by an energy transition, and emit red light.

In one or more embodiments of the present disclosure, the second color conversion layer CCL2 may be disposed on one surface of the second substrate SUB2 to face (or oppose) each of the second and third sub-pixels SP2 and SP3, and include second color conversion particles that convert the color of light emitted from second light emitting elements LD2 (LD) provided in each of the second and third sub-pixels SP2 and SP3 to a second color of light. For example, in case that each of the second and third sub-pixels SP2 and SP3 is a green sub-pixel, the second color conversion layer CCL2 may include green quantum dots QDg that convert blue light emitted from the second light emitting elements LD2 (LD) to green light. If blue light is drawn into the second color conversion layer CCL2 including the green quantum dots QDg, the second color conversion layer CCL2 may absorb the blue light, shift the wavelength of the light by an energy transition, and emit green light.

In one or more embodiments of the present disclosure, the red quantum dots QDr and the green quantum dots QDg may be selected from among a Group II-VI compound, a Group IV-VI compound, a group IV element, a Group IV compound, and a combination thereof.

The light scattering layer LSL may be disposed on one surface of the second substrate SUB2 to face (or oppose) the fourth sub-pixel SP4. For example, the light scattering layer LSL may be disposed between the fourth sub-pixel SP4 and the third color filter CF3.

The first color filter CF1 may be disposed between the first color conversion layer CCL1 and the second substrate SUB2 and include color filter material that allows the first color of light converted by the first color conversion layer CCL1 to selectively pass therethrough. For example, the first color filter CF1 may be a red color filter.

The second color filter CF2 may be disposed between the second color conversion layer CCL2 and the second substrate SUB2 and include color filter material that allows the second color of light converted by the second color conversion layer CCL2 to selectively pass therethrough. For example, the second color filter CF2 may be a green color filter.

The third color filter CF3 may be disposed on the light scattering layer LSL and one surface of the second substrate SUB2, and include color filter material that allows the color of light passing through the light scattering layer LSL to selectively pass therethrough. For example, the third color filter CF3 may be a blue color filter.

A black matrix BM may be disposed each between the first color filter CF1 and the second color filter CF2 and between the second color filter CF2 and the third color filter CF3. For example, the black matrix BM may be disposed on the second substrate SUB2 to overlap the third bank BNK3 in the first substrate SUB1. In one or more embodiments of the present disclosure, a sub-black matrix S_BM may be disposed each between the first color conversion layer CCL1 and the second color conversion layer CCL2 and between the second color conversion layer CCL2 and the light scattering layer LSL. For example, the sub-block matrix S_BM may be provided on the black matrix BM and include the same material as that of the black matrix BM. The sub-block matrix S_BM may be omitted depending on embodiments.

In one or more embodiments of the present disclosure, when blue light having a comparatively short wavelength in a visible ray area is incident on each of the red and green quantum dots QDr and QDg, the absorption coefficient of the red and green quantum dots QDr and QDg may be increased. Hence, the efficiency of light emitted from each of the first to fourth sub-pixels SP1 to SP4 may be enhanced, and satisfactory color reproducibility may be secured. Eventually, red light (R) may be emitted from each of the first and second emission areas MEMA and SEMA of the first sub-pixel SP1, green light (G) may be emitted from each of the first and second emission areas MEMA and SEMA of each of the second and third sub-pixels SP2 and SP3, and blue light (B) may be emitted from each of the first and second emission areas MEMA and SEMA of the fourth sub-pixel SP4.

Furthermore, in one or more embodiments of the present disclosure, each pixel PXL using the light emitting elements LD configured to emit the same color of light and the display device including the pixel PXL may be easily fabricated. Because the color conversion layer is disposed on at least some sub-pixels, a display device including full-color pixels PXL may be fabricated.

As described above, each of the first to fourth sub-pixels SP1 to SP4 may include, as the emission area EMA, not only the first emission area MEMA provided in the island IS of the corresponding sub-pixel but also the second emission area SEMA provided in each of the first and third bridge BR1 and BR3 connected to the island IS, so that the emission surface area from which light is ultimately emitted may be further increased. Hence, the entire light output efficiency of the display device may be enhanced, so that the quality of an image displayed on the display device can be improved.

Figure 22:
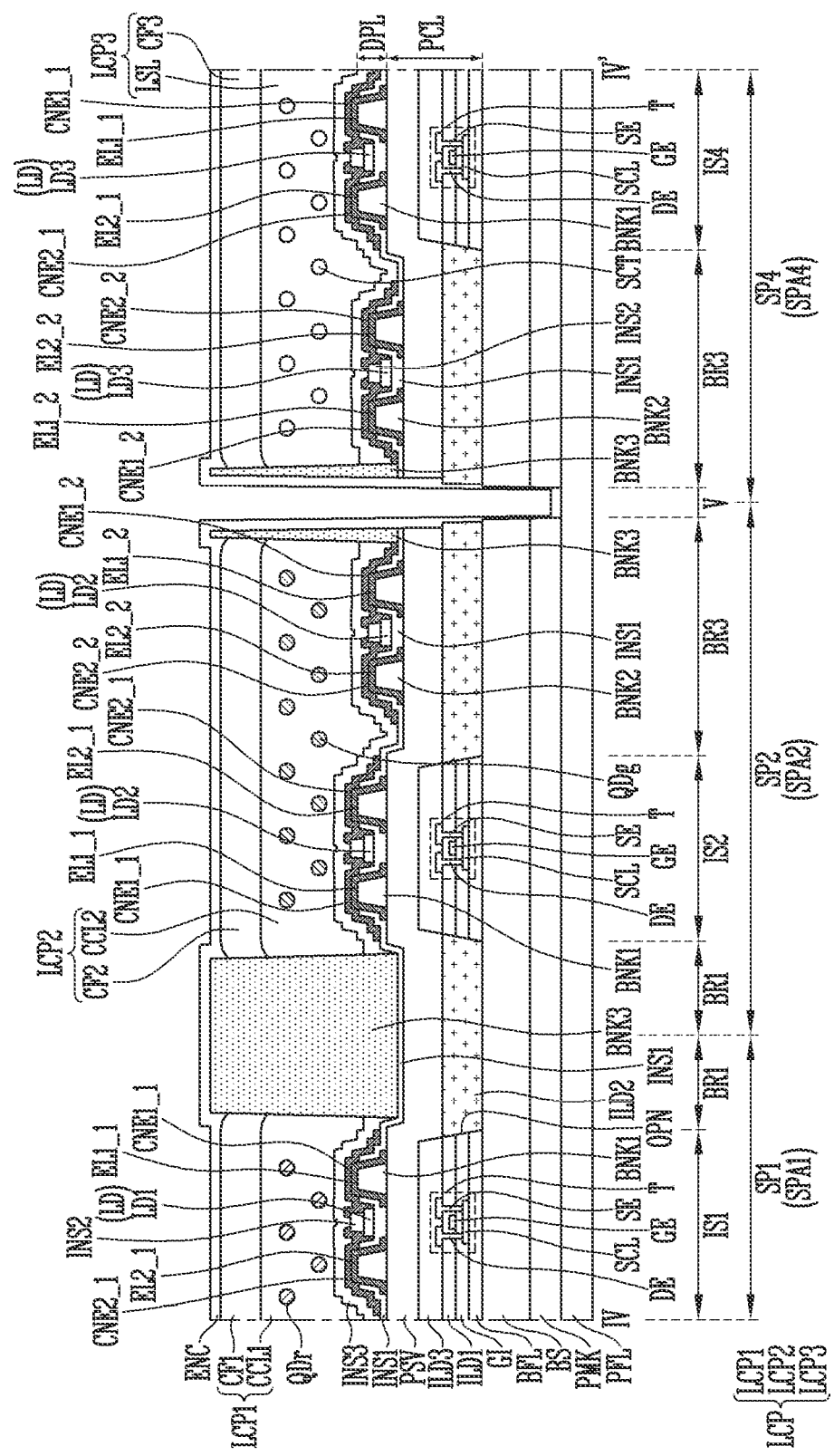
FIG. 22 illustrates a display device in accordance with one or more embodiments of the present disclosure, and is a sectional view corresponding to the line IV-IV of FIG. 18A.

FIG. 22 illustrates a display device in accordance with an embodiment of the present disclosure, and is a sectional view corresponding to the line IV-IV of FIG. 18A.

In FIG. 22, detailed description of configurations similar or identical to those of the embodiment of FIGS. 20 and 21 will be omitted.

Referring to FIGS. 1, 18A, 18B, and 22, the display device in accordance with one or more embodiments of the present disclosure may include a base layer BS on which at least one pixel PXL including first to fourth sub-pixels SP1 to SP4, and an encapsulation layer ENC connected with the base layer BS are disposed. Each of the first to fourth sub-electrodes SP1 to SP4 may include a light conversion pattern layer LCP disposed between the base layer BS and the encapsulation layer ENC.

The light conversion pattern layer LCP may include a first light conversion pattern layer LCP1 provided and/or formed on the display element layer DPL of the first sub-pixel SP1, a second light conversion pattern layer LCP2 provided and/or formed on the display element layer DPL of each of the second and third sub-pixels SP2 and SP3, and a third light conversion pattern layer LCP3 provided and/or formed on the display element layer DPL of the fourth sub-pixel SP4.

The first light conversion pattern layer LCP1 may include a first color conversion layer CCL1 including first color conversion particles QDr (e.g., red quantum dots) corresponding to red, and a first color filter CF1 configured to allow red light to selectively pass therethrough. The second light conversion pattern layer LCP2 may include a second color conversion layer CCL2 including second color conversion particles QDg (e.g., green quantum dots) corresponding to green, and a second color filter CF2 configured to allow green light to selectively pass therethrough. The third light conversion pattern layer LCP3 may include at least one or more of a light scattering layer LSL including light scattering particles SCT, and a third color filter CF3 configured to allow blue light to selectively pass therethrough.

The light emitting elements LD aligned in the emission areas MEMA and SEMA of each of the first to fourth sub-pixels SP1 to SP4 may emit the same color of light, e.g., blue light. A color conversion layer may be disposed in each of the first to third sub-pixels SP1 to SP3, and a light scattering layer LSL may be disposed in the fourth sub-pixel SP4. The display device in accordance with the embodiment of the present disclosure may display a full-color image.

A third bank BNK3 may be disposed in the peripheral area (or the non-emission area) of each of the first to fourth sub-pixels SP1 to SP4. For example, the third bank BNK3 may be provided in a peripheral area between two adjacent sub-pixels and define the emission areas MEMA and SEMA of each sub-pixel.

The first color conversion layer CCL1 may be directly formed on the display element layer DPL in the first island IS1 of the first sub-pixel SP1 and provided to have a structure in which the emission areas MEMA and SEMA of the first sub-pixel SP1 are filled with the first color conversion layer CCL1. In other words, the first color conversion layer CCL1 may be provided to have a shape in which the first color conversion layer CCL1 covers the display element layer DPL of the first sub-pixel SP1 in the emission areas MEMA and SEMA that are defined by the third bank BNK3 disposed in the peripheral area between the first sub-pixel SP1 and sub-pixels adjacent thereto. In this case, light emitted from the light emitting elements LD, e.g., the first light emitting elements LD1, aligned in the emission areas MEMA and SEMA, may be directly incident on the first color conversion layer CCL1. The light that is incident on the first color conversion layer CCL1 may be converted to red light by the first color conversion particles QDr.

The first color filter CF1 may be disposed on the first color conversion layer CCL1, and allow red light converted by the first color conversion layer CCL1 to selectively pass therethrough.

The second color conversion layer CCL2 may be directly formed on the display element layer DPL in the second island IS2 of the second sub-pixel SP2 and provided to have a structure in which the emission areas MEMA and SEMA of the second sub-pixel SP2 are filled with the second color conversion layer CCL2. In other words, the second color conversion layer CCL2 may be provided to have a shape in which the second color conversion layer CCL2 covers the display element layer DPL of the second sub-pixel SP2 in the emission areas MEMA and SEMA that are defined by the third bank BNK3 disposed in the peripheral area between the second sub-pixel SP2 and sub-pixels adjacent thereto. In this case, light emitted from the light emitting elements LD, e.g., the second light emitting elements LD2, aligned in the emission areas MEMA and SEMA, may be directly incident on the second color conversion layer CCL2. The light that is incident on the second color conversion layer CCL2 may be converted to green light by the second color conversion particles QDg.

The second color filter CF2 may be disposed on the second color conversion layer CCL2, and allow green light converted by the second color conversion layer CCL2 to selectively pass therethrough.

In one or more embodiments, the second color conversion layer CCL2 may be directly formed on the display element layer DPL in the third island IS3 of the third sub-pixel SP3 and provided to have a structure in which the emission areas MEMA and SEMA of the third sub-pixel SP3 are filled with the second color conversion layer CCL2.

The light scattering layer LSL may be directly formed on the display element layer DPL in the fourth island IS4 of the fourth sub-pixel SP4 and provided to have a structure in which the emission areas MEMA and SEMA of the fourth sub-pixel SP4 are filled with the light scattering layer LSL. In other words, the light scattering layer LSL may be provided to have a shape in which the light scattering layer LSL covers the display element layer DPL of the fourth sub-pixel SP4 in the emission areas MEMA and SEMA that are defined by the third bank BNK3 disposed in the peripheral area between the fourth sub-pixel SP4 and sub-pixels adjacent thereto. Furthermore, the third color filter CF3 may be further provided on the light scattering layer LSL.

The third color filter CF3 may allow blue light emitted from the light emitting elements LD, e.g., the third light emitting elements LD3, disposed in the fourth sub-pixel SP4, to selectively pass therethrough.

The third bank BNK3 that is disposed in the peripheral area of each of the first to fourth sub-pixels SP1 to SP4 and defines the emission areas MEMA and SEMA of the corresponding sub-pixel may include light shielding material for preventing a light leakage defect in which light (or rays) leaks between adjacent sub-pixels. In this case, the third bank BNK3 may be a black matrix. Furthermore, the third bank BNK3 may prevent the colors of light emitted from respective adjacent sub-pixels from being mixed. In one or more embodiments, the third bank BNK3 may include reflective material and enable light emitted from the light emitting elements LD aligned in the emission areas MEMA and SEMA of each of the first to fourth sub-pixels SP1 to SP4 to more reliably travel in an image display direction of the display device, so that the light output efficiency of the light emitting elements LD can be enhanced.

As described above, as light emitted from each of the first to fourth sub-pixels SP1 to SP4 passes through the light conversion pattern layer LCP and is emitted to the outside through the encapsulation layer ENC, it can be realized that the display device may display an image. Here, the encapsulation layer ENC may be directly disposed on the light conversion pattern layer LCP. The light conversion pattern layer LCP may be provided to have a shape in which space between the third bank BNK3 and the encapsulation layer ENC in the emission areas MEMA and SEMA of each of the first to fourth sub-pixels SP1 to SP4 is filled with the light conversion pattern layer LCP. Therefore, the length of a light path along which light emitted from the light emitting elements LD is emitted to the outside through the encapsulation layer ENC may be reduced or minimized, so that the light efficiency may be improved or maximized. In addition, in the display device in according to the foregoing embodiment, the light conversion pattern layer LCP is directly formed on the display element layer DPL in the island IS of each of the first to fourth sub-pixels SP1 to SP4 rather than being formed on a separate substrate, so that the light conversion pattern layer LCP may be disposed in space defined by the third bank BNK3. Consequently, a process of fabricating the display device may be simplified.

Furthermore, in the display device in accordance with the foregoing embodiment, each of the first to fourth sub-pixels SP1 to SP4 may include not only the first emission area MEMA provided in the island IS of the corresponding sub-pixel but also the second emission area SEMA provided in some of the bridges BR connected to the island IS.

Figure 23A:
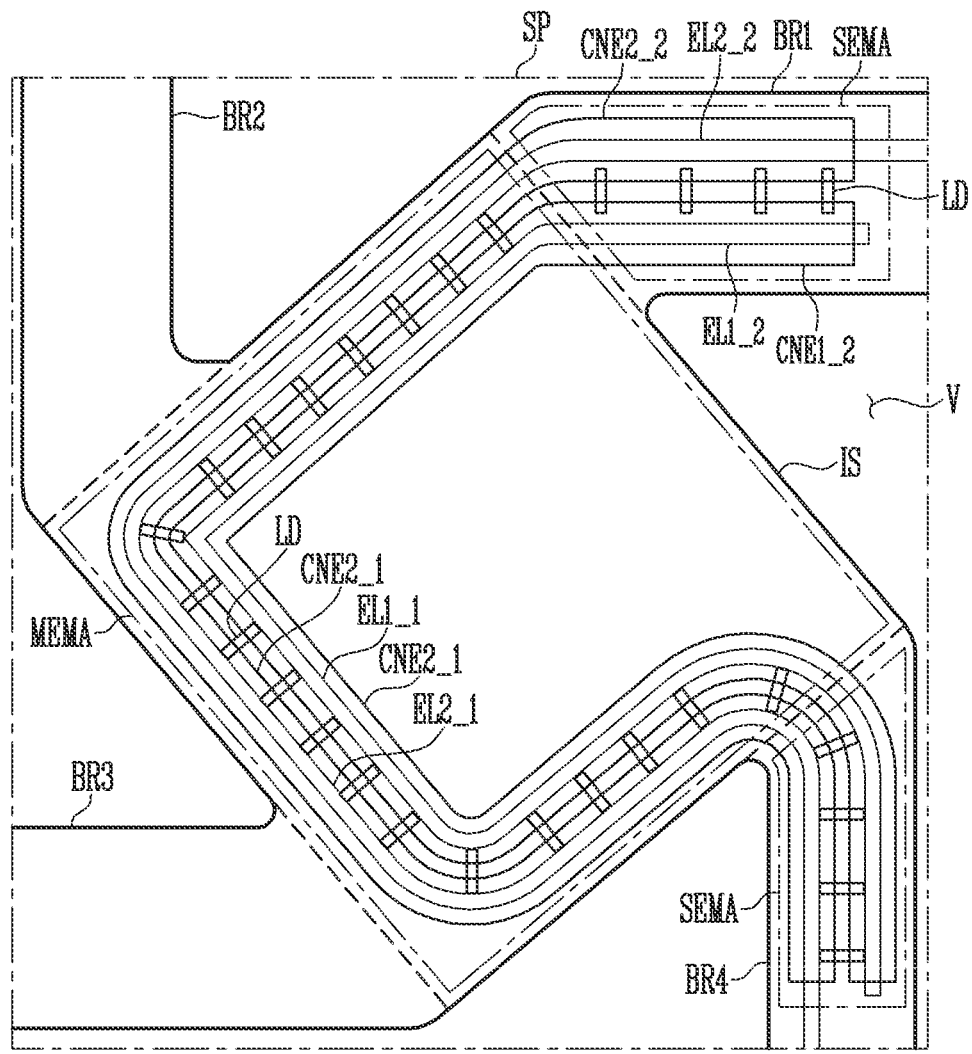
FIGS. 23A and 23B are plan views schematically illustrating a sub-pixel disposed in the display device in accordance with one or more embodiments of the present disclosure.
Figure 23A:
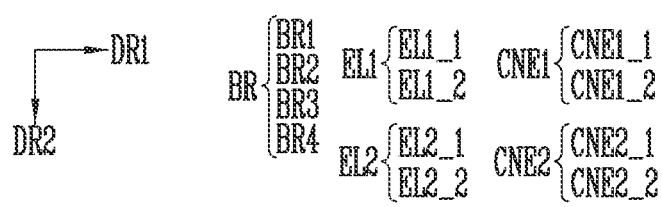
Figure 23B:
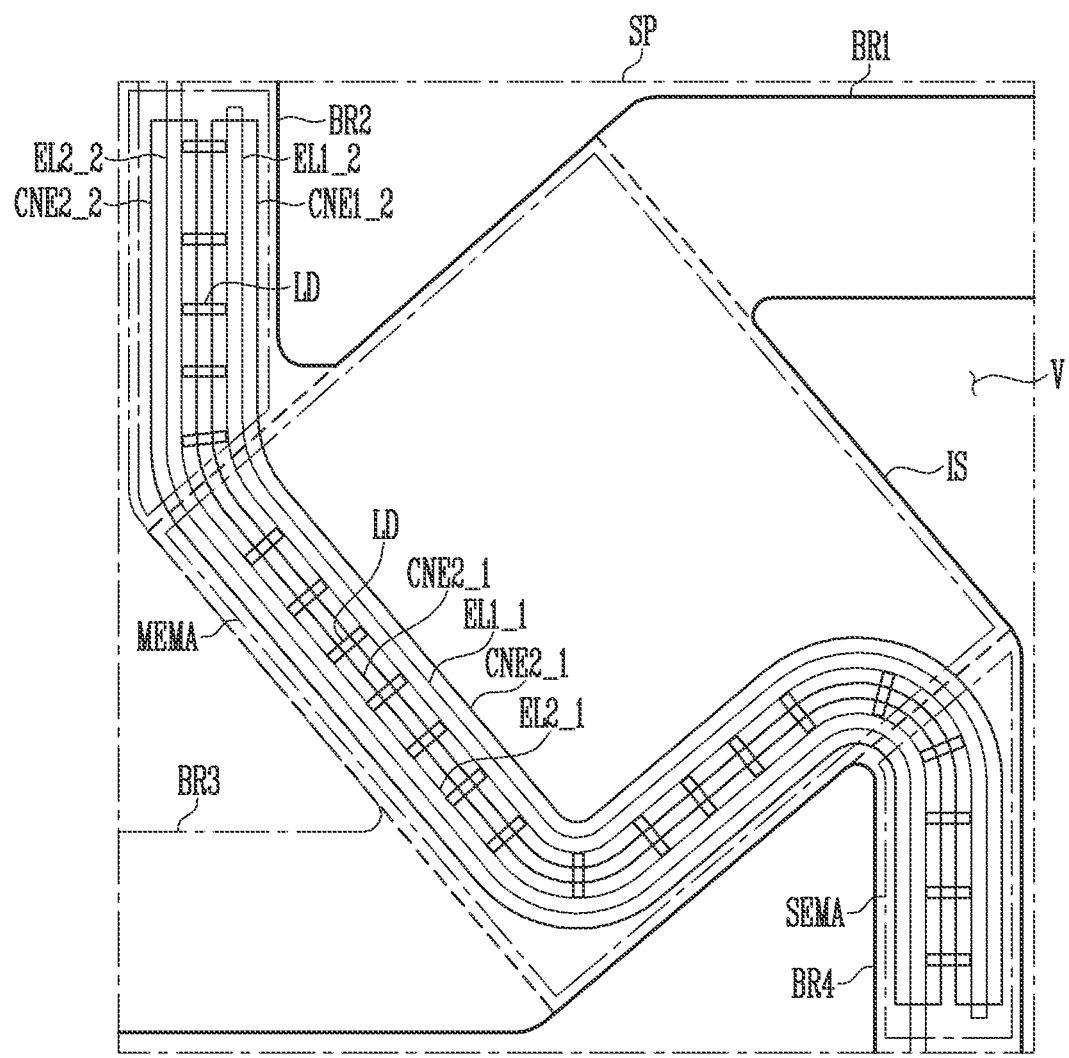

FIGS. 23A and 23B are plan views schematically illustrating a sub-pixel disposed in the display device in accordance with one or more embodiments of the present disclosure.

To avoid redundant explanation, the description of each sub-pixel of FIGS. 23A and 23B will be focused on differences from that of the foregoing embodiments.

Referring to FIGS. 1, 23A, and 23B, one sub-pixel SP (hereinafter, referred to as 'sub-pixel) may include an island IS, first to fourth bridges BR1 to BR4 connected to the island IS, and a slit V. The sub-pixel SP may include an emission area from which light may be emitted. The emission area may include a base layer BS, a pixel circuit layer PCL, and a display element layer DPL. The display element layer DPL may include light emitting elements LD, first and second electrodes EL1 and EL2, and first and second contact electrodes CNE1 and CNE2.

The display element layer DPL may be provided and/or disposed in the island IS and at least one bridge BR. For example, as illustrated in FIG. 23A, the display element layer DPL may be provided and/or disposed in the island IS, and provided and/or disposed in each of the first and fourth bridges BR1 and BR4. Due to the display element layer DPL provided and/or disposed in the island IS, the island IS may include a first emission area MEMA from which light may be emitted. Due to the display element layer DPL provided and/or disposed in each of the first and fourth bridges BR1 and BR4, each of the first and fourth bridges BR1 and BR4 may include a second emission area SEMA from which light may be emitted.

In one or more embodiments of the present disclosure, the light emitting elements LD, the first and second electrodes EL1 and EL2, the first and second contact electrodes CNE1 and CNE2 each may be provided and/or formed in the second emission area SEMA of the first bridge BR1, the first emission area MEMA of the island IS, and the second emission area SEMA of the fourth bridge BR4. For example, each of the first and second electrodes EL1 and EL2 may be provided in a shape extending from the first bridge BR1 to the fourth bridge BR4 via the island IS. Likewise, each of the first and second contact electrodes CNE1 and CNE2 may be provided in a shape identical with that of the corresponding electrode. In other words, each of the first and second contact electrodes CNE1 and CNE2 may be provided in a shape extending from the first bridge BR1 to the fourth bridge BR4 via the island IS.

Although in the foregoing embodiment there has been described that the display element layer DPL is provided and/or formed in each of the first and fourth bridges BR1 and BR4, the present disclosure is not limited thereto. In one or more embodiments, as shown in FIG. 238, the display element layer DPL may be provided and/or formed in each of the second and fourth bridges BR2 and BR4. Hence, each of the second and fourth bridges BR2 and BR4 may include a second emission area SEMA from which light is emitted by the display element layer DPL. In this case, the light emitting elements LD, the first and second electrodes EL1 and EL2, and the first and second contact electrodes CNE1 and CNE2 each may be provided and/or formed in the second emission area SEMA of the second bridge BR2, the first emission area MEMA of the island IS, and the second emission area SEMA of the fourth bridge BR4. For example, each of the first and second electrodes EL1 and EL2 may be provided in a shape extending from the second bridge BR2 to the fourth bridge BR4 via the island IS. Likewise, each of the first and second contact electrodes CNE1 and CNE2 may be provided in a shape identical with that of the corresponding electrode. In other words, each of the first and second contact electrodes CNE1 and CNE2 may also be provided in a shape extending from the second bridge BR2 to the fourth bridge BR4 via the island IS.

In one or more embodiments, the display element layer DPL included in the sub-pixel SP may be provided and/or formed in each of the island IS and the first and second bridges BR1 and BR2. In this case, the first and second electrodes EL1 and EL2, and the first and second contact electrodes CNE1 and CNE2 each may be provided in a shape extending from any one of the first and second bridges BR1 and BR2 to the other one via the island IS.

In one or more embodiments, the display element layer DPL included in the sub-pixel SP may be provided and/or formed in each of the island and the third and fourth bridges BR3 and BR4. In this case, the first and second electrodes EL1 and EL2, and the first and second contact electrodes CNE1 and CNE2 each may be provided in a shape extending from any one of the third and fourth bridges BR3 and BR4 to the other one via the island IS.

In one or more embodiments of the present disclosure, because the display element layer DPL included in the sub-pixel SP is provided and/or formed in the island IS and at least one bridge BR connected to the island IS, the surface area of the emission area from which light may be emitted may further increased.

While various embodiments have been described above, those skilled in the art will appreciate that various modifications, additions and substitutions are possible, without departing from the scope of the present disclosure.

Therefore, the embodiments disclosed in this specification are only for illustrative purposes rather than limiting the technical scope of the present disclosure. The scope of the present disclosure must be defined by the accompanying claims.

The invention claimed is:

1. A display device comprising:
 a base layer comprising a plurality of islands, at least one first bridge configured to connect the islands in a first direction, and at least one second bridge configured to connect the islands in a second direction; and
 at least one pixel comprising a plurality of sub-pixels in the base layer,
 wherein each of the sub-pixels comprises:
  a first electrode and a second electrode in one island of the islands and spaced from each other;
  a third electrode and a fourth electrode in one bridge of the at least one first bridge and the at least one second bridge and spaced from each other;
  at least one first light emitting element between the first electrode and the second electrode; and
  at least one second light emitting element between the third electrode and the fourth electrode.

2. The display device according to claim 1, wherein the one island comprises a first emission area configured to emit light, and the one bridge comprises at least one second emission area configured to emit the light.

3. The display device according to claim 2, wherein the first electrode is integrally and electrically connected with the third electrode, and the second electrode is integrally and electrically connected with the fourth electrode.

4. The display device according to claim 2, wherein a remaining bridge of the at least one first bridge and the at least one second bridge comprises a non-emission area provided not to emit the light.

5. The display device according to claim 2, wherein each of the sub-pixels further comprises:

a first bank in the one island and located under each of the first and second electrodes;
 a first contact electrode configured to electrically connect the first electrode with any one end of opposite ends of the first light emitting element; and
 a second contact electrode configured to electrically connect the second electrode with a remaining end of the opposite ends of the first light emitting element.

6. The display device according to claim 5, wherein each of the sub-pixels further comprises:
 a second bank in the one bridge and located under each of the third and fourth electrodes;
 a third contact electrode configured to electrically connect the third electrode with any one end of opposite ends of the second light emitting element; and
 a fourth contact electrode configured to electrically connect the fourth electrode with a remaining end of the opposite ends of the second light emitting element.

7. The display device according to claim 6,
 wherein the first bank and the second bank are integrally connected,
 wherein the first contact electrode and the third contact electrode are integrally and electrically connected with each other, and
 wherein the second contact electrode and the fourth contact electrode are integrally and electrically connected with each other.

8. The display device according to claim 2, wherein each of the sub-pixels further comprises:
 at least one first sub-electrode in the one island, between the first electrode and the second electrode; and
 at least one second sub-electrode in the one bridge between the third electrode and the fourth electrode,
 wherein the first sub-electrode and the second sub-electrode are integrally and electrically connected with each other.

9. The display device according to claim 2,
 wherein the one island has a rectangular shape enclosed by first to fourth sides,
 wherein the at least one first bridge comprises a 1-1-th sub-bridge extending from the first side of the one island in the first direction, and a 1-2-th sub-bridge extending from the third side of the one island in the first direction, and
 wherein the at least one second bridge comprises a 2-1-th sub-bridge extending from the second side of the one island in the second direction, and a 2-2-th sub-bridge extending from the fourth side of the one island in the second direction.

10. The display device according to claim 9, wherein the pixel comprises:
 a first sub-pixel in a first row and a first column of a sub-pixel matrix of a pixel and configured to emit a first color of light;
 a second sub-pixel in the first row and a second column of the sub-pixel matrix of the pixel and configured to emit a second color of light;
 a third sub-pixel in a second row and the first column of the sub-pixel matrix of the pixel and configured to emit the second color of light; and
 a fourth sub-pixel in the second row and the second column of the sub-pixel matrix of the pixel and configured to emit a third color of light.

11. The display device according to claim 10, wherein each of the first to fourth sub-pixels comprises the one island, the 1-1-th and 1-2-th sub-bridges, and the 2-1-th and 2-2-th sub-bridges.

12. The display device according to claim 11,
wherein the first and second sub-pixels are mirror-symmetrical with respect to a virtual line extending in the second direction, and
wherein the 1-1-th sub-bridge of the first sub-pixel and the 1-1-th sub-bridge of the second sub-pixel are integrally connected.

13. The display device according to claim 12,
wherein the third and fourth sub-pixels are mirror-symmetrical with respect to the virtual line, and
wherein the 1-1-th sub-bridge of the third sub-pixel and the 1-1-th sub-bridge of the fourth sub-pixel are integrally connected.

14. The display device according to claim 13,
wherein the third electrode in the 1-1-th sub-bridge of the first sub-pixel and the third electrode in the 1-1-th sub-bridge of the second sub-pixel are spaced from each other in a plan view, and
wherein the third electrode in the 1-1-th sub-bridge of the third sub-pixel and the third electrode in the 1-1-th sub-bridge of the fourth sub-pixel are spaced from each other in a plan view.

15. The display device according to claim 14, wherein the first and second light emitting elements of each of the first to fourth sub-pixels emit an identical color of light.

16. The display device according to claim 15, further comprising:
a substrate opposing the base layer, the first to fourth sub-pixels areas being located on the base layer;
a first color conversion pattern on the substrate to correspond to the first sub-pixel, and configured to convert the first color of light to red light;
a second color conversion pattern on the substrate to correspond to each of the second and the third sub-pixels, and configured to convert the second color of light to green light; and
a third color conversion pattern on the substrate to correspond to the fourth sub-pixel, and configured to convert the third color of light to blue light.

17. The display device according to claim 14, wherein the first and the second light emitting elements of each of the first to fourth sub-pixels emit different colors of light.

18. The display device according to claim 17,
wherein the first and second light emitting elements of the first sub-pixel emit red light,
wherein the first and second light emitting elements of the second and third sub-pixels emit green light, and
wherein the first and second light emitting elements of the fourth sub-pixel emit blue light.

19. The display device according to claim 1, wherein the base layer comprises a flexible substrate comprising polyimide.

20. A method of fabricating a display device, comprising:
providing a base layer comprising a plurality of islands, at least one first bridge configured to connect the islands in a first direction, and at least one second bridge configured to connect the islands in a second direction;
forming, in each of the islands, first and second electrodes spaced from each other, and forming, in each of the first and second bridges, third and fourth electrodes spaced from each other;
aligning at least one first light emitting element between the first and second electrodes, and aligning at least one second light emitting element between the third and fourth electrodes;
forming an insulating layer on an upper surface of each of the first and second light emitting elements; and
forming first and second contact electrodes on the base layer comprising the insulating layer,
wherein the first electrode and the third electrode are integrally and electrically connected with each other, and the second electrode and the fourth electrode are integrally and electrically connected with each other.

* * * * *